(12) United States Patent
Kang et al.

(10) Patent No.: US 8,901,727 B2
(45) Date of Patent: Dec. 2, 2014

(54) SEMICONDUCTOR PACKAGES, METHODS OF MANUFACTURING SEMICONDUCTOR PACKAGES, AND SYSTEMS INCLUDING SEMICONDUCTOR PACKAGES

(71) Applicant: Samsung Electronics Co., Ltd., Suwon-si (KR)

(72) Inventors: Myun-sung Kang, Hwaseong-si (KR); Jung-min Ko, Seoul (KR); Sang-sick Park, Seoul (KR); Won-keun Kim, Hwaseong-si (KR); Ji-seok Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 13/774,209

(22) Filed: Feb. 22, 2013

(65) Prior Publication Data

US 2014/0084456 A1    Mar. 27, 2014

(30) Foreign Application Priority Data

Sep. 27, 2012  (KR) ........................ 10-2012-0108270

(51) Int. Cl.
| | | |
|---|---|---|
| H01L 25/10 | (2006.01) | |
| H01L 23/28 | (2006.01) | |
| H01L 23/498 | (2006.01) | |
| H01L 25/065 | (2006.01) | |
| H01L 23/00 | (2006.01) | |
| H01L 21/56 | (2006.01) | |

(52) U.S. Cl.
CPC .......... *H01L 23/28* (2013.01); *H01L 23/49811* (2013.01); *H01L 25/0657* (2013.01); *H01L 24/97* (2013.01); *H01L 2224/0401* (2013.01); *H01L 2224/0557* (2013.01); *H01L 2224/06181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/81005* (2013.01); *H01L 2224/92125* (2013.01); *H01L 2224/94* (2013.01); *H01L 2224/97* (2013.01); *H01L 2924/15311* (2013.01); *H01L 2924/18161* (2013.01); *H01L 2224/03009* (2013.01); *H01L 21/563* (2013.01); *H01L 2924/13091* (2013.01)
USPC .................................. 257/686; 257/E25.027

(58) Field of Classification Search
CPC ................. H01L 25/0657; H01L 2224/32145; H01L 2224/48145; H01L 21/563; H01L 23/49811; H01L 24/97
USPC ............ 257/686, E25.006, E25.013, E25.027
See application file for complete search history.

(56) References Cited

U.S. PATENT DOCUMENTS 5,434,745 A * 7/1995 Shokrgozar et al. .......... 361/735
6,133,626 A * 10/2000 Hawke et al. ................. 257/686

(Continued)

FOREIGN PATENT DOCUMENTS

| JP | 2008141114 | 6/2008 |
|---|---|---|
| JP | 2012074672 | 4/2012 |
| KR | 1020110044964 | 5/2011 |

*Primary Examiner* — Allan R Wilson
(74) *Attorney, Agent, or Firm* — Onello & Mello LLP

(57) ABSTRACT

A semiconductor package comprises a first semiconductor chip, a second semiconductor chip on the first semiconductor chip, a third semiconductor chip on the second semiconductor chip and a fourth semiconductor chip on the third semiconductor chip. A first underfill layer is positioned between the second semiconductor chip and the first semiconductor chip; a second underfill layer is positioned between the third semiconductor chip and the second semiconductor chip, and a third underfill layer is positioned between the fourth semiconductor chip and the third semiconductor chip. In some embodiments, the second underfill layer comprises a material that is different than the first and third underfill layers.

27 Claims, 27 Drawing Sheets

(56) References Cited

U.S. PATENT DOCUMENTS

| | | |
|---|---|---|
| 7,537,959 B2 | 5/2009 | Lee et al. |
| 7,589,410 B2 * | 9/2009 | Kim .............................. 257/686 |
| 7,795,073 B2 | 9/2010 | Han et al. |
| 7,795,718 B2 | 9/2010 | Park |
| 8,350,373 B2 | 1/2013 | Wu |
| 2006/0223232 A1 * | 10/2006 | Egawa .......................... 438/109 |
| 2009/0001602 A1 | 1/2009 | Chung |
| 2011/0057327 A1 * | 3/2011 | Yoshida et al. ............... 257/777 |
| 2011/0292708 A1 | 12/2011 | Kang et al. |
| 2011/0309504 A1 | 12/2011 | Bae et al. |
| 2012/0074593 A1 | 3/2012 | Wu |
| 2012/0077314 A1 | 3/2012 | Park et al. |
| 2012/0088332 A1 | 4/2012 | Lee et al. |
| 2012/0187560 A1 * | 7/2012 | Choi et al. .................... 257/738 |
| 2013/0137216 A1 * | 5/2013 | Ito et al. ........................ 438/108 |
| 2013/0214427 A1 * | 8/2013 | Nakanoya ..................... 257/774 |
| 2013/0234320 A1 * | 9/2013 | Lu et al. ........................ 257/737 |

\* cited by examiner

SEMICONDUCTOR PACKAGES, METHODS OF MANUFACTURING SEMICONDUCTOR PACKAGES, AND SYSTEMS INCLUDING SEMICONDUCTOR PACKAGES

CROSS-REFERENCE TO RELATED APPLICATIONS

This application claims the benefit of Korean Patent Application No. 10-2012-0108270, filed on Sep. 27, 2012, in the Korean Intellectual Property Office, the disclosure of which is incorporated herein in its entirety by reference.

BACKGROUND

Inventive concepts relate to semiconductor packages and methods of manufacturing the same, and more particularly, to semiconductor packages including a plurality of semiconductor chips and a methods of manufacturing the semiconductor packages.

As the electronics industry continues to expand, there is an ever-heightened need for further integration in semiconductor devices. In particular, there is a continued desire for devices that are miniaturized, lightweight, and multifunctional.

Along with this, there is a need for miniaturized, lightweight, and multifunctional semiconductor packages for housing the electronic devices. In particular, the semiconductor package industry has seen a trend toward the packaging of a plurality of semiconductor chips within the same package. However, when a plurality of chips are included in the same, single semiconductor package, the possibility of failure is increased and reliability is reduced.

SUMMARY

Inventive concepts provide semiconductor packages for minimizing failure and enhancing reliability, systems including such devices, and methods of manufacturing semiconductor packages.

According to an aspect of the inventive concepts, there is provided a semiconductor package comprising: a first semiconductor chip, a second semiconductor chip on the first semiconductor chip, a third semiconductor chip on the second semiconductor chip and a fourth semiconductor chip on the third semiconductor chip, and a first underfill layer between the second semiconductor chip and the first semiconductor chip; a second underfill layer between the third semiconductor chip and the second semiconductor chip, and a third underfill layer between the fourth semiconductor chip and the third semiconductor chip; wherein the second underfill layer comprises a material that is different than the first and third underfill layers.

In some embodiments, the first and second semiconductor chips, the second and third semiconductor chips and the third and fourth semiconductor chips each have a plurality of corresponding conductive contacts that are in contact with each other, respectively.

In some embodiments, the conductive contacts of one or more of the first, second, third and fourth semiconductor chips are connected to through-electrodes that pass from an upper surface of the chip to a lower surface of the chip.

In some embodiments, the first semiconductor chip has a first horizontal width that is greater than a second horizontal width of the second semiconductor chip, and the third semiconductor chip has a third horizontal width that is greater than a fourth horizontal width of the fourth semiconductor chip.

In some embodiments, the first horizontal width of the first semiconductor chip is substantially equal to the third horizontal width of the third semiconductor chip.

In some embodiments, the first horizontal width of the first semiconductor chip is greater than the third horizontal width of the third semiconductor chip.

In some embodiments, the second underfill layer protrudes beyond a sidewall of the second semiconductor chip.

In some embodiments, the semiconductor package further comprises a mold layer at sidewalls of the second semiconductor chip and on a portion of a top surface of the second semiconductor chip, wherein the second underfill layer is positioned between the mold layer on the portion of the top surface of the second semiconductor chip and the third semiconductor chip.

In some embodiments, the semiconductor package further comprises a mold layer at sidewalls of the first, second, third and fourth semiconductor chips and wherein the second underfill layer comprises the mold layer.

In some embodiments, the first, second, third and fourth underfill layers each comprise one or more of an adhesive material, an adhesive film, and a flowable liquid fill material.

In some embodiments, the semiconductor package further comprises a base to which the first semiconductor chip is mounted, the base and first semiconductor chip having a plurality of corresponding conductive contacts that are in contact with each other; and a base underfill layer between a lower surface of the first semiconductor chip and the base.

In some embodiments, the base underfill layer comprises at least one of an adhesive film, an adhesive layer and a mold layer.

In some embodiments, the first semiconductor chip includes a plurality of conductive contacts at a lower surface thereof, and further comprising chip stack connecting bumps connected to the plurality of conductive contacts.

In some embodiments, the semiconductor package further comprises a mold layer at sidewalls of the first, second, third and fourth semiconductor chips and on a top surface of the fourth semiconductor chip.

According to an aspect of the inventive concepts, there is provided a semiconductor package comprising: a first semiconductor chip, a second semiconductor chip on the first semiconductor chip, a third semiconductor chip on the second semiconductor chip and a fourth semiconductor chip on the third semiconductor chip; a first underfill layer between the second semiconductor chip and the first semiconductor chip; a second underfill layer between the third semiconductor chip and the second semiconductor chip, and a third underfill layer between the fourth semiconductor chip and the third semiconductor chip; and a mold layer at sidewalls of the second semiconductor chip and on a portion of a top surface of the second semiconductor chip, wherein the second underfill layer is positioned between the mold layer on the portion of the top surface of the second semiconductor chip and the third semiconductor chip.

In some embodiments, the first and second semiconductor chips, the second and third semiconductor chips and the third and fourth semiconductor chips each have a plurality of corresponding conductive contacts that are in contact with each other, respectively.

In some embodiments, the conductive contacts of one or more of the first, second, third and fourth semiconductor chips are connected to through-electrodes that pass from an upper surface of the chip to a lower surface of the chip.

In some embodiments, the first semiconductor chip has a first horizontal width that is greater than a second horizontal width of the second semiconductor chip, and the third semiconductor chip has a third horizontal width that is greater than a fourth horizontal width of the fourth semiconductor chip.

In some embodiments, the first horizontal width of the first semiconductor chip is substantially equal to the third horizontal width of the third semiconductor chip.

In some embodiments, the first horizontal width of the first semiconductor chip is greater than the third horizontal width of the third semiconductor chip.

In some embodiments, the second underfill layer comprises a material that is different than the first and third underfill layers.

In some embodiments, the second underfill layer comprises a material that is a same material as the first and third underfill layers.

In some embodiments, the second underfill layer protrudes beyond a sidewall of the second semiconductor chip.

In some embodiments, the semiconductor package further comprises a mold layer at sidewalls of the first, second, third and fourth semiconductor chips and wherein the second underfill layer comprises the mold layer.

In some embodiments, the first, second, third and fourth underfill layers each comprise one or more of an adhesive material, an adhesive film, and a flowable underfill layer.

In some embodiments, the semiconductor package further comprises: a base to which the first semiconductor chip is mounted, the base and first semiconductor chip having a plurality of corresponding conductive contacts that are in contact with each other; and a base underfill layer between a lower surface of the first semiconductor chip and the base.

In some embodiments, the base underfill layer comprises at least one of an adhesive film, an adhesive layer and a mold layer.

In some embodiments, the first semiconductor chip includes a plurality of conductive contacts at a lower surface thereof, and further comprising chip stack connecting bumps connected to the plurality of conductive contacts.

In some embodiments, the semiconductor package further comprises a mold layer at sidewalls of the first, second, third and fourth semiconductor chips and on a top surface of the fourth semiconductor chip.

According to an aspect of the inventive concepts, there is provided a semiconductor package comprising: a first semiconductor chip, a second semiconductor chip on the first semiconductor chip, a third semiconductor chip on the second semiconductor chip and a fourth semiconductor chip on the third semiconductor chip, the first and second chips, the second and third semiconductor chips and the third and fourth semiconductor chips each having a plurality of corresponding conductive contacts that are in contact with each other, respectively, and a first underfill layer between the second semiconductor chip and the first semiconductor chip; a second underfill layer between the third semiconductor chip and the second semiconductor chip, and a third underfill layer between the fourth semiconductor chip and the third semiconductor chip; wherein the first semiconductor chip has a first horizontal width that is greater than a second horizontal width of the second semiconductor chip, and wherein the third semiconductor chip has a third horizontal width that is greater than a fourth horizontal width of the fourth semiconductor chip.

In some embodiments, the conductive contacts of one or more of the first, second, third and fourth semiconductor chips are connected to through-electrodes that pass from an upper surface of the chip to a lower surface of the chip.

In some embodiments, the first horizontal width of the first semiconductor chip is substantially equal to the third horizontal width of the third semiconductor chip.

In some embodiments, the first horizontal width of the first semiconductor chip is greater than the third horizontal width of the third semiconductor chip.

In some embodiments, the second underfill layer comprises a material that is different than the first and third underfill layers.

In some embodiments, the second underfill layer comprises a material that is a same material as the first and third underfill layers.

In some embodiments, the second underfill layer protrudes beyond a sidewall of the second semiconductor chip.

In some embodiments, the semiconductor package further comprises: a mold layer at sidewalls of the second semiconductor chip and on a portion of a top surface of the second semiconductor chip, wherein the second underfill layer is positioned between the mold layer on the portion of the top surface of the second semiconductor chip and the third semiconductor chip.

In some embodiments, the semiconductor package further comprises a mold layer at sidewalls of the first, second, third and fourth semiconductor chips and wherein the second underfill layer comprises the mold layer.

In some embodiments, the first, second, third and fourth underfill layers each comprise one or more of an adhesive material, an adhesive film, and a flowable liquid fill material.

In some embodiments, the semiconductor package further comprises: a base to which the first semiconductor chip is mounted, the base and first semiconductor chip having a plurality of corresponding conductive contacts that are in contact with each other; and a base underfill layer between a lower surface of the first semiconductor chip and the base.

In some embodiments, the base underfill layer comprises at least one of an adhesive film, an adhesive layer and a mold layer In some embodiments, the first semiconductor chip includes a plurality of conductive contacts at a lower surface thereof, and further comprising chip stack connecting bumps connected to the plurality of conductive contacts.

According to an aspect of the inventive concepts, there is provided a semiconductor package comprising: a first sub-stack comprising one of a first semiconductor chip and one of a second semiconductor chip, the second semiconductor chip positioned on the first semiconductor chip; a sub-stack underfill layer between the second semiconductor chip and the first semiconductor chip of the first sub-stack; a second sub-stack comprising another of the first semiconductor chip and another of the second semiconductor chip, the second semiconductor chip positioned on the first semiconductor chip; a sub-stack underfill layer between the second semiconductor chip and the first semiconductor chip of the second sub-stack; and the second sub-stack positioned on the first sub-stack; a package underfill layer between the second sub-stack and the first sub-stack, wherein at least a portion of the first semiconductor chips of the first sub-stack and the second sub-stack have a same configuration and a wherein at least a portion of the second semiconductor chips of the first sub-stack and the second sub-stack have a same configuration.

In some embodiments, the package underfill layer comprises a material that is different than the sub-stack underfill layers.

In some embodiments, the package underfill layer comprises a material that is a same material as the sub-stack underfill layers.

In some embodiments, the first and second semiconductor chips of each of the first and second sub-stacks each have a plurality of corresponding conductive contacts that are in contact with each other, and the second semiconductor chip of the first sub-stack and the first semiconductor chip of the second sub-stacks each have a plurality of corresponding conductive contacts that are in contact with each other.

In some embodiments, the conductive contacts of one or more of the first and second semiconductor chips of each of the first and second sub-stacks are connected to through-electrodes that pass from an upper surface of the chip to a lower surface of the chip.

In some embodiments, the first semiconductor chip of the first sub-stack has a first horizontal width that is greater than a second horizontal width of the second semiconductor chip.

In some embodiments, the first semiconductor chip of the second sub-stack has a first horizontal width that is greater than a second horizontal width of the second semiconductor chip.

In some embodiments, a horizontal width of the first semiconductor chip of the first sub-stack is substantially equal to a horizontal width of the first semiconductor chip of the second sub-stack.

In some embodiments, a horizontal width of the first semiconductor chip of the first sub-stack is greater than a horizontal width of the first semiconductor chip of the second sub-stack.

In some embodiments, the package underfill layer protrudes beyond a sidewall of the second semiconductor chip of the first sub-stack.

In some embodiments, the semiconductor package further comprises a mold layer at sidewalls of the second semiconductor chip of the first sub-stack and on a portion of a top surface of the second semiconductor chip of the first sub-stack, wherein the second underfill layer is positioned between the mold layer on the portion of the top surface of the second semiconductor chip of the first sub-stack and the first semiconductor chip of the second sub-stack.

In some embodiments, the semiconductor package further comprises a mold layer at sidewalls of the first and second semiconductor chips of the first and second sub-stacks and wherein the package underfill layer comprises the mold layer.

In some embodiments, the semiconductor package further comprises: a base to which the first semiconductor chip of the first sub-stack is mounted, the base and first semiconductor chip of the first sub-stack having a plurality of corresponding conductive contacts that are in contact with each other; and a base underfill layer between a lower surface of the first semiconductor chip of the first sub-stack and the base.

In some embodiments, the base underfill layer comprises at least one of an adhesive film, an adhesive layer and a mold layer.

In some embodiments, the first semiconductor chip of the first sub-stack includes a plurality of conductive contacts at a lower surface thereof, and further comprising chip stack connecting bumps connected to the plurality of conductive contacts.

In some embodiments, at least a portion of the first and second semiconductor chips of the first sub-stack have the same configuration.

According to an aspect of the inventive concepts, there is provided a method comprising: forming a first sub-stack by positioning a second semiconductor chip on a first semiconductor chip, joining corresponding conductive contacts of the second semiconductor chip and the first semiconductor chip, and applying a chip underfill to bond the second semiconductor chip to the first semiconductor chip; forming a second sub-stack by positioning a fourth semiconductor chip on a third semiconductor chip, joining corresponding conductive contacts of the fourth semiconductor chip and the third semiconductor chip, and applying a chip underfill to bond the fourth semiconductor chip to the third semiconductor chip; and forming a chip stack by positioning the second sub-stack on the first sub-stack, joining corresponding conductive contacts of the third semiconductor chip of the second stack and the second semiconductor chip of the first stack, and applying a sub-stack underfill to bond the third semiconductor chip of the second sub-stack to the second semiconductor chip of the first sub-stack.

In some embodiments, the method further comprises testing an operation of the first sub-stack and testing an operation of the second sub-stack prior to forming the chip stack.

In some embodiments, in the forming of the first sub-stack or in the forming of the second sub-stack, applying the chip underfill layer comprises applying a fill layer following joining the corresponding conductive contacts.

In some embodiments, in the forming of the first sub-stack or in the forming of the second sub-stack, applying the underfill layer comprises applying a bonding film prior to joining the corresponding conductive contacts.

In some embodiments, in the forming of the chip stack, applying the underfill layer comprises applying a fill layer following joining the corresponding conductive contacts.

In some embodiments, in the forming of the chip stack, applying the underfill layer comprises applying a bonding film prior to joining the corresponding conductive contacts.

In some embodiments, in the forming of the chip stack, applying the sub-stack underfill to bond the third semiconductor chip of the second sub-stack to the second semiconductor chip of the first sub-stack comprises a plying a mold layer to a top and sidewalls of the chip stack, whereby the mold layer penetrates a space between the first sub-stack and the second sub-stack to fill the space and bonds the third semiconductor chip to the second semiconductor chip.

In some embodiments, a material used for the chip underfill is different than a material used for the sub-stack underfill.

In some embodiments, a material used for the chip underfill is same as a material used for the sub-stack underfill.

In some embodiments, after applying a sub-stack underfill to bond the third semiconductor chip of the second sub-stack to the second semiconductor chip of the first sub-stack, the sub-stack underfill layer protrudes beyond a sidewall of the second semiconductor chip of the first sub-stack.

In some embodiments, the method further comprises, prior to forming the chip stack, forming a mold layer at a top and sidewalls of the second semiconductor chip of the first sub-stack, the mold layer at the top of the second semiconductor chip including openings that expose upper conductive contacts of the second semiconductor chip, and wherein, after forming the chip stack, the sub-stack underfill layer is positioned between the mold layer and the third semiconductor chip of the second sub-stack.

In some embodiments, the first semiconductor chip has a first horizontal width that is greater than a second horizontal width of the second semiconductor chip.

In some embodiments, the third semiconductor chip has a third horizontal width that is greater than a fourth horizontal width of the fourth semiconductor chip.

In some embodiments, a first horizontal width of the first semiconductor chip is substantially equal to a third horizontal width of the third semiconductor chip.

In some embodiments, a first horizontal width of the first semiconductor chip is greater than a third horizontal width of the third semiconductor chip.

In some embodiments, forming the first sub-stack comprises: forming a first sub-stack by positioning a second wafer of multiple second semiconductor chips on a first wafer of multiple first semiconductor chips, joining corresponding conductive contacts of the multiple second semiconductor chips of the second wafer and the multiple first semiconductor chips of the first wafer, and applying a chip underfill to bond the multiple second semiconductor chips to the multiple first semiconductor chips.

In some embodiments, the method further comprises dicing the multiple second chips of the second wafer after joining the corresponding conductive contacts and prior to applying the chip underfill.

In some embodiments, positioning the second sub-stack on the first sub-stack occurs prior to dicing the multiple second chips.

In some embodiments, the method further comprises dicing the first and second chips of the first and second wafers to form multiple first sub-stacks and dicing the third and fourth chips of the second sub-stack prior to forming the chip stack.

In some embodiments, the method further comprises dicing the multiple second chips of the second wafer after joining the corresponding conductive contacts and prior to applying the chip underfill.

In some embodiments, forming the second sub-stack comprises: forming a second sub-stack by positioning a fourth wafer of multiple fourth semiconductor chips on a third wafer of multiple third semiconductor chips, joining corresponding conductive contacts of the multiple fourth semiconductor chips of the fourth wafer and the multiple third semiconductor chips of the third wafer, and applying a chip underfill to bond the multiple fourth semiconductor chips to the multiple third semiconductor chips.

In some embodiments, the method further comprises dicing the first and third chips of the first and third wafers prior to dicing the second and fourth chips of the second and fourth wafers.

According to an aspect of the inventive concepts, there is provided a memory system comprising: a memory controller that generates command and address signals; and a memory module comprising a plurality of memory devices, the memory module receiving the command and address signals and in response storing and retrieving data to and from at least one of the memory devices, wherein each memory device comprises a semiconductor package comprising: a first semiconductor chip, a second semiconductor chip on the first semiconductor chip, a third semiconductor chip on the second semiconductor chip and a fourth semiconductor chip on the third semiconductor chip, and a first underfill layer between the second semiconductor chip and the first semiconductor chip; a second underfill layer between the third semiconductor chip and the second semiconductor chip, and a third underfill layer between the fourth semiconductor chip and the third semiconductor chip; wherein the second underfill layer comprises a material that is different than the first and third underfill layers.

Any of the embodiments disclosed herein can be applied to the memory system.

According to an aspect of the inventive concepts, there is provided a semiconductor package including a first stack structure including a first semiconductor chip including a first through-electrode, and at least one second semiconductor chip that is stacked on the first semiconductor chip across a first under-fill layer and includes a second through-electrode; and a second stack structure that includes a third semiconductor chip including a third through-electrode, and at least one fourth semiconductor chip that is stacked on the third semiconductor chip across a second under-fill layer, wherein the second stack structure is stacked on the first stack structure across a third under-fill layer, wherein the third under-fill layer includes a component having different physical property from the first under-fill layer or the second under-fill layer.

The third under-fill layer may fill in a space between the first stack structure and the second stack structure.

A lateral surface of the third under-fill layer may protrude with respect to a lateral surface of the second stack structure.

Each of the first through third under-fill layers may include a filler, and a ratio of a filler of the third under-fill layer to the third under-fill layer may be smaller than a ratio of a filler of the first under-fill layer or the second under-fill layer to the first under-fill layer or the second under-fill layer.

Each of the first through third under-fill layers may include a filler, and a size of a filler added to the third under-fill layer may be smaller than a size of a filler added to the first under-fill layer or the second under-fill layer.

The semiconductor package may further include a printed circuit board whereon the first stack structure is mounted; and a molding member formed on the printed circuit board and surrounding the first stack structure and the second stack structure, wherein the fourth semiconductor chip may be electrically connected to the printed circuit board through the first through third through-electrodes.

A horizontal cross-sectional width of the second semiconductor chip may be smaller than a horizontal cross-sectional width of the first semiconductor chip, and the molding member may be formed on a portion of an upper surface of the first semiconductor chip so as to surround a lateral surface of the semiconductor chip.

A horizontal cross-sectional width of the fourth semiconductor chip may be smaller than a horizontal cross-sectional width of the third semiconductor chip, and the molding member may be formed on a portion of an upper surface of the third semiconductor chip so as to surround a lateral surface of the fourth semiconductor chip.

The molding member may surround a portion of an upper surface of the first stack structure.

The molding member may be formed of the same material as the third under-fill layer.

A horizontal cross-sectional width of the third semiconductor chip may be equal to or greater than a horizontal cross-sectional width of the second semiconductor chip.

According to another aspect of the inventive concepts, there is provided a semiconductor package including first through fourth semiconductor chips that are sequentially stacked, wherein the first through third semiconductor chips include first through third through-electrodes, respectively, wherein the fourth semiconductor chip is electrically connected to the first through third through-electrodes, wherein a horizontal cross-sectional width of the first semiconductor chip is greater than a horizontal cross-sectional width of the second semiconductor chip, and wherein a horizontal cross-sectional width of the third semiconductor chip is greater than a horizontal cross-sectional width of each of the second semiconductor chip and the fourth semiconductor chip.

A horizontal cross-sectional width of the first semiconductor chip may be the same as a horizontal cross-sectional width of the third semiconductor chip.

According to another aspect of the inventive concepts, there is provided a method of manufacturing a semiconductor package, the method including stacking a second semiconductor chip on a first semiconductor chip across a first under-fill layer; stacking a fourth semiconductor chip on a third semiconductor chip across a second under-fill layer; and stacking the fourth semiconductor chip stacked on the third semiconductor chip, on the second semiconductor chip stacked on the first semiconductor chip.

The stacking of the fourth semiconductor chip stacked on the third semiconductor chip, on the second semiconductor chip stacked on the first semiconductor chip may include stacking the fourth semiconductor chip stacked on the third semiconductor chip, on the second semiconductor chip stacked on the first semiconductor chip across a third under-fill layer including a component having different physical property from the first under-fill layer or the second under-fill layer.

The method may further include, prior to the stacking of the fourth semiconductor chip stacked on the third semiconductor chip, on the second semiconductor chip stacked on the first semiconductor chip, attaching the first semiconductor chip whereon the second semiconductor chip is stacked to a printed circuit board; and after the stacking of the fourth semiconductor chip stacked on the third semiconductor chip, on the second semiconductor chip stacked on the first semiconductor chip, forming a molding member on the printed circuit board so as to cover the first through fourth semiconductor chips and to be filled between the second semiconductor chip and the third semiconductor chip, wherein each of the molding member, the first under-fill layer, and the second under-fill layer includes a filler, and wherein a ratio of a filler of the molding member to the molding member is greater than that of the first under-fill layer or the second under-fill layer.

The stacking the second semiconductor chip on the first semiconductor chip may include preparing a first semiconductor wafer including a plurality of the first semiconductor chips each of which includes first through-electrodes; and stacking a plurality of the second semiconductor chips each of which includes second through-electrodes on the first semiconductor wafer so as to respectively correspond to the plurality of first semiconductor chips such that the first through-electrodes are electrically connected to the second through-electrodes, respectively.

The method may further include, prior to the stacking of the plurality of second semiconductor chips on the first semiconductor wafer, forming a first mold layer to cover the plurality of second semiconductor chips; and removing a portion of the first mold layer so as to expose the second through-electrodes.

The stacking of the fourth semiconductor chip on the third semiconductor chip may include preparing a third semiconductor wafer including a plurality of third semiconductor chips each of which third through-electrodes; and stacking a plurality of the fourth semiconductor chips that respectively correspond to the plurality of third semiconductor chips, on the third semiconductor wafer so as to be electrically connected to the third through-electrodes.

The method may further include, after the stacking of the second semiconductor chip on the first semiconductor wafer, cutting the first semiconductor wafer into first stack structures including the first semiconductor chip and the second semiconductor chip which correspond to each other; and after the stacking of the fourth semiconductor chip on the third semiconductor wafer, cutting the third semiconductor wafer into second stack structures including the third semiconductor chip and the fourth semiconductor chip which correspond to each other, wherein the stacking of the fourth semiconductor chip stacked on the third semiconductor chip, on the second semiconductor chip stacked on the first semiconductor chip may include: stacking the second stack structures on the first stack structures.

The method may further include, after the stacking of the fourth semiconductor chip on the third semiconductor wafer, cutting the third semiconductor wafer into second stack structures including the third semiconductor chip and the fourth semiconductor chip which correspond to each other, wherein the stacking of the fourth semiconductor chip stacked on the third semiconductor chip, on the second semiconductor chip stacked on the first semiconductor chip may include: stacking the second stack structures on the second semiconductor chip stacked on the first semiconductor wafer; and cutting the first semiconductor wafer such that the second stack structures are stacked on first stack structures including the first semiconductor chip and the second semiconductor chip which correspond to each other.

The stacking of the fourth semiconductor chip stacked on the third semiconductor chip, on the second semiconductor chip stacked on the first semiconductor chip may include stacking a third semiconductor wafer whereon the fourth semiconductor chip is stacked, on the second semiconductor chip stacked on the first semiconductor wafer; and cutting the first semiconductor wafer and the third semiconductor wafer together such that a second stack structure including the third semiconductor chip and the fourth semiconductor chip which correspond to each other are stacked on a first stack structure including the first semiconductor chip and the second semiconductor chip which correspond to each other.

According to another aspect of the inventive concept, there is provided a method of manufacturing a semiconductor package, the method including forming a first stack structure whereon at least one second semiconductor chip including second through-electrodes is stacked, on a first semiconductor chip including first through-electrodes; forming a second stack structure whereon at least one fourth semiconductor chip is stacked, on a third semiconductor chip including third through-electrodes; and stacking the second stack structure on the first stack structure such that the fourth semiconductor chip are electrically connected to the first through third through-electrodes.

The forming of the first stack structure may include forming a first under-fill layer between the first semiconductor chip and the second semiconductor chip by using a capillary under-fill method, and the forming of the second stack structure may include forming a second under-fill layer between the third semiconductor chip and the fourth semiconductor chip by using a capillary under-fill method.

The stacking the second stack structure on the first stack structure may be performed such that a third under-fill layer that is a non-conductive film is disposed between the first stack structure and the second stack structure.

BRIEF DESCRIPTION OF THE DRAWINGS

Exemplary embodiments of the inventive concepts will be more clearly understood from the following detailed description taken in conjunction with the accompanying drawings in which:

FIG. 1 is a cross-sectional view of an operation for preparing a first semiconductor wafer, according to an embodiment of the inventive concepts;

FIG. 2 is a cross-sectional view of an operation for forming first connecting bumps, according to an embodiment of the inventive concepts;

FIG. 3 is a cross-sectional view of an operation for attaching a first semiconductor wafer to a first carrier substrate, according to an embodiment of the inventive concepts;

FIG. 4 is a cross-sectional view of an operation for exposing a first through-electrodes, according to an embodiment of the inventive concepts;

FIG. 5 is a cross-sectional view of an operation for forming a first lower protective layer, according to an embodiment of the inventive concepts;

FIG. 6 is a cross-sectional view of an operation for forming first lower pads, according to an embodiment of the inventive concepts;

FIG. 7 is a cross-sectional view of an operation for preparing a plurality of second semiconductor chips, according to an embodiment of the inventive concepts;

FIG. 8 is a cross-sectional view of an operation for stacking second semiconductor chips on a first semiconductor wafer, according to an embodiment of the inventive concepts;

FIG. 9 is a cross-sectional view of an operation for forming a first under-fill layer, according to an embodiment of the inventive concepts;

FIG. 10 is a cross-sectional view of an operation for forming a first mold layer, according to an embodiment of the inventive concepts;

FIG. 11 is a cross-sectional view of an operation for exposing second through-electrodes, according to an embodiment of the inventive concepts;

FIG. 12 is a cross-sectional view of an operation for performing a first test, according to an embodiment of the inventive concepts;

FIG. 13 is a cross-sectional view of an operation for stacking fourth semiconductor chips on third semiconductor chips, according to an embodiment of the inventive concepts;

FIG. 14 is a cross-sectional view of an operation for forming a second mold layer, according to an embodiment of the inventive concepts;

FIG. 15 is a cross-sectional view of an operation for performing a second test, according to an embodiment of the inventive concepts;

FIG. 16 is a cross-sectional view of an operation for forming a first stack structure, according to an embodiment of the inventive concepts;

FIG. 17 is a cross-sectional view of an operation for forming a second stack structure, according to an embodiment of the inventive concepts;

FIG. 18 is a cross-sectional view of an operation for mounting a first stack structure on a printed circuit board, according to an embodiment of the inventive concepts;

FIG. 19 is a cross-sectional view of an operation for stacking a second stack structure on a first stack structure, according to an embodiment of the inventive concepts;

FIG. 20 is a cross-sectional view of a semiconductor package according to an embodiment of the inventive concepts;

FIG. 21 is a cross-sectional view of an operation for forming a third under-fill layer, according to another embodiment of the inventive concepts;

FIG. 22 is a cross-sectional view of an operation for forming a second stack structure to which a third under-fill layer is attached, according to another embodiment of the inventive concepts;

FIG. 23 is a cross-sectional view of an operation for stacking a second stack structure on a first stack structure across a third under-fill layer, according to another embodiment of the inventive concepts;

FIG. 24 is a cross-sectional view of a semiconductor package according to another embodiment of the inventive concepts;

FIG. 25 is a cross-sectional view of an operation for stacking a second stack structure on second semiconductor chips stacked on a first semiconductor wafer, according to another embodiment of the inventive concepts;

FIG. 26 is a cross-sectional view of a semiconductor package according to another embodiment of the inventive concepts;

FIG. 27 is a cross-sectional view of an operation for stacking a second stack structure on second semiconductor chips stacked on a first semiconductor wafer by using a third under-fill layer, according to another embodiment of the inventive concepts;

FIG. 28 is a cross-sectional view of a semiconductor package according to another embodiment of the inventive concepts;

FIG. 29 is a cross-sectional view of an operation for forming a third under-fill layer by using a capillary under-fill method, according to another embodiment of the inventive concepts;

FIG. 30 is a cross-sectional view of a semiconductor package according to another embodiment of the inventive concepts;

FIG. 31 is a cross-sectional view of an operation for stacking a second semiconductor wafer whereon fourth semiconductor chips are stacked, on a first semiconductor wafer whereon second semiconductor chips are stacked, according to another embodiment of the inventive concepts;

FIG. 32 is a cross-sectional view of a semiconductor package according to another embodiment of the inventive concepts;

FIG. 33 is a cross-sectional view of an operation for stacking a second semiconductor wafer whereon fourth semiconductor chips are stacked, on a first semiconductor wafer whereon second semiconductor chips are stacked, by using a third under-fill layer, according to another embodiment of the inventive concepts;

FIG. 34 is a cross-sectional view of a semiconductor package according to another embodiment of the inventive concepts;

FIG. 35 is a cross-sectional view of an operation for attaching a first semiconductor wafer to a first carrier substrate, according to another embodiment of the inventive concepts;

FIG. 36 is a cross-sectional view of an operation for performing a first test, according to another embodiment of the inventive concepts;

FIG. 37 is a cross-sectional view of an operation for stacking a second semiconductor wafer whereon a fourth semiconductor chip is stacked, on a first semiconductor wafer whereon second semiconductor chips are stacked, according to another embodiment of the inventive concepts;

FIG. 38 is a cross-sectional view of an operation for attaching a resulting structure of FIG. 37 to a preliminary carrier substrate, according to another embodiment of the inventive concepts;

FIG. 39 is a cross-sectional view of an operation for forming external connecting bumps, according to another embodiment of the inventive concepts;

FIG. 40 is a cross-sectional view of a semiconductor package according to another embodiment of the inventive concepts;

FIG. 41 is a cross-sectional view of an operation for attaching a second semiconductor wafer to a second carrier substrate, according to another embodiment of the inventive concepts;

FIG. 42 is a cross-sectional view of an operation for preparing a second semiconductor chip, according to another embodiment of the inventive concepts;

FIG. 43 is a cross-sectional view of an operation for stacking second semiconductor chips on a first semiconductor wafer, according to another embodiment of the inventive concepts;

FIG. 44 is a cross-sectional view of an operation for forming a first mold layer, according to another embodiment of the inventive concepts;

FIG. 45 is a cross-sectional view of an operation for exposing second through-electrodes, according to another embodiment of the inventive concepts;

FIG. 46 is a cross-sectional view of an operation for forming second rear pads, according to another embodiment of the inventive concepts;

FIG. 47 is a cross-sectional view of an operation for forming a first stack structure, according to another embodiment of the inventive concepts;

FIG. 48 is a cross-sectional view of a semiconductor package according to another embodiment of the inventive concepts;

FIG. 56 is a cross-sectional view of an operation for stacking a second semiconductor wafer on a first semiconductor wafer, according to another embodiment of the inventive concepts;

FIG. 57 is a cross-sectional view of an operation for exposing a second through-electrode, according to another embodiment of the inventive concepts;

FIG. 58 is a cross-sectional view of an operation for forming second rear pads 244, according to another embodiment of the inventive concepts;

FIG. 59 is a cross-sectional view of an operation for stacking a fourth semiconductor wafer on a third semiconductor wafer, according to another embodiment of the inventive concepts;

FIG. 60 is a cross-sectional view of a semiconductor package according to another embodiment of the inventive concepts;

FIG. 61 is a cross-sectional view of a semiconductor package according to another embodiment of the inventive concepts;

DETAILED DESCRIPTION OF EMBODIMENTS

Figure 1:
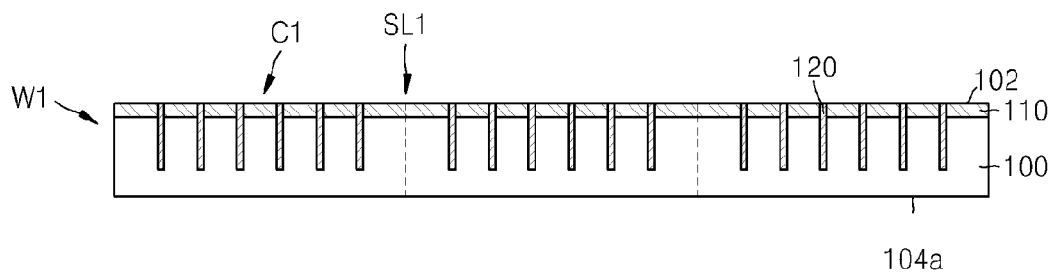
FIGS. 1 through 20 are cross-sectional views of a method of manufacturing a semiconductor package, according to an embodiment of the inventive concepts.

Inventive concepts will now be described more fully with reference to the accompanying drawings, in which exemplary embodiments of the invention are shown. The inventive concepts may, however, be embodied in many different forms and should not be construed as being limited to the embodiments set forth herein; rather, these embodiments are provided so that this disclosure will be thorough and complete, and will fully convey the concept of the inventive concepts to those skilled in the art. In the drawings, the thicknesses of layers and regions are exaggerated for clarity.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements or layers should be interpreted in a like fashion (e.g., "between," versus "directly between," "adjacent," versus "directly adjacent," etc.).

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

An expression used in the singular encompasses the expression of the plural, unless it has a clearly different meaning in the context. Also, it is to be understood that the terms such as "comprise" and/or "comprising" are intended to indicate the existence of the features, numbers, steps, actions, components, parts, or combinations thereof, and are not intended to preclude the possibility that one or more other features, numbers, steps, actions, components, parts, or combinations thereof may exist or may be added.

Terms or words used herein have the meanings corresponding to technical aspects of the embodiments of the inventive concept so as to most suitably express the embodiments of the inventive concepts.

The inventive concepts will now be described more fully with reference to the accompanying drawings, in which exemplary embodiments of the invention are shown.

FIGS. 1 through 20 are cross-sectional view of a method of manufacturing a semiconductor package, according to an embodiment of the inventive concepts.

FIG. 1 is a cross-sectional view of an operation for preparing a first semiconductor wafer W1, according to an embodiment of the inventive concepts.

Referring to FIG. 1, the first semiconductor wafer W1 is prepared. The first semiconductor wafer W1 may include a plurality of first semiconductor chips C1 that are designated to be separated from each other along first scribe lanes SL1. In some embodiments, a first semiconductor chip C1 includes a first semiconductor substrate 100, a first semiconductor device 110, and first through-electrodes 120. The first semiconductor substrate 100 may have a first upper surface 102 and a first lower surface 104a which oppose each other. In some embodiments, the first semiconductor device 110 may be formed on the first upper surface 102 of the first semiconductor substrate 100. In some embodiments, the first through-electrodes 120 may be formed to extend into the first semiconductor substrate 100 from the first upper surface 102 of the first semiconductor substrate 100 through the first semiconductor device 110.

In some embodiments, the first semiconductor substrate 100 may include, for example, silicon (Si). Alternatively, in various embodiments, the first semiconductor substrate 100 may include a semiconductor atom such as germanium (Ge), or a compound semiconductor such as silicon carbide (SiC), gallium arsenide (GaAs), indium arsenide (InAs), and indium phosphide (InP). Alternatively, the first semiconductor substrate 100 may include a silicon on insulator (SOI) structure. For example, the first semiconductor substrate 100 may include a buried oxide (BOX) layer. The first semiconductor substrate 100 may include a conductive region, for example, a well doped with impurities, or a structure doped with impurities. In addition, the first semiconductor substrate 100 may have a various device separation structure such as a shallow trench isolation (STI) structure.

The first semiconductor device 110 may include a system large scale integration (LSI), a flash memory, a dynamic random access memory (DRAM), a static random access memory (SRAM), an electrically erasable and programmable read-only memory (EEPROM) EEPROM, a phase-change random access memory (PRAM), a magnetic random access memory (MRAM), a resistive random-access memory (RRAM), or other suitable circuit, system or memory device. In detail, the first semiconductor device 110 may include a plurality of individual devices of various types. In various embodiments, the plurality of individual devices may include various microelectronic devices, for example, a complementary metal-insulator-semiconductor (CMOS) transistor, a metal-oxide-semiconductor field effect transistor (MOSFET), system large scale integration (LSI), an image sensor such as a CMOS imaging sensor (CIS), a micro-electromechanical system (MEMS), an active element, a passive element, or the like. The plurality of individual devices may be connected to the conductive region of the first semiconductor substrate 100. The first semiconductor device 110 may further include a conductive wiring or a conductive plug for electrically connecting at least two of the plurality of individual devices or the plurality of individual devices to the conductive region of the first semiconductor substrate 100. In addition, the plurality of individual devices may be electrically separated from other adjacent individual devices by insulating layers, respectively.

The first semiconductor device 110 may include a plurality of wiring structures for connecting the plurality of individual devices to other wirings formed on the first semiconductor substrate 100. The plurality of wiring structures may include a metal wiring layer and a via plug. The metal wiring layer and the via plug may include a wiring barrier layer and a wiring metal layer. The wiring barrier layer may include at least one material selected from titanium (Ti), TiN, tantalum (Ta), and TaN. The wiring metal layer may include at least one metal selected from tungsten (W), aluminum (Al), and a copper (Cu). The metal wiring layer and the via plug may be formed of the same material. Alternatively, at least a portion of the metal wiring layer and the via plug may be formed of a different material. A plurality of metal wiring layers and/or a plurality of via plugs may include may constitute a multi-layered structure. That is, the wiring structure may include a multi-layered structure formed by alternately stacking two or more metal wiring layers or two or more via plugs. The first semiconductor device 110 may further include a passivation layer for protecting the wiring structures and other lower structures from external shock or moisture.

The first through-electrodes 120 may extend into the first semiconductor substrate 100 from the first upper surface 102 of the first semiconductor substrate 100. At least a portion of a first through-electrode 120 may be in the shape of a column. In this case, the first through-electrode 120 may include a barrier layer corresponding to a surface thereof and a filling conductive layer filled in the barrier layer. The barrier layer may include at least one material selected from Ti, TiN, Ta, TaN, ruthenium (Ru), cobalt (Co), manganese (Mn), WN, nickel (Ni), and NiB. The filling conductive layer may include at least one material selected from Cu, a Cu alloy such as CuSn, CuMg, CuNi, CuZn, CuPd, CuAu, CuRe, or CuW, W, a W alloy, Ni, Ru, and Co. An insulating layer may be interposed between the first semiconductor substrate 100 and the first through-electrode 120. The insulating layer may include an oxide layer, a nitride layer, a carbon layer, a polymer, a combination of these, or other suitable insulating layer.

The first through-electrode 120 may be formed of conductive materials that are filled through at least a portion of the first semiconductor substrate 100 and obtained by partially removing the substrate 100. For example, the first through-electrode 120 may include the barrier layer and the filling conductive layer filled in the barrier layer. Alternatively, for example, the first through-electrode 120 may include the barrier layer, the filling conductive layer filled in the barrier layer, and a portion of the metal wiring layer and/or the via plug.

Figure 2:
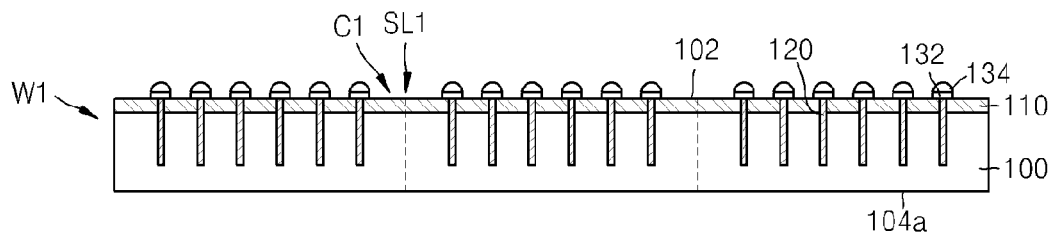

FIG. 2 is a cross-sectional view of an operation for forming first connecting bumps 134, according to an embodiment of the inventive concepts.

Referring to FIG. 2, the first connecting bumps 134 that are electrically connected to the first through-electrodes 120 are formed on the first semiconductor substrate 100. Prior to forming the first connecting bumps 134, first connecting pads 132 may be formed between the first through-electrodes 120 and the first connecting bumps 134.

Figure 3:
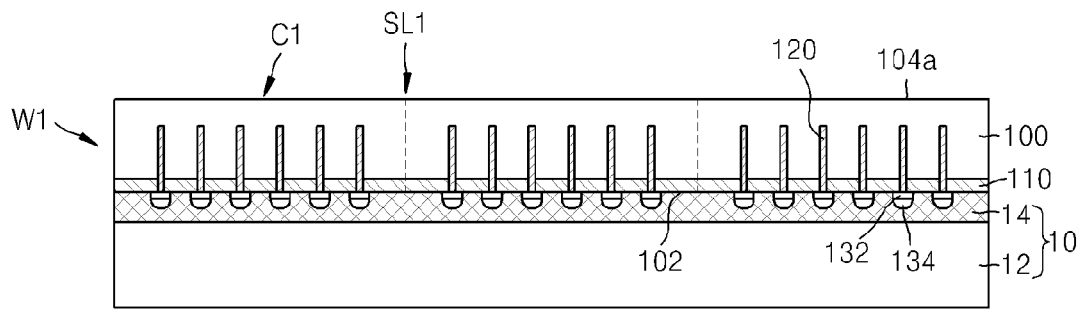

FIG. 3 is a cross-sectional view of an operation for attaching the first semiconductor wafer W1 to a first carrier substrate 10, according to an embodiment of the inventive concepts.

Referring to FIG. 3, the first semiconductor wafer W1 on which the first connecting bumps 134 are formed is attached to the first carrier substrate 10. The first carrier substrate 10 may include a first support substrate 12 and a first adhesive material layer 14. The first semiconductor wafer W1 may be attached to the first carrier substrate 10 such that the first connecting bumps 134 may face the first carrier substrate 10. In some embodiments, the first connecting bumps 134 may be surrounded by the first adhesive material layer 14. In some embodiments, a portion of the first upper surface 102 of the first semiconductor substrate 100, which is exposed by the first connecting bumps 134, may contact the first adhesive material layer 14.

Figure 4:
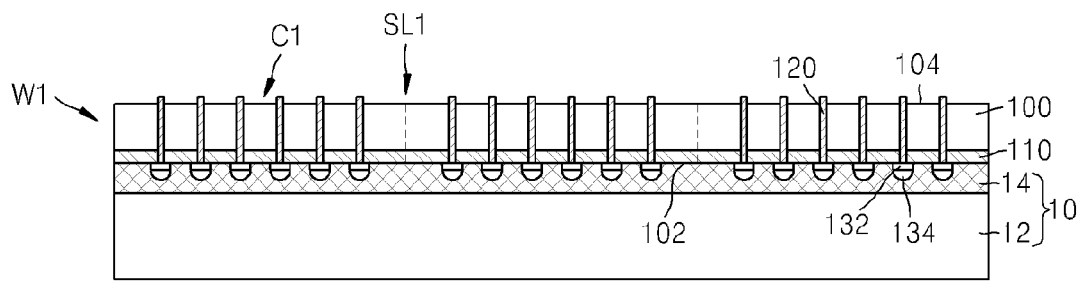

FIG. 4 is a cross-sectional view of an operation for exposing the first through-electrodes 120, according to an embodiment of the inventive concepts.

Referring to FIG. 4, a portion of the first semiconductor substrate 100 is removed to expose the first through-electrodes 120. The first through-electrodes 120 may be exposed above a first lower surface 104 of the first semiconductor substrate 100. Since the first through-electrodes 120 are exposed above a first lower surface 104 of the first semiconductor substrate 100, the first through-electrodes 120 may be formed through the first semiconductor substrate 100. Selectively, a portion of the first semiconductor substrate 100 may be removed such that the first through-electrodes 120 may protrude from the first lower surface 104.

In some embodiments, in order to expose the first through-electrodes 120, a portion of the first semiconductor substrate 100 may be removed by using a chemical mechanical polishing (CMP) process, an etch-back process, or a combination these.

Figure 5:
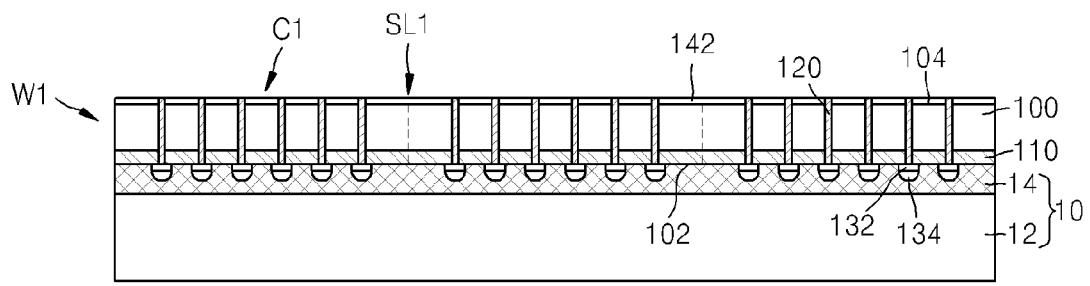

FIG. 5 is a cross-sectional view of an operation for forming a first lower protective layer 142, according to an embodiment of the inventive concepts.

Referring to FIG. 5, the first lower protective layer 142 is formed to cover an exposed surface of the first semiconductor wafer W1, that is, the first lower surface 104 of the first semiconductor substrate 100. In some embodiments, the first lower protective layer 142 may be formed by using, for example, a spin coating process or a spraying process. In some embodiments, the first lower protective layer 142 may be formed of, for example, an insulating polymer. In order to form the first lower protective layer 142, a insulating polymer layer may be formed to cover the first lower surface 104 of the first semiconductor substrate 100 and the exposed portions of the first through-electrodes 120, and then the insulating polymer layer may be partially removed via an etch-back process to expose the first through-electrodes 120.

Figure 6:
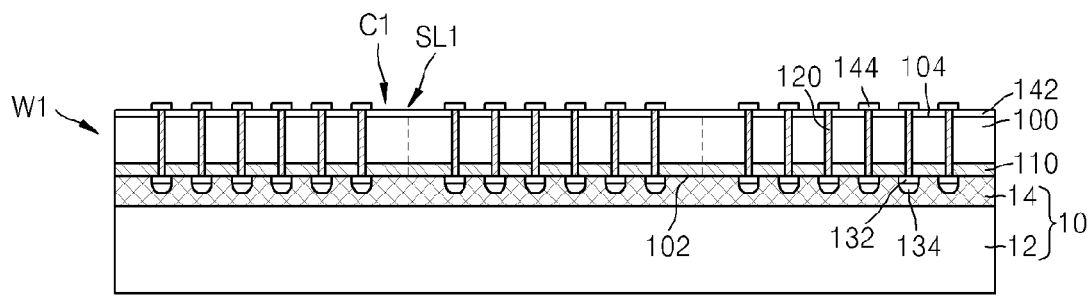

FIG. 6 is a cross-sectional view of an operation for forming first lower pads 144, according to an embodiment of the inventive concepts.

Referring to FIG. 6, the first lower pads 144 that are electrically connected to portions of the first through-electrodes 120, which are exposed by the first lower protective layer 142, is formed. In some embodiments, the first lower pads 144 may be omitted.

Figure 7:
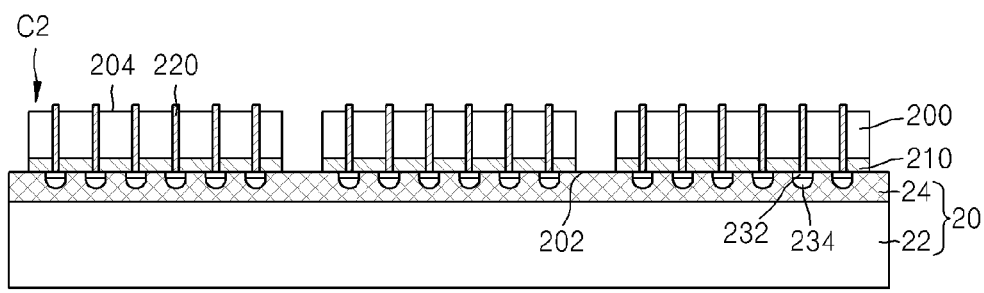

FIG. 7 is a cross-sectional view of an operation for preparing a plurality of second semiconductor chips C2, according to an embodiment of the inventive concepts.

Referring to FIG. 7, the second semiconductor chips C2 are prepared. In order to prepare the second semiconductor chips C2 a second semiconductor wafer (not shown) may be processed. The second semiconductor wafer is designated into second semiconductor chips C2, as in the operation for preparing the first semiconductor wafer W1 shown in FIGS. 1 through 4.

In some embodiments, the second semiconductor wafer may comprise a semiconductor wafer including the same type of individual devices that are formed via the same processes as those of the first semiconductor wafer W1. The plurality of second semiconductor chips C2 may be separated from each other by attaching the second semiconductor wafer to a second carrier substrate 20 and then cutting the second semiconductor wafer into the second semiconductor chips C2. In some embodiments, the second semiconductor chip C2 includes a second semiconductor substrate 200, a second semiconductor device 210, and second through-electrodes 220. The second semiconductor substrate 200 may have a second upper surface 202 and a second lower surface 204 which are opposite each other. The second through-electrodes 220 may be formed through the second semiconductor substrate 200.

The second semiconductor chip C2 may be the same type semiconductor chip including the same individual device or devices as those of the first semiconductor chip C1. Alternatively, the second semiconductor chip C2 may be a different type semiconductor chip including a different individual device or devices from those of the first semiconductor chip C1.

Components shown in FIG. 7, which have not been described in detail thus far, are the same as those of FIGS. 1 through 4, except that the term "first" is replaced by "second" and the reference numeral "1 x" or "1xx" is replaced by "2x" or "2xx", and thus, detailed description of these components will not be given here.

Figure 8:
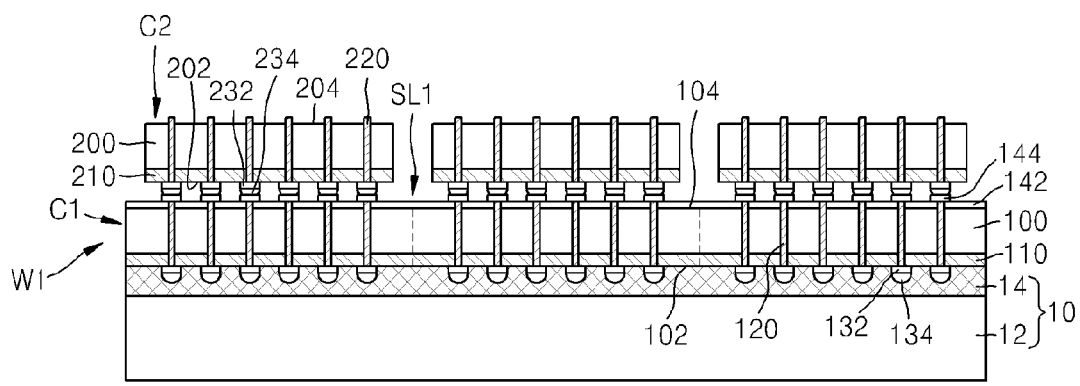

FIG. 8 is a cross-sectional view of an operation for stacking the second semiconductor chips C2 on the first semiconductor wafer W1, according to an embodiment of the inventive concepts.

Referring to FIG. 8, the second semiconductor chips C2 are separated from the second carrier substrate 20 shown in FIG. 7 and are stacked on the first semiconductor wafer W1 shown in FIG. 6. The second semiconductor chips C2 may be stacked on the first semiconductor wafer W1 to respectively correspond to the first semiconductor chips C1 included in the first semiconductor wafer W1. That is, the plurality of second semiconductor chips C2 may be stacked on the first semiconductor chips C1 so as to respectively correspond to the first semiconductor chips C1.

The second semiconductor chips C2 may be stacked on the first semiconductor chips C1 such that some or all of the first through-electrodes 120 and the second through-electrodes 220 may be electrically connected to each other. In order to electrically connect the first through-electrodes 120 and the second through-electrodes 220 to each other, the second semiconductor chips C2 may be stacked on the first semiconductor chips C1 such that second connecting bumps 234 of the second semiconductor chips C2 may contact the first lower pads 144, of the first semiconductor chips C1 respectively. In an embodiment where the first lower pads 144 are not formed, the second connecting bumps 234 may directly contact the first through-electrodes 120, for example, the exposed portions of the first through-electrodes 120.

The second semiconductor chips C2 may be stacked on the first semiconductor chips C1 and then a reflow process may be performed, thereby enhancing the adhesion between the second connecting bumps 234 and the first lower pads 144 or the adhesion between the second connecting bumps 234 and the first through-electrodes 120 and thereby reducing contact resistance therebetween.

Figure 9:
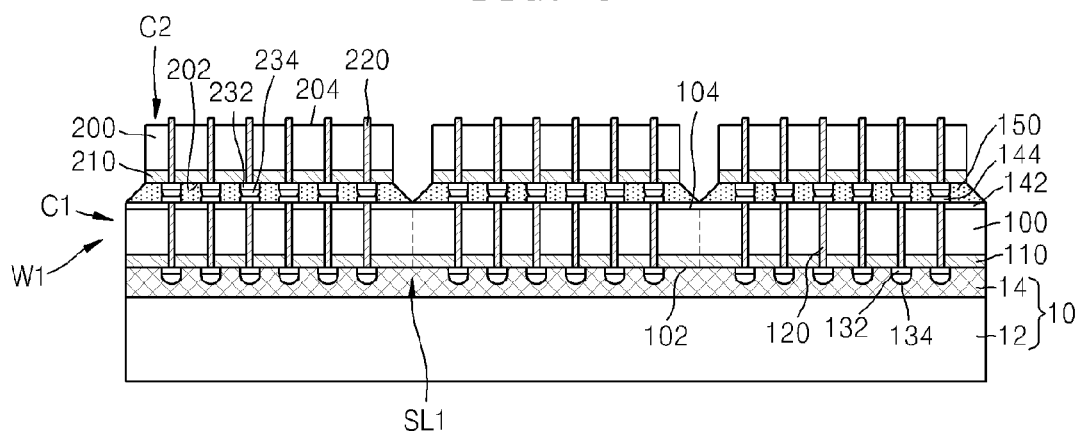

FIG. 9 is a cross-sectional view of an operation for forming a first under-fill layer 150, according to an embodiment of the inventive concepts.

Referring to FIG. 9, the first under-fill layer 150 is formed between the first semiconductor chips C1 and the second semiconductor chips C2. The first under-fill layer 150 may fill an entire space, volume, or region between the first semiconductor chips C1 and the second semiconductor chips C2. In some embodiments, the first under-fill layer 150 may be formed to entirely surround the second connecting bumps 234. In some embodiments, the first under-fill layer 150 may be formed to cover portions of the second upper surfaces 202 of the second semiconductor chips C2, which are exposed by the second connecting bumps 234. The first under-fill layer 150 may be formed to have a horizontal cross-section that increases in width in a direction from the second semiconductor chip C2 toward the first semiconductor chip C1.

In some embodiments, the first under-fill layer 150 may be formed by using, for example, a capillary under-fill method. In some embodiments, the first under-fill layer 150 may be formed of, for example, an epoxy resin. In some embodiments, a filler may be added to the first under-fill layer 150. The filler may be formed of, for example, silica. In some embodiments, the filler may have a size of, for example, 0.1 μm to several μm and may have an average size of about 0.3 to about 1 μm. The filler may be added to the first under-fill layer 150 by about 55 wt % to about 75 wt %. That is, a ratio of the filler to the first under-fill layer 150 may be about 55 wt % to about 75 wt %.

FIGS. 1 through 9 illustrate a case where a single layer including the second semiconductor chips C2 is stacked on the first semiconductor chips C1. Inventive concepts are not limited thereto. For example, a plurality of layers including the second semiconductor chips C2 may be sequentially stacked on the first semiconductor chips C1.

Figure 10:
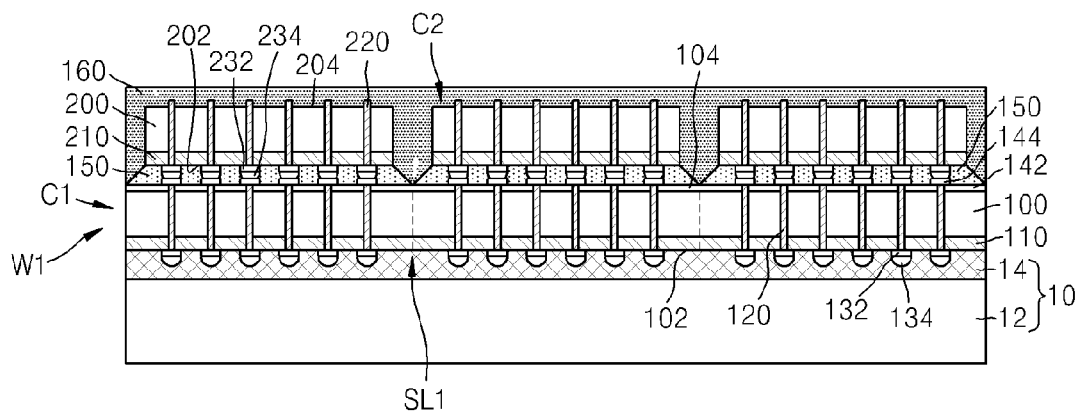

FIG. 10 is a cross-sectional view of an operation for forming a first mold layer 160, according to an embodiment of the inventive concepts.

Referring to FIG. 10, the first mold layer 160 is formed on the first semiconductor wafer W1 to cover the second semiconductor chips C2. In some embodiments, the first mold layer 160 may be formed to cover second lower surfaces 204 of the second semiconductor chip C2 and lateral surfaces thereof. In some embodiments, the first mold layer 160 may be formed of, for example, an epoxy mold compound (EMC). In some embodiments, a filler may be added to the first mold layer 160. The filler may be formed of, for example, silica. The filler may have a size of, for example, several to several tens of μm and may have an average size of about 2 to about 10 μm. The filler may be added to the first mold layer 160 by about 80 wt % to about 90 wt %. That is, a ratio of the filler of the first mold layer 160 to the first mold layer 160 may be about 80 wt % to about 90 wt %. The filler may comprise generally spherical portions of silica material. The different sizes of filler and different concentrations provide for different adhesion characteristics.

Figure 11:
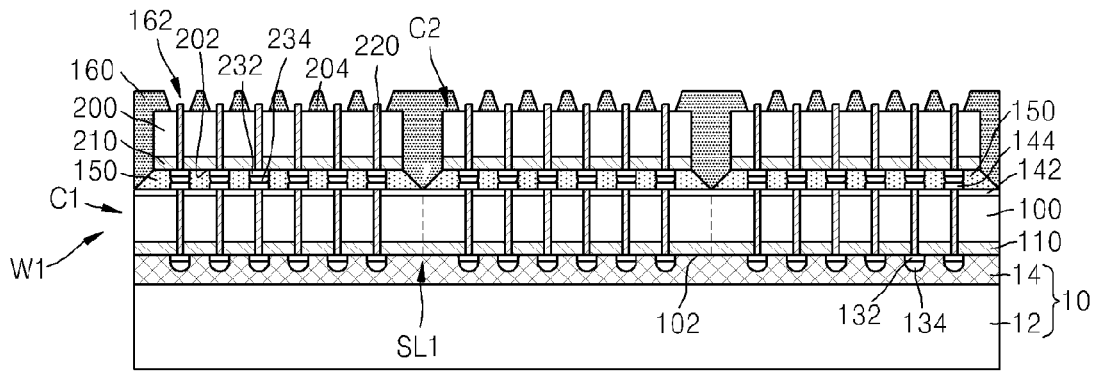

FIG. 11 is a cross-sectional view of an operation for exposing the second through-electrodes 220, according to an embodiment of the inventive concepts.

Referring to FIG. 11, first holes 162 are formed by removing portions of the first mold layer 160 to expose the second through-electrodes 220. For example, the first holes 162 may be formed by removing the portions of the first mold layer 160 by using a laser drilling method.

Figure 12:
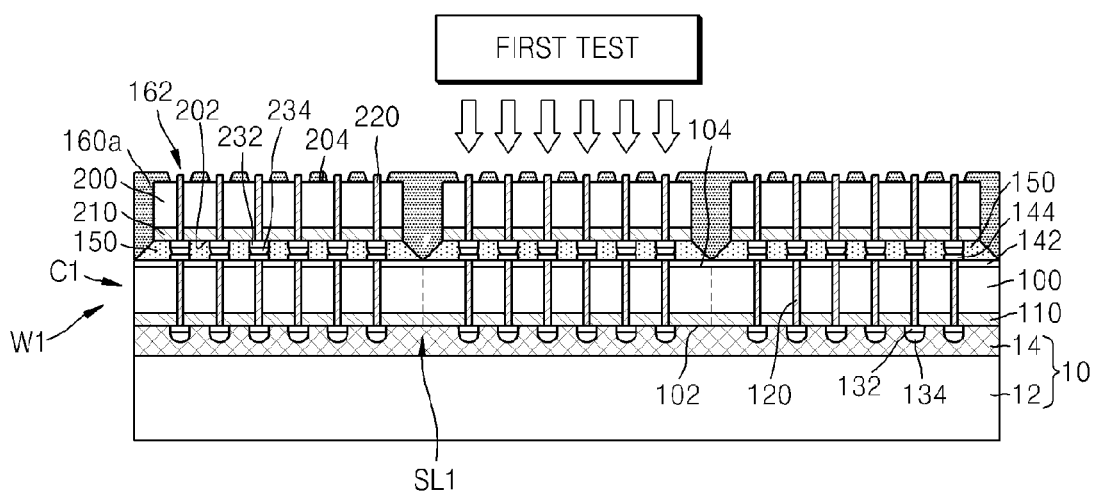

FIG. 12 is a cross-sectional view of an operation for performing a first test, according to an embodiment of the inventive concepts.

Referring to FIG. 12, portions of the first mold layer 160 may be removed to reduce a thickness of the first mold layer 160 formed on the second lower surface 204 of the second semiconductor chip C2. In some embodiments, in order to remove portions of the first mold layer 160, chemical mechanical polishing (CMP), etch-back, or a combination of these may be used.

In some embodiments, the operation for reducing the thickness of the first mold layer 160 may be performed prior to forming the first holes 162, shown in FIG. 11. The thickness of the first mold layer 160 may be adjusted in performing the operation for forming the first mold layer 160, shown in FIG. 10, and thus, the operation for reducing the thickness of the first mold layer 160 may not be necessary and, therefore, may be omitted.

The first test for determining whether failure of the first semiconductor chip C1 and the second semiconductor chip C2 occurs may be performed by accessing the second through-electrodes 220 that are exposed through the first holes 162 of the first mold layer 160.

Figure 13:
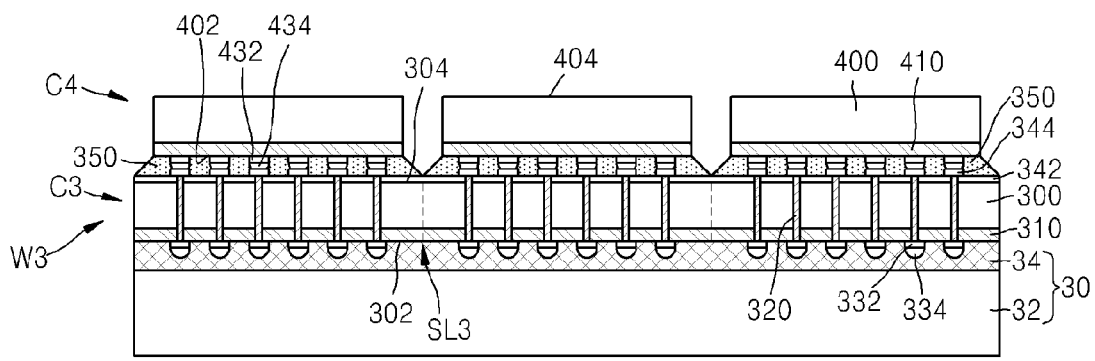

FIG. 13 is a cross-sectional view of an operation for stacking fourth semiconductor chips C4 on third semiconductor chips C3, according to an embodiment of the inventive concepts.

Referring to FIG. 13, fourth semiconductor chips C4 are stacked on a third semiconductor wafer W3 including a plurality of third semiconductor chips C3. The third semiconductor wafer W3 may be formed using a process similar to, or the same as, that used to form the first semiconductor wafer W1, shown in FIGS. 1 through 6. The fourth semiconductor chips C4 may be formed using a process similar to, or the same as, that used to faun the second semiconductor chip C2, shown in FIG. 7.

In some embodiments, the third semiconductor chip C3 may be the same type semiconductor chip including the same individual device or devices as those of the first semiconductor chip C1, shown in FIG. 1. Alternatively, the third semiconductor chip C3 may be a different type semiconductor chip including a different individual device or devices as those of the first semiconductor chip C1. The fourth semiconductor chips C4 may be the same type semiconductor chip including the same individual device or devices as those of the first semiconductor chip C1. Alternatively, the fourth semiconductor chips C4 may be a different type semiconductor chip including a different individual device or devices as those of the first semiconductor chip C1.

In some embodiments, certain through-electrodes corresponding to the second through-electrodes 220 of the second semiconductor chip C2 may not be required in the fourth semiconductor chips C4. Alternatively, in some embodiments, through-electrodes corresponding to the second through-electrode 220 of the second semiconductor chip C2 may also be formed in the fourth semiconductor chips C4.

The plurality of fourth semiconductor chips C4 may be stacked on the third semiconductor wafer W3 so as to respectively correspond to the plurality of third semiconductor chips C3 included in the third semiconductor wafer W3. That is, the fourth semiconductor chips C4 may be stacked on the third semiconductor chips C3. The fourth semiconductor chips C4 may be stacked on the third semiconductor chips C3 so as to be electrically connected to third through-electrodes 320. The fourth semiconductor chips C4 may be stacked on the third semiconductor chips C3 and then a reflow process may be performed, thereby enhancing the adhesion between fourth connecting bumps 434 and third lower pads 344 or the adhesion between the fourth connecting bumps 434 and the third through-electrodes 320 and thereby reducing contact resistance therebetween.

Then, a second under-fill layer 350 is formed between the third semiconductor chips C3 and the fourth semiconductor chips C4. In some embodiments, the second under-fill layer 350 may fill an entire space, volume or region between the third semiconductor chips C3 and the fourth semiconductor chips C4. In some embodiments, the second under-fill layer 350 may be formed to entirely surround the fourth connecting bumps 434. In some embodiments, the second under-fill layer 350 may be formed by using, for example, a capillary under-fill method. The second under-fill layer 350 may have the same or similar physical property as that of the first under-fill layer 150 shown in FIG. 9, or optionally, many have a different physical property.

FIG. 13 illustrates a case where a single layer including the fourth semiconductor chips C4 is stacked on the third semiconductor chips C3. The inventive concept is not limited thereto. Thus, a plurality of layers including the fourth semiconductor chips C4 may be sequentially stacked on the third semiconductor chips C3. In this case, fourth through-electrodes (not shown) that respectively correspond to the second through-electrodes 220 of the second semiconductor chip C2 shown in FIG. 7 may optionally be formed in the remaining fourth semiconductor chips C4 except for an uppermost layer corresponding to a fourth semiconductor chip C4 from among the plurality of the fourth semiconductor chips C4.

Components shown in FIG. 13, which have not been described thus far, are the same as those, or are similar to those, of FIGS. 1 through 9, except that the terms "first" and "second" are respectively replaced by "third" and "fourth" and the reference numeral "1x/2x" and "1xx/2xx" are respectively replaced by "3x/4x" and "3xx/4xx", and thus, detailed description of these components will not be given here.

Figure 14:
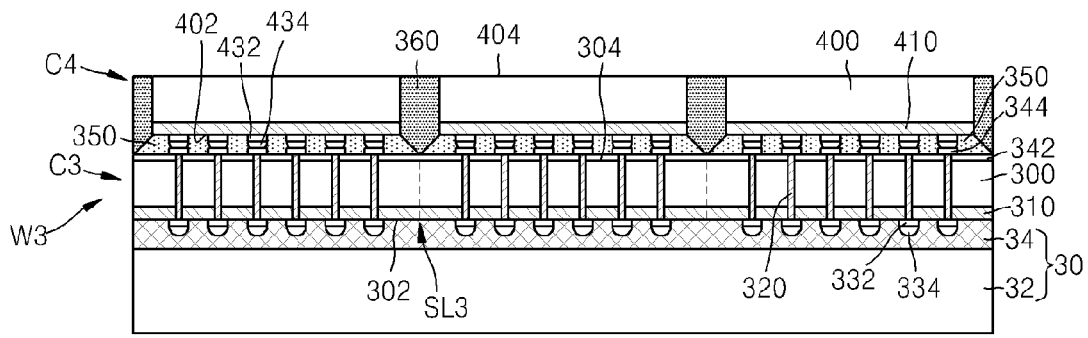

FIG. 14 is a cross-sectional view of an operation for forming a second mold layer 360, according to an embodiment of the inventive concepts.

Referring to FIG. 14, the second mold layer 360 is formed on the third semiconductor wafer W3 to fill spaces between the fourth semiconductor chips C4. In some embodiments, the second mold layer 360 may be formed to cover lateral surfaces of the fourth semiconductor chips C4. FIG. 14 illustrates a case where the second mold layer 360 is formed to expose a fourth lower surface 404 of the fourth semiconductor chips C4. However, the inventive concepts are not limited thereto. For example, in some embodiments, the second mold layer 360 may be formed to cover the fourth lower surface 404 of the fourth semiconductor chips C4.

Alternatively, the second mold layer 360 may be formed using a mold material layer to cover the fourth lower surface 404 of the fourth semiconductor chips C4 and then removing a portion of the mold material layer so as to expose the fourth lower surface 404 of the fourth semiconductor chips C4.

In some embodiments, the second mold layer 360 may have the same or similar physical property as that of the first mold layer 160 shown in FIG. 10.

Figure 15:
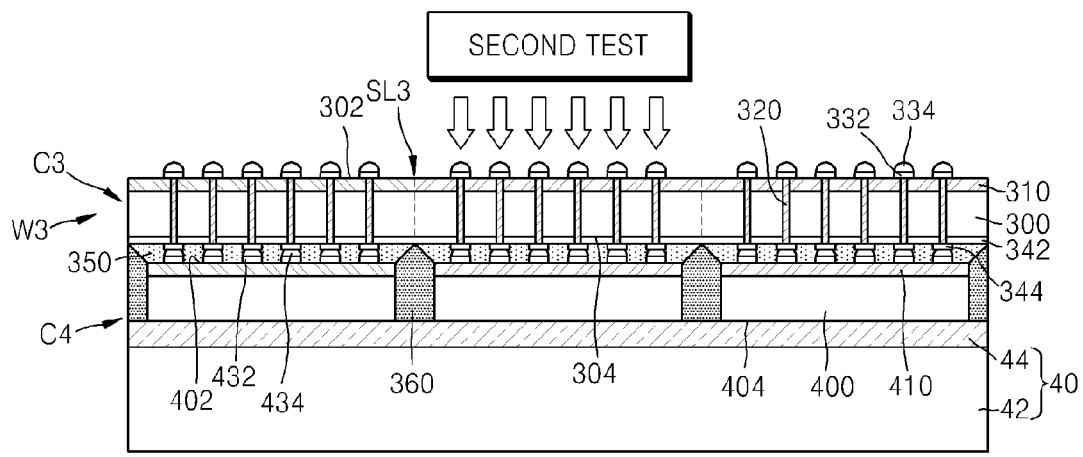

FIG. 15 is a cross-sectional view of an operation for performing a second test, according to an embodiment of the inventive concepts.

Referring to FIG. 15, the third semiconductor wafer W3 whereon the fourth semiconductor chips C4 are stacked is separated from a third carrier substrate 30 shown in FIG. 14 and is attached to a fourth carrier substrate 40. As compared with a case where the third semiconductor wafer W3 is attached to the third carrier substrate 30, an inverted structure of the third semiconductor wafer W3 whereon the fourth semiconductor chips C4 are stacked is attached to the fourth carrier substrate 40. Thus, the third semiconductor wafer W3 whereon the fourth semiconductor chips C4 are stacked may be attached to the fourth carrier substrate 40 such that the fourth semiconductor chips C4 may face the fourth carrier substrate 40.

Then, the second test for determining whether failure of the third semiconductor chips C3 and the fourth semiconductor chips C4 occurs may be performed by accessing third connecting bumps 334 of the third semiconductor chips C3.

Figure 16:
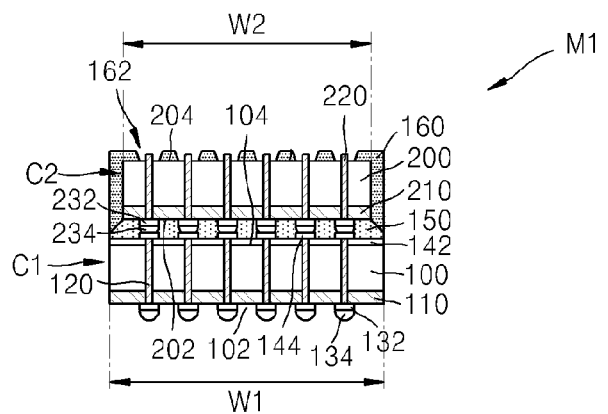

FIG. 16 is a cross-sectional view of an operation for forming a first stack structure M1, according to an embodiment of the inventive concepts.

Referring to FIG. 16, the first test shown in FIG. 12 may be performed and then the first semiconductor wafer W1 may be cut or otherwise partitioned along the first scribe lanes SL1 into a plurality of first stack structures M1 including the first semiconductor chip C1 and the second semiconductor chip C2 which correspond to each other.

The first stack structure M1 may include the first semiconductor chip C1 including the first through-electrodes 120 and at least one second semiconductor chip C2 that is stacked on the first semiconductor chip C1 across the first under-fill layer 150 and includes the second through-electrodes 220.

A horizontal cross-sectional width of the second semiconductor chip C2 may be smaller than a horizontal cross-sectional width of the first semiconductor chip C1. The first mold layer 160 may be formed on a portion of the first semiconductor chip C1 and at sidewalls of the second semiconductor chip C2 so as to surround a lateral surface of the second semiconductor chip C2. The first mold layer 160 may be formed on a portion of the second lower surface 204 of the second semiconductor chip C2 so as to be on at least a portion of an upper surface of the first stack structure M1.

For purposes of the present disclosure, the term "horizontal width" or "horizontal cross-sectional width" in connection with the width of a semiconductor chip refers to a width of the chip from a first sidewall or edge 201 of the ship to a second sidewall or edge of the chip. In the present example shown in FIG. 16, the horizontal width of the first chip C1 is referenced as w1, while the width of the second chip C2 is referenced as w2. It can be seen in this example that the first horizontal width w1 of the first chip C1 is greater than the second horizontal width w2 of the second chip C2.

In some embodiments, the first semiconductor chip C1 and the second semiconductor chip C2 may be the same type of semiconductor chip. In this case, a Kerf width of a blade used to separate or dice the second semiconductor chips C2 from their host semiconductor wafer may be greater than that used to separate the first semiconductor chips C1 from their host first semiconductor wafer. As a result, the separated second semiconductor chip C2 may have a smaller horizontal cross-sectional width than that of the separated first semiconductor chip C1.

Alternatively, in some embodiments, the first semiconductor chip C1 and the second semiconductor chip C2 may be different types of semiconductor chips. In this case, the second semiconductor chip C2 may have a smaller horizontal cross-sectional width than that of the first semiconductor chip C1.

Figure 17:
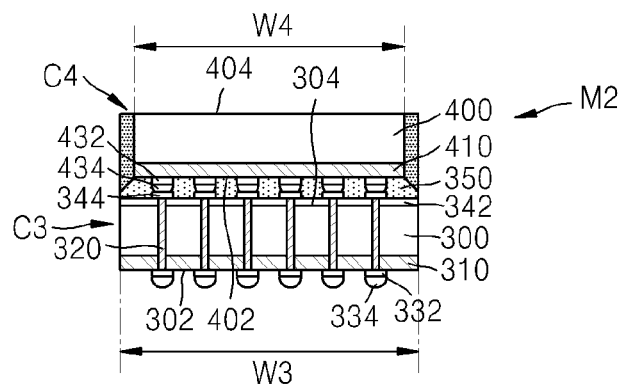

FIG. 17 is a cross-sectional view of an operation for forming a second stack structure M2, according to an embodiment of the inventive concepts.

Referring to FIG. 17, the second test shown in FIG. 15 is performed and then the third semiconductor wafer W3 is cut along third scribe lanes SL3 into second stack structures M2 including the third semiconductor chips C3 and the fourth semiconductor chips C4 which correspond to each other.

The second stack structure M2 may include the third semiconductor chip C3 including the third through-electrodes 320 and at least one fourth semiconductor chip C4 that is formed on the third semiconductor chips C3 on the second under-fill layer 350.

In some embodiments, a horizontal cross-sectional width w4 of the fourth semiconductor chip C4 may be smaller than the horizontal cross-sectional width w3 of the third semiconductor chip C3.

The second mold layer 360 may be formed on a portion of the third semiconductor chips C3 at sidewalls of the fourth semiconductor chips C4 so as to surround a lateral surface of the fourth semiconductor chips C4. The second mold layer 360 may be formed on portions of an upper surface of the second stack structure M2, that is, a portion of the fourth semiconductor chip C4.

The third semiconductor chips C3 and the fourth semiconductor chips C4 may be the same type semiconductor chip. In this case, a Kerf width of a blade used to separate or dice the fourth semiconductor chip C4 from their host semiconductor wafer may be greater than that used to separate the third semiconductor chip C3 from their host third semiconductor wafer. As a result, the separated fourth semiconductor chip C4 may have a smaller horizontal cross-sectional width than that of the separated third semiconductor chip C3.

Alternatively, the third semiconductor chips C3 and the fourth semiconductor chips C4 may be different types of semiconductor chips. In this case, the fourth semiconductor chip C4 may have a smaller horizontal cross-sectional width than that of the third semiconductor chip C3.

Figure 18:
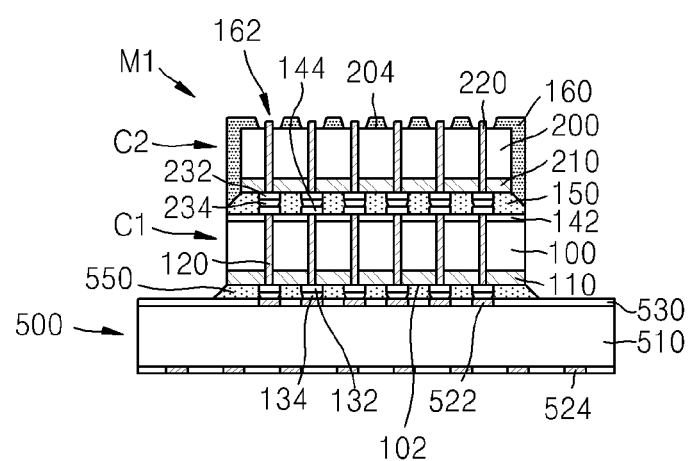

FIG. 18 is a cross-sectional view of an operation for mounting the first stack structure M1 to a printed circuit board 500, according to an embodiment of the inventive concepts.

Referring to FIG. 18, the first stack structure M1 is mounted to the printed circuit board 500. In some embodiments, the printed circuit board 500 includes a base substrate 510, and first contact terminals 522 and second contact terminals 524, which are respectively formed on upper and lower surfaces of the base substrate 510 so as to be exposed through a solder resist layer 530.

The base substrate 510 may include at least one material selected from a phenol resin, an epoxy resin, and a polyimide. For example, the base substrate 510 may include at least one material selected from FR4, tetrafunctional epoxy, polyphenylene ether, epoxy/polyphenylene oxide, bismaleimidetriazine, thermount, cyanate ester, polyimide, and liquid crystal polymer. The first contact terminals 522 and the second contact terminals 524 may include Cu, Ni, stainless steel, or beryllium copper. An internal contact terminal (not shown) for electrically connecting the first contact terminals 522 and the second contact terminals 524 to each other may be formed in the base substrate 510.

In some embodiments, the first contact terminals 522 and the second contact terminals 524 may correspond to portions of a circuit wiring formed by forming and patterning a Cu foil on the base substrate 510, which are exposed above the solder resist layer 530.

The first contact terminals 522 may be electrically connected to the first connecting bumps 134 of the first semiconductor chip C1. The first stack structure M1 may be mounted on the printed circuit board 500 such that the first connecting bumps 134 may contact the first contact terminals 522. A solder ball, a conductive bump, a lead grid array (LGA), or the like may be formed on the second contact terminals 524 so that the resulting structure can be connected to an external device.

A substrate under-fill layer 550 may be formed between the printed circuit board 500 and the first stack structure M1. The substrate under-fill layer 550 may be formed to fill spaces between the first semiconductor chip C1 and the printed circuit board 500. The substrate under-fill layer 550 may be formed to entirely surround the first connecting bumps 134.

The substrate under-fill layer 550 may be formed by using, for example, a capillary under-fill method. In some embodiments, the substrate under-fill layer 550 may have the same or similar physical property as that of the first under-fill layer 150 shown in FIG. 9. In other embodiments, the substrate under-fill layer 550 may have different physical properties to those of the first under-fill layer 150 shown in FIG. 9

Figure 19:
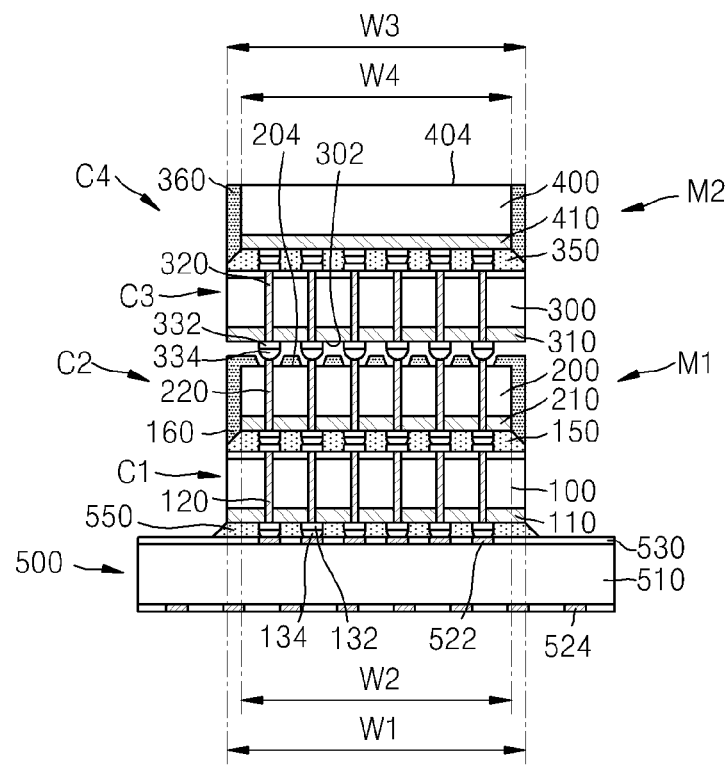

FIG. 19 is a cross-sectional view of an operation for stacking the second stack structure M2 on the first stack structure M1, according to an embodiment of the inventive concepts.

Referring to FIG. 19, the second stack structure M2 is stacked on the first stack structure M1 mounted on the printed circuit board 500. The second stack structure M2 may be stacked on the first stack structure M1 such that the third connecting bumps 334 of the third semiconductor chips C3 may be respectively connected to the second through-electrodes 220 of the second semiconductor chip C2. Thus, the first through fourth semiconductor chips C1, C2, C3, and C4 may be stacked atop each other on the printed circuit board 500. It can be seen in this example embodiment that the first horizontal width w1 of the first chip C1 is greater than the second horizontal width w2 of the second chip C2, and that the third horizontal width w3 of the third chip C3 is greater than the fourth horizontal width w4 of the fourth chip C4.

In some embodiments, the second stack structure M2 may be stacked on the first stack structure M1 and then a reflow process may be performed, thereby enhancing the adhesion between the third connecting bumps 334 and the second through-electrodes 220 and reducing contact resistance therebetween.

Figure 20:
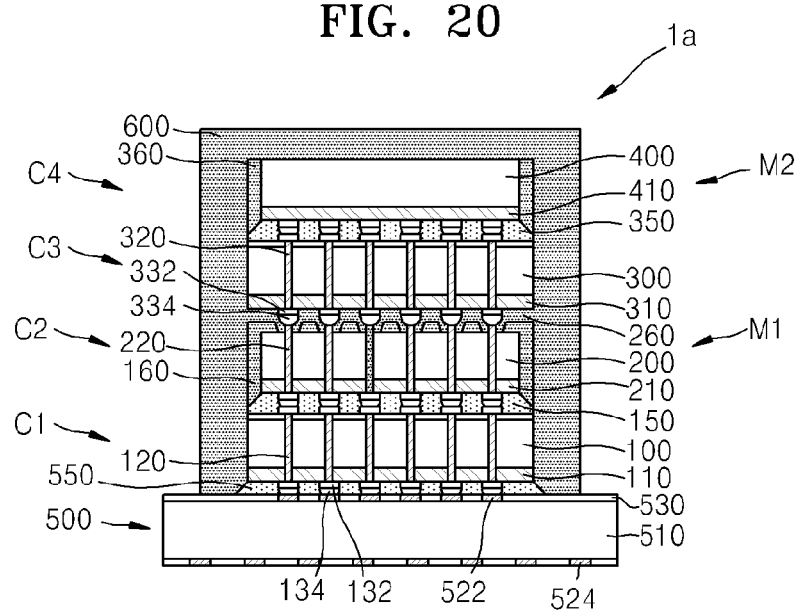

FIG. 20 is a cross-sectional view of a semiconductor package 1a according to an embodiment of the inventive concepts.

Referring to FIG. 20, a substrate mold layer 600 covering the first and second stack structures M1 and M2 is foliated on the printed circuit board 500 to form the semiconductor package 1a. A portion of the substrate mold layer 600 may operate as a third under-fill layer 260 filled in the spaces between the first stack structure M1 and the second stack structure M2.

In some embodiments, the substrate mold layer 600 may have the same or similar physical property as that of the first mold layer 160 shown on FIG. 10 and/or the second mold layer 360 shown in FIG. 14. In other embodiments, the substrate mold layer 600 may a different physical property from that of the first mold layer 160 shown on FIG. 10 and/or the second mold layer 360 shown in FIG. 14

In the semiconductor package 1a, the first through fourth semiconductor chips C1, C2, C3, and C4 may be sequentially stacked atop each other on the printed circuit board 500. In the semiconductor package 1a, the first through fourth semiconductor chips C1, C2, C3, and C4 may be sequentially stacked on the printed circuit board 500 such that the first through fourth semiconductor devices 110, 210, 310, and 410 may face the printed circuit board 500. The first semiconductor chip C1 including the first through-electrodes 120 and the second semiconductor chip C2 including the second through-electrode 220 may be stacked across the first under-fill layer 150. The third semiconductor chip C3 including the third through-electrodes 320 and the fourth semiconductor chip C4 including the second under-fill layer 350 may be stacked across the second under-fill layer 350.

The fourth semiconductor chip C4 may be connected to the first through third through-electrodes 120, 220, and 320 and may be electrically connected to the printed circuit board 500 through the first through third through-electrodes 120, 220, and 320. The first through third through-electrodes 120, 220, and 320 may be sequentially connected to each other. The second stack structure M2 may be stacked on the first stack structure M1 such that the fourth semiconductor chip C4 may be electrically connected to the first through third through-electrodes 120, 220, and 320 that are sequentially connected to each other.

The first semiconductor chip C1 and the third semiconductor chip C3 may be separated from their respective host semiconductor wafers by using similar methods. Thus, a horizontal cross-sectional width of the first semiconductor chip C1 may be substantially the same as that of the second semiconductor chip C2. The second semiconductor chip C2 and the fourth semiconductor chip C4 may be separated from their respective host semiconductor wafers by using similar methods. A horizontal cross-sectional width of the first semiconductor chip C1 may be greater than that of the second semiconductor chip C2. A horizontal cross-sectional width of the third semiconductor chips C3 may be greater than that of the fourth semiconductor chips C4. Thus, in some embodiments, a horizontal cross-sectional width of the third semiconductor chips C3 may be greater than that of the second semiconductor chip C2.

The first stack structure M1 and the second stack structure M2 may be stacked across the third under-fill layer 260 that is a portion of the substrate mold layer 600. That is, the second semiconductor chip C2 and the third semiconductor chip C3 may be stacked across the third under-fill layer 260.

The third under-fill layer 260 may include a substance having a different physical property from that of the first under-fill layer 150 or the second under-fill layer 350. For example, the first through third under-fill layers 150, 350, and 260 may each include a filler. In this case, a ratio of the filler of the third under-fill layer 260 to the third under-fill layer 260 may be greater than, or less than, a ratio of the filler of the first under-fill layer 150 or the second under-fill layer 350 to the first under-fill layer 150 or the second under-fill layer 350, respectively. In addition, a size of the filler added to the third under-fill layer 260 may be greater than, or less than, a size of the filler added to the first under-fill layer 150 or the second under-fill layer 350.

The first mold layer 160, the second mold layer 360, and the substrate mold layer 600 may include components having the same or similar physical properties. In this case, in the completed semiconductor package 1a, the first mold layer 160, the second mold layer 360, and the substrate mold layer 600 may be recognized as molding members 160, 360, and 600 that are not separated from each other and integrated with each other.

In various embodiments, a ratio of a filler included in each of the molding members 160, 360, and 600 may be greater than, or less than, that of the first under-fill layer 150 or the second under-fill layer 350. For example, a filler may be added to each of the molding members 160, 360, and 600 by about 80 wt % to about 90 wt %. That is, a ratio of the filler include in each of the molding members 160, 360, and 600 may be about 80 wt % to about 90 wt %. For example, the molding members 160, 360, and 600 may each include a filler having a size of several to several tens of μm and an average size of about 2 to 10 μm.

The molding members 160, 360, and 600 may be formed on the printed circuit board 500 and may surround the first stack structure M1 and the second stack structure M2. The first mold layer 160 that is one of the molding members 160, 360, and 600 may be formed on a portion of the first semiconductor chip C1 so as to surround a lateral surface of the second semiconductor chip C2. The second mold layer 360 that is one of the molding members 160, 360, and 600 may be formed on a portion of the third semiconductor chip C3 so as to surround a lateral surface of the fourth semiconductor chip C4.

In the semiconductor package 1a, since the molding members 160, 360, and 600 may partially act as the third under-fill layer 260, the third under-fill layer 260 may be formed of the same material as that of the molding members 160, 360, and 600.

Throughout this specification, the term 'under-fill layer' of the first through third under-fill layers 160, 360, 260 and the substrate under-fill layer 550 may refer to a layer having adhesion properties for bonding the surfaces of the respective chips to each other. The term does not necessarily refer to a layer that is formed via a predetermined manufacturing method or is formed of a predetermined material, but instead may refer to a material layer that fills the regions between neighboring semiconductor chips, for example, fills the space between semiconductor chips or a space between a semiconductor chip and a printed circuit board. In various embodiments, the under-fill layer can comprise a flowable material that is caused to flow into a region or volume between two neighboring chips, or can otherwise comprise an adhesive material or adhesive film.

In the semiconductor package 1a shown in FIG. 20, two stack structures M1 and M2 are stacked. However, the inventive concepts are not limited thereto. For example, a semiconductor package including three or more stack structures may be formed by stacking two or more stack structures that are the same or similar as the first stack structure M1 and then further stacking a stack structure that is the same or similar as the second stack structure M2 on the resulting structure.

The semiconductor package 1a may include at least four semiconductor chips C1, C2, C3, and C4. However, in some embodiments, the semiconductor package 1a is formed by forming the first and second stack structures M1 and M2 including at least two stacked semiconductor chips, referred to herein as a "sub-stack". After this, the semiconductor package is formed by stacking the first and second sub-stack structures M1 and M2 including at least two stacked semiconductor chips again, to thus form a stack of sub-stack structures. This is opposed to a process of sequentially stacking the individual at least four semiconductor chips C1, C2, C3, and C4.

Each of the first and second sub-stack structures M1. M2 can be considered to include a respective sub-stack underfill layer, namely layers 150, 350 in this example embodiment. The second sub-stack structure M2 is positioned on and electrically connected with, the first sub-stack structure M1, and an underfill layer 260 is positioned between them. The underfill layer 260 positioned between the first and second sub-stack structures M1, M2 can be referred to herein as a "package" underfill. The package underfill 260 can be a material that is different from, or the same as, the sub-stack underfill layers 150, 350.

When the first and second stack structures M1 and M2 are formed, the first and second under-fill layers 150 and 350 are respectively formed between two semiconductor chips C1 and C2 and between two semiconductor chips C3 and C4, and a reflow process may be performed in order to increase adhesion and to reduce contact resistance. In addition, when the second stack structure M2 is stacked on the first stack structure M1, the third under-fill layer 260 may be formed, and a separate reflow process for enhancing adhesion and to reduce contact resistance may be performed. Thus, the first, second, third under-fill layers 150, 350, and 260 may be effectively filled between at least four semiconductor chips C1, C2, C3, and C4 included in the semiconductor package 1a, the adhesion between the four semiconductor chips C1, C2, C3, and C4 may be increased and contact resistance therebetween may be reduced.

When the first and second stack structures M1 and M2 are formed, a test for determining whether failure of the semiconductor chips C1/C2 and C3/C4 occurs may be performed. Thus, use of a defective stack structure can be avoided in the manufacture of the semiconductor package 1a. Accordingly, the possibility of failure of the overall semiconductor package 1a may be minimized and reliability may be increased.

FIGS. 21 through 24 are cross-sectional views of a method of manufacturing a semiconductor package, according to another embodiment of the inventive concepts.

Figure 21:
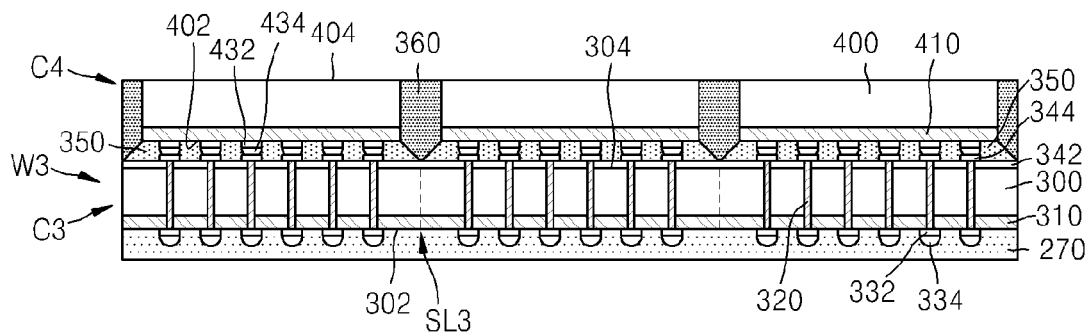
FIGS. 21 through 24 are cross-sectional views of a method of manufacturing a semiconductor package, according to another embodiment of the inventive concepts.

FIG. 21 is a cross-sectional view of an operation for forming a third under-fill layer 270, according to another embodiment of the inventive concepts. In detail, the operation shown in FIG. 21 is performed subsequent to the operation shown in FIG. 15.

Referring to FIG. 21, the third under-fill layer 270 is formed to cover a third upper surface 302 of the third semiconductor wafer W3 whereon the fourth semiconductor chips C4 are stacked. The third under-fill layer 270 may be formed to entirely surround the third connecting bumps 334. The third under-fill layer 270 may be formed to be applied to portions of the third upper surface 302 of the third semiconductor wafer W3, which are exposed by the third connecting bumps 334.

In some embodiments, the third under-fill layer 270 may be formed by attaching a non-conductive film (NCF). The third under-fill layer 270 may include, for example, an epoxy resin. In some embodiments, a filler may be added to the third under-fill layer 270. The filler may be formed of, for example, silica. The filler may have a size of, for example, 0.01 μm to several μm and may have an average size of about 0.05 to about 0.25 μm. The filler may be added to the third under-fill layer 270 by about 30 wt % to about 50 wt %. That is, a ratio of the filler to the third under-fill layer 270 may be about 30 wt % to about 50 wt %.

Figure 22:
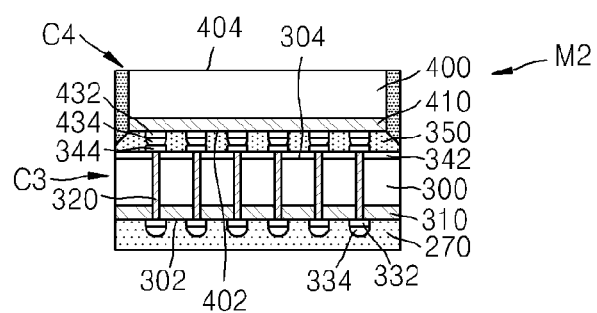

FIG. 22 is a cross-sectional view of an operation for forming the second stack structure M2 to which the third under-fill layer 270 is attached, according to another embodiment of the inventive concepts.

Referring to FIGS. 21 and 22, the third under-fill layer 270 is attached and then the third semiconductor wafer W3 is cut along the third scribe lanes SL3 into the second stack structures M2 including the third semiconductor chips C3 and the fourth semiconductor chips C4 which correspond to each other. Thus, the third under-fill layer 270 may be attached to the second stack structure M2. In particular, the third under-fill layer 270 may be attached to the third upper surface 302 of the third semiconductor chip C3 of the second stack structure M2.

Figure 23:
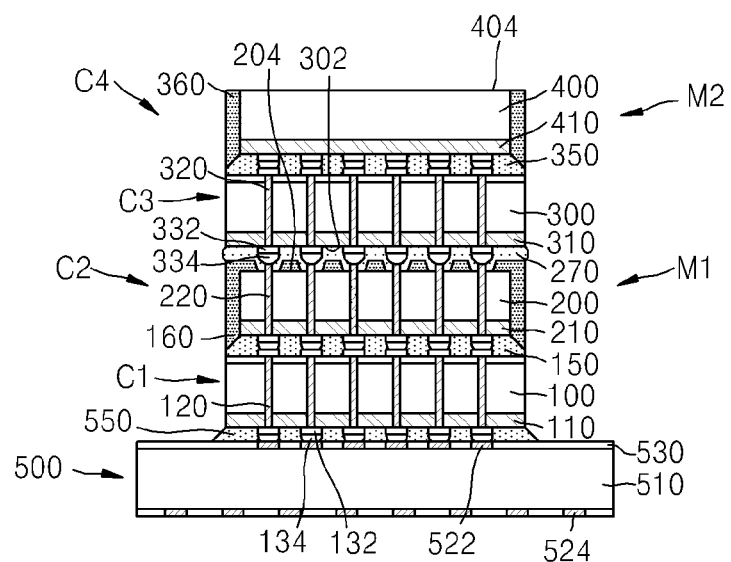

FIG. 23 is a cross-sectional view of an operation for stacking the second stack structure M2 on the first stack structure M1 across the third under-fill layer 270, according to another embodiment of the inventive concepts.

Referring to FIG. 23, the first stack structure M1 is mounted on the printed circuit board 500. The substrate under-fill layer 550 may be formed between the printed circuit board 500 and the first stack structure M1. The first stack structure M1 may be formed by using the same method as that of FIG. 16 and may be attached onto the printed circuit board 500 by using the same method as that of FIG. 18.

Then, the second stack structure M2 is stacked on the first stack structure M1 stacked on the printed circuit board 500. The second stack structure M2 may be stacked on the first stack structure M1 such that the third connecting bumps 334 of the third semiconductor chip C3 may be respectively connected to the second through-electrodes 220 of the second semiconductor chip C2. When the second stack structure M2 is attached, a predetermined amount of physical pressure may be applied such that the third connecting bumps 334 may be connected to the second through-electrodes 220 of the second semiconductor chip C2. Due to the pressure, the third connecting bumps 334 and the second through-electrodes 220 may be connected to each other through the third under-fill layer 270. The third under-fill layer 270 may be caused to fill in spaces between the first stack structure M1 and the second stack structure M2. A lateral surface of the third under-fill layer 270 may protrude with respect to a lateral surface of the second stack structure M2, that is, a lateral surface of the third semiconductor chip C3 due to the pressure applied during the attachment of the second stack structure M2.

Figure 24:
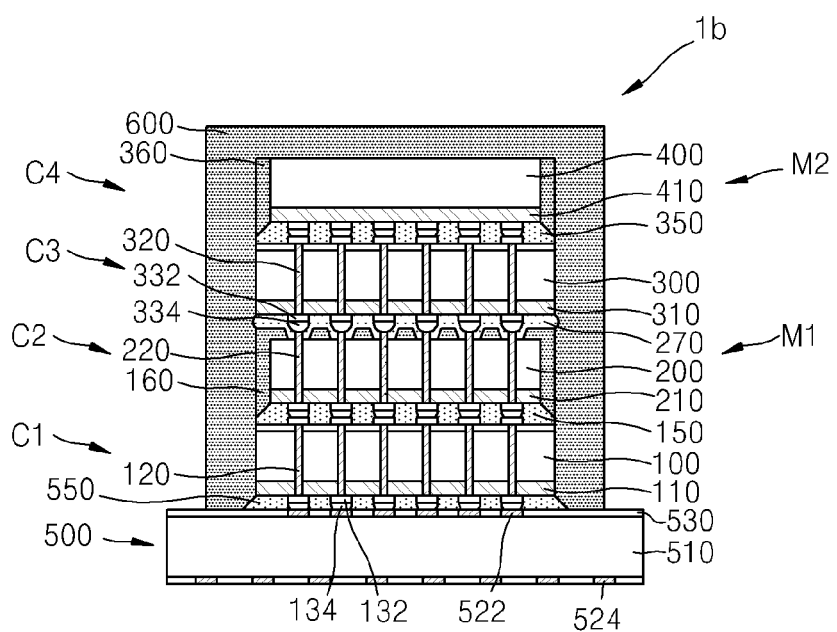

FIG. 24 is a cross-sectional view of a semiconductor package 1b according to another embodiment of the inventive concepts.

Referring to FIG. 24, the semiconductor package 1b is formed by forming the substrate mold layer 600 on the printed circuit board 500 to cover the first and second stack structures M1 and M2.

The third under-fill layer 270 may include components having different physical properties from those of the first under-fill layer 150 or the second under-fill layer 350. For example, the first, second, and third under-fill layers 150, 350, and 270 may each include a filler. In this case, a ratio of the filler of the third under-fill layer 270 to the third under-fill layer 270 may be smaller than a ratio of the filler of the first under-fill layer 150 or the second under-fill layer 350 to the first under-fill layer 150 or the second under-fill layer 350, respectively. In addition, a size of the filler added to the third under-fill layer 270 may be smaller than a size of the filler added to the first under-fill layer 150 or the third under-fill layer 270.

Figure 25:
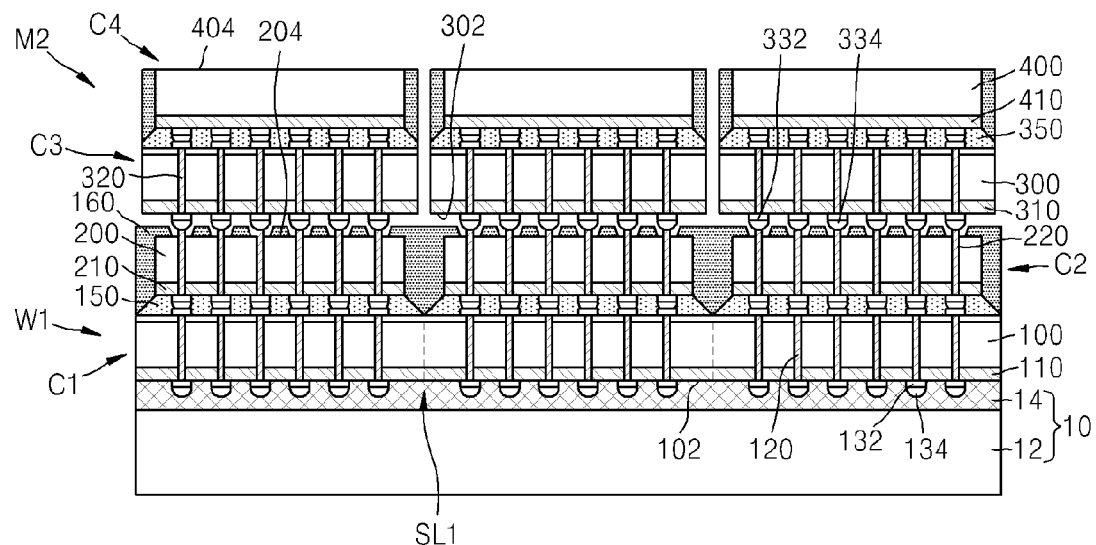
FIGS. 25 through 26 are cross-sectional views of a method of manufacturing a semiconductor package, according to another embodiment of the inventive concepts.
Figure 26:
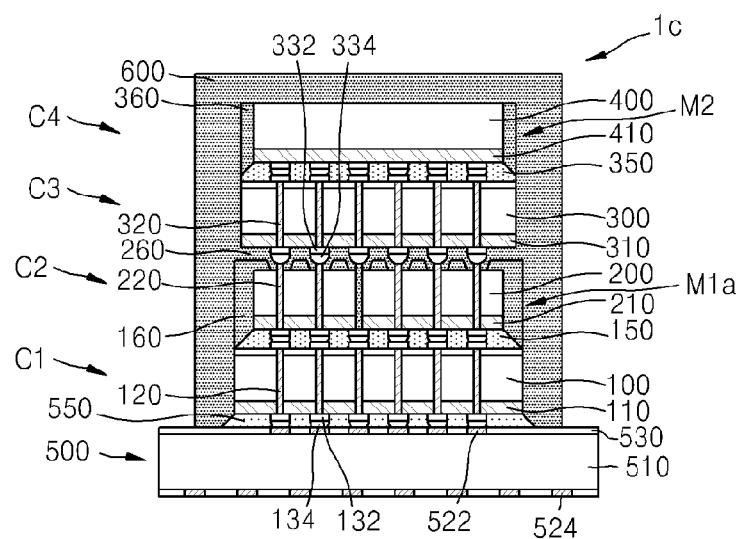

FIGS. 25 through 26 are cross-sectional views of a method of manufacturing a semiconductor package, according to another embodiment of the inventive concepts.

FIG. 25 is a cross-sectional view of an operation for stacking the second stack structure M2 on the second semiconductor chips C2 stacked on the first semiconductor wafer W1, according to another embodiment of the inventive concepts. In detail, the operation shown in FIG. 25 is performed subsequent to the operation shown in FIGS. 1 through 15 and 17.

Referring to FIG. 25, the second stack structure M2 is stacked on the first semiconductor wafer W1 whereon the second semiconductor chips C2 are stacked. The second stack structure M2 may be stacked on the first semiconductor wafer W1 whereon the second semiconductor chips C2 are stacked such that the third connecting bumps 334 of the third semiconductor chip C3 may be respectively connected to the second through-electrodes 220 of the second semiconductor chip C2.

FIG. 26 is a cross-sectional view of a semiconductor package 1c according to another embodiment of the inventive concepts.

Referring to FIGS. 25 and 26, the second stack structure M2 is stacked on the first semiconductor wafer W1 whereon the second semiconductor chips C2 are stacked and then the first semiconductor wafer W1 is cut along the first scribe lane SL1 into the first through fourth semiconductor chips C1, C2, C3, and C4 which correspond to each other. Thus, the second stack structure M2 including the third semiconductor chips C3 and the fourth semiconductor chips C4 which correspond to each other may be stacked on a first stack structure M1a including the first semiconductor chips C1 and the second semiconductor chips C2 which correspond to each other.

The first semiconductor wafer W1 may be cut by using a blade having a Kerf width that is smaller than an interval between adjacent second stack structures M2 such that the first semiconductor wafer W1 may be cut along a gap between the adjacent second stack structures M2 shown in FIG. 25. Thus, a horizontal cross-sectional width of the first stack structure M1a may be greater than that of the second stack structure M2, and a horizontal cross-sectional width of the first semiconductor chip C1 may be greater than that of the third semiconductor chip C3.

Then, the semiconductor package 1c is formed by mounting the first stack structure M1a whereon the second stack structure M2 is stacked, on the printed circuit board 500, and then forming the substrate mold layer 600 on the printed circuit board 500 to cover the first and second stack structures M1a and M2. A portion of the substrate mold layer 600 may operate as the third under-fill layer 260 filled between the first stack structure M1a and the second stack structure M2.

Figure 27:
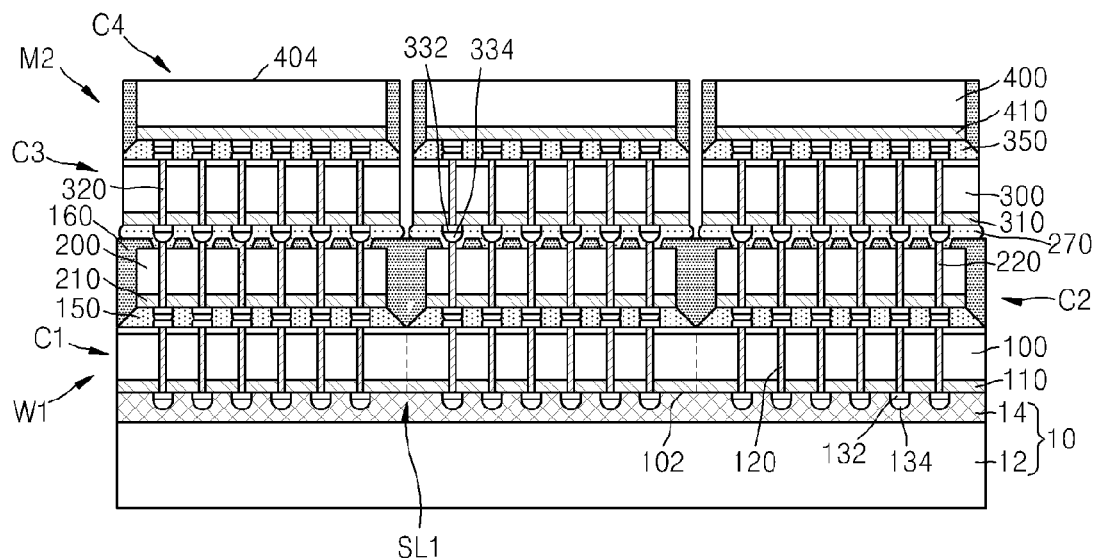
FIGS. 27 through 28 are cross-sectional views of a method of manufacturing a semiconductor package, according to another embodiment of the inventive concepts.
Figure 28:
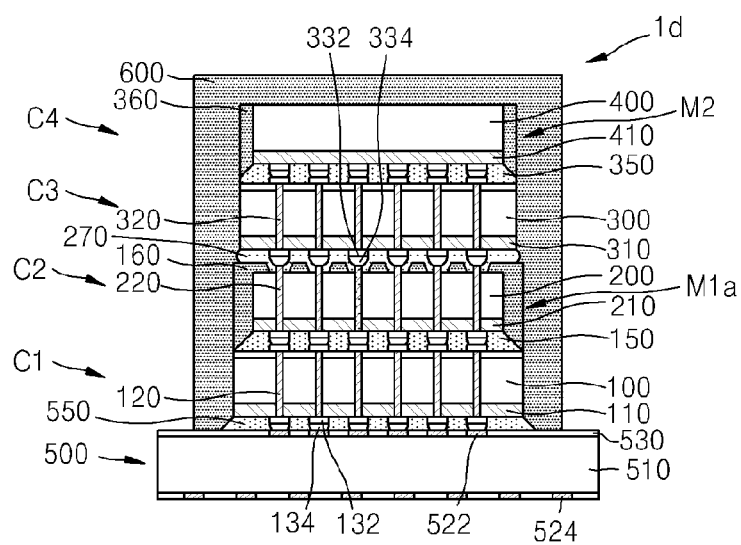

FIGS. 27 through 28 are cross-sectional views of a method of manufacturing a semiconductor package, according to another embodiment of the inventive concepts.

FIG. 27 is a cross-sectional view of an operation for stacking the second stack structure M2 on the second semiconductor chips C2 stacked on the first semiconductor wafer W1 by using the third under-fill layer 270, according to another embodiment of the inventive concepts. In detail, the operation shown in FIG. 27 is an operation performed subsequent to the operations shown in FIGS. 1 through 15, 21, and 22.

Referring to FIG. 27, the second stack structure M2 to which the third under-fill layer 270 is attached is stacked on the first semiconductor wafer W1 whereon the second semiconductor chips C2 are stacked. The second stack structure M2 may be stacked on the second semiconductor chips C2 such that the third connecting bumps 334 of the third semiconductor chip C3 may be respectively connected to the second through-electrodes 220 of the second semiconductor chip C2. When the second stack structure M2 is attached, a predetermined pressure may be applied such that the third connecting bumps 334 may be connected to the second through-electrodes 220 of the second semiconductor chip C2. Due to the pressure, the third connecting bumps 334 and the second through-electrodes 220 may be connected to each other through the third under-fill layer 270. A lateral surface of the third under-fill layer 270 may protrude with respect to a lateral surface of the second stack structure M2, that is, a lateral surface of the third semiconductor chip C3 due to the pressure applied during the attachment of the second stack structure M2.

FIG. 28 is a cross-sectional view of a semiconductor package 1d according to another embodiment of the inventive concepts.

Referring to FIG. 28, the second stack structure M2 is stacked on the first semiconductor wafer W1 whereon the second semiconductor chips C2 are stacked by using the third under-fill layer 270 and then the first semiconductor wafer W1 is cut along the first scribe lane SL1 into first through fourth semiconductor chips C1, C2, C3, and C4 which correspond to each other. Thus, the second stack structure M2 including the third semiconductor chips C3 and the fourth semiconductor chips C4 which correspond to each other may stacked on the first stack structure M1a including the first semiconductor chip C1 and the second semiconductor chip C2 which correspond to each other.

The first semiconductor wafer W1 may be cut by using a blade having a Kerf width that is smaller than an interval between adjacent second stack structures M2 such that the first semiconductor wafer W1 may be cut along a gap between the adjacent second stack structures M2 shown in FIG. 27. Thus, a horizontal cross-sectional width of the first stack structure M1a may be greater than that of the second stack structure M2, and a horizontal cross-sectional width of the first semiconductor chip C1 may be greater than that of the third semiconductor chip C3.

Then, the semiconductor package 1d is formed by mounting the first stack structure M1a wherein the second stack structure M2 is stacked, onto the printed circuit board 500, and then forming the substrate mold layer 600 on the printed circuit board 500 to cover the first and second stack structures M1a and M2.

Figure 29:
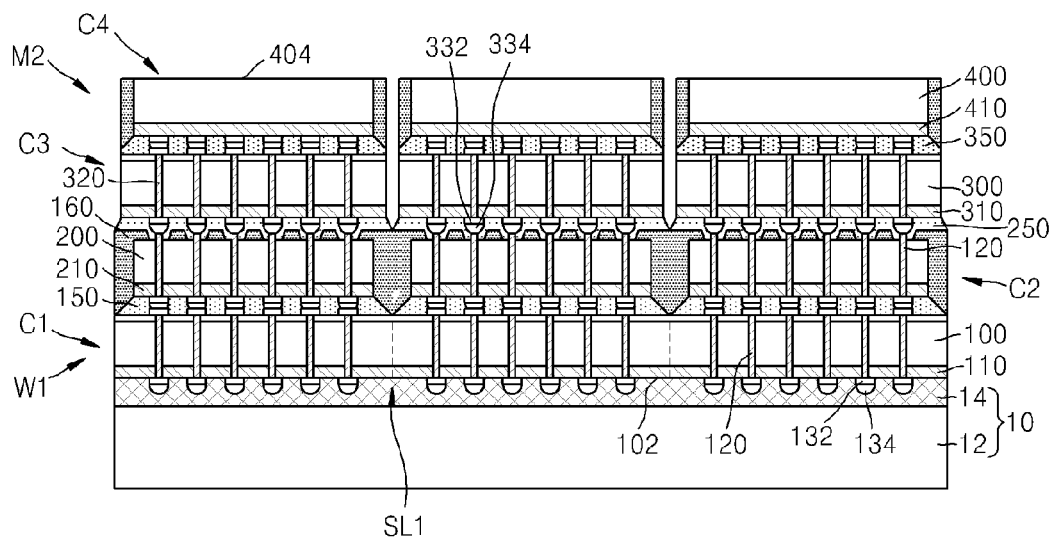
FIGS. 29 through 30 are cross-sectional views of a method of manufacturing a semiconductor package, according to another embodiment of the inventive concepts.
Figure 30:
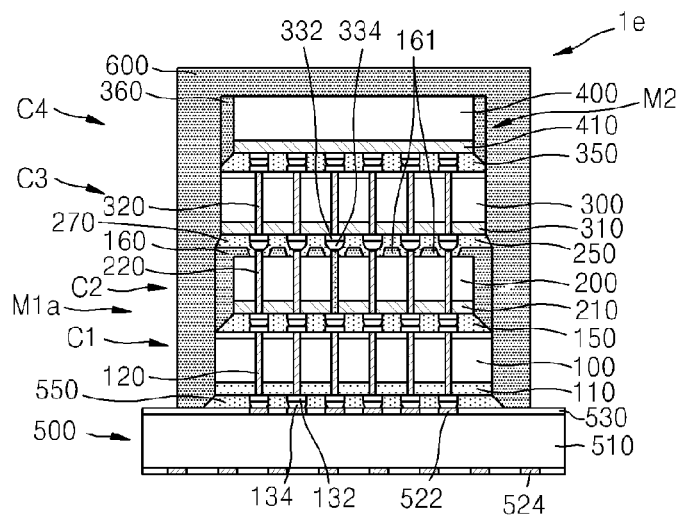

FIGS. 29 through 30 are cross-sectional views of a method of manufacturing a semiconductor package, according to another embodiment of the inventive concepts.

FIG. 29 is a cross-sectional view of an operation for forming a third under-fill layer 250 by using a capillary under-fill method, according to another embodiment of the inventive concepts. The operation shown in FIG. 29 is an operation performed subsequent to the operation shown in FIG. 25.

Referring to FIG. 29, the second stack structure M2 is stacked on the first semiconductor wafer W1 whereon the second semiconductor chips C2 are stacked, as shown in FIG. 25, and then the third under-fill layer 250 is formed between the second stack structure M2 and the second semiconductor chips C2. The third under-fill layer 250 may fill an entire space between the second stack structure M2 and the second semiconductor chips C2. The third under-fill layer 250 may be formed to entirely surround the third connecting bumps 334. The third under-fill layer 250 may be formed to have a horizontal cross-sectional width that increases from the second stack structure M2 toward the second semiconductor chip C2. The third under-fill layer 250 may be formed by using, for example, a capillary under-fill method. The third under-fill layer 250 may be formed of, for example, an epoxy resin. A filler may be added to the third under-fill layer 250. The filler may be formed of, for example, silica. The filler may have a size of, for example, 0.1 μm to several μm and may have an average size of about 0.3 to about 1 μm. The filler may be added to the first under-fill layer 150 by about 55 wt % to about 75 wt %. That is, a ratio of the filler to the first under-fill layer 150 may be about 55 wt % to about 75 wt %.

FIG. 30 is a cross-sectional view of a semiconductor package 1e according to another embodiment of the inventive concepts.

Referring to FIG. 30, the third under-fill layer 250 is formed between the second stack structure M2 and the second semiconductor chips C2 and then the first semiconductor wafer W1 is cut along the first scribe lane SL1 into first through fourth semiconductor chips C1, C2, C3, and C4 which correspond to each other. Thus, the second stack structure M2 including the third semiconductor chip C3 and the fourth semiconductor chip C4 which correspond to each other may be stacked on the first stack structure M1a including the first semiconductor chip C1 and the second semiconductor chip C2 which correspond to each other.

The first semiconductor wafer W1 may be cut by using a blade having a Kerf width that is smaller than an interval between adjacent second stack structures M2 such that the first semiconductor wafer W1 may be cut along a gap between the adjacent second stack structures M2 shown in FIG. 29. Thus, a horizontal cross-sectional width of the first stack structure M1a may be greater than that of the second stack structure M2 and a horizontal cross-sectional width of the first semiconductor chip C1 may be greater than that of the third semiconductor chip C3.

Then, the semiconductor package 1e is formed by mounting the first stack structure M1a whereon the second stack structure M2 is stacked, on the printed circuit board 500, and then forming the substrate mold layer 600 on the printed circuit board 500 to cover the first and second stack structures M1a and M2.

The semiconductor package 1e includes the first under-fill layer 150 between the first semiconductor chip C1 and the second semiconductor chip C2, the second under-fill layer 350 between the third semiconductor chip C3 and the fourth semiconductor chip C4, and the third under-fill layer 250 between the first stack structure M1a and the second stack structure M2, that is, between the second semiconductor chip C2 and the third semiconductor chip C3.

The first through third under-fill layers 150, 350, and 250 may include components having the same or similar physical properties. Horizontal cross-sectional widths of the first and second under-fill layers 150 and 350 may be smaller than those of lower semiconductor chips, that is, the first and third semiconductor chips C1 and C3, respectively. That is, maximum values of the horizontal cross-sectional widths of the first and second under-fill layers 150 and 350 may be horizontal cross-sectional widths of the lower semiconductor chips, that is, the first and third semiconductor chips C1 and C3, respectively. However, a maximum value of a horizontal cross-sectional width of the third under-fill layer 250 may be greater than a horizontal cross-sectional width of a lower semiconductor chip, that is, the second semiconductor chip C2. In addition, the first mold layer 160 that is one of the molding members 160, 360, and 600 may also be disposed between the third under-fill layer 250 and the second semiconductor chip C2. For example, in this embodiment, as well as many of the other embodiments described herein, portions 161 of the first mold layer 160 remain on corresponding portions of what is now the top surface of the second semiconductor chip C2, and before (see FIG. 7) was referred to the "lower surface". It can be seen in this example embodiments, and in other example embodiments, that the third under fill layer 250 is positioned between the portions 161 of the first mold layer 160 that lie on the second semiconductor chip C2 and the third semiconductor chip C3.

Figure 31:
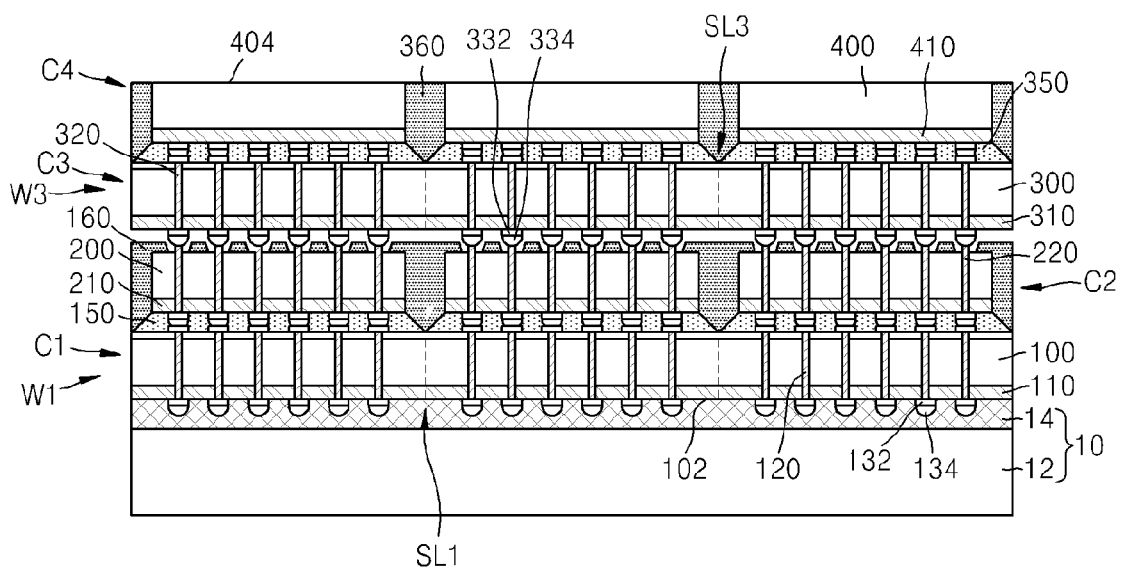
FIGS. 31 through 32 are cross-sectional views of a method of manufacturing a semiconductor package, according to another embodiment of the inventive concepts.
Figure 32:
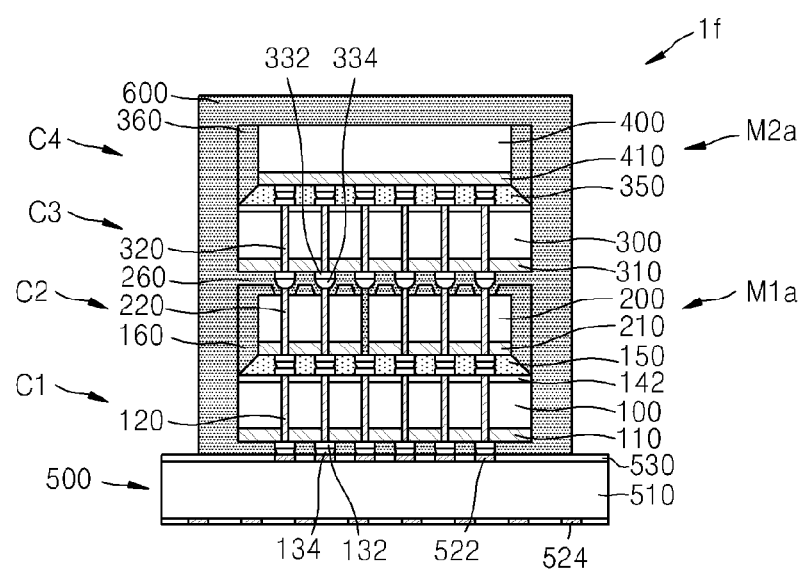

FIGS. 31 through 32 are cross-sectional views of a method of manufacturing a semiconductor package, according to another embodiment of the inventive concepts.

FIG. 31 is a cross-sectional view of an operation for stacking a second semiconductor wafer whereon the fourth semiconductor chips C4 are stacked, on the first semiconductor wafer W1 whereon the second semiconductor chips C2 are stacked, according to another embodiment of the inventive concepts. In detail, FIG. 31 shows an operation performed subsequent to the operation shown in FIGS. 1 through 15.

Referring to FIG. 31, the third semiconductor wafer W3 whereon the fourth semiconductor chips C4 are stacked may be stacked on the first semiconductor wafer W1 whereon the second semiconductor chips C2 are stacked. The third semiconductor wafer W3 whereon the fourth semiconductor chips C4 are stacked may be stacked on the first semiconductor wafer W1 such that the third connecting bumps 334 of the third semiconductor chip C3 may be connected to the second through-electrodes 220 of the second semiconductor chip C2, respectively.

The third semiconductor wafer W3 may be stacked on the first semiconductor wafer W1 such that the third scribe lanes SL3 may overlap the first scribe lanes SL1 of the first semiconductor wafer W1 in a perpendicular direction to the first carrier substrate 10.

FIG. 32 is a cross-sectional view of a semiconductor package 1f according to another embodiment of the inventive concepts.

Referring to FIGS. 31 and 32, the third semiconductor wafer W3 whereon the fourth semiconductor chip C4 is stacked may be stacked on the first semiconductor wafer W1 whereon the second semiconductor chip C2 is stacked, and then the first semiconductor wafer W1 and the third semiconductor wafer W3 may be cut along the first scribe lane SL1 and the third scribe lane SL3, respectively, into the first through fourth semiconductor chips C1, C2, C3, and C4 which correspond to each other. Thus, a second stack structure M2a including the third semiconductor chip C3 and the fourth semiconductor chip C4 which correspond to each other may be stacked on the first stack structure M1a including the first semiconductor chip C1 and the second semiconductor chip C2 which correspond to each other.

The first semiconductor wafer W1 and the third semiconductor wafer W3 may be cut by using a blade having a Kerf width that is smaller than an interval between adjacent fourth semiconductor chips C4 and an interval between adjacent second semiconductor chips C2 such that the first semiconductor wafer W1 and the third semiconductor wafer W3 may be cut along a gap between the adjacent fourth semiconductor chips C4 and a gap between the second semiconductor chips C2, shown in FIG. 31.

Thus, a horizontal cross-sectional width of the first semiconductor chip C1 may be greater than that of the second semiconductor chip C2. A horizontal cross-sectional width of the third semiconductor chip C3 may be greater than that of the fourth semiconductor chip C4. Thus, a horizontal cross-sectional width of the third semiconductor chip C3 may be greater than that of the second semiconductor chip C2. In addition, a horizontal cross-sectional width of the first semiconductor chip C1 may be the same as that of the third semiconductor chip C3.

Then, the semiconductor package 1f is formed by mounting the first stack structure M1a whereon the second stack structure M2a is stacked, on the printed circuit board 500, and then forming the substrate mold layer 600 on the printed circuit board 500 to cover the first and second stack structures M1a and M2a. A portion of the substrate mold layer 600 may operate as the third under-fill layer 260 filling in the space between the first stack structure M1a and the second stack structure M2a.

Figure 33:
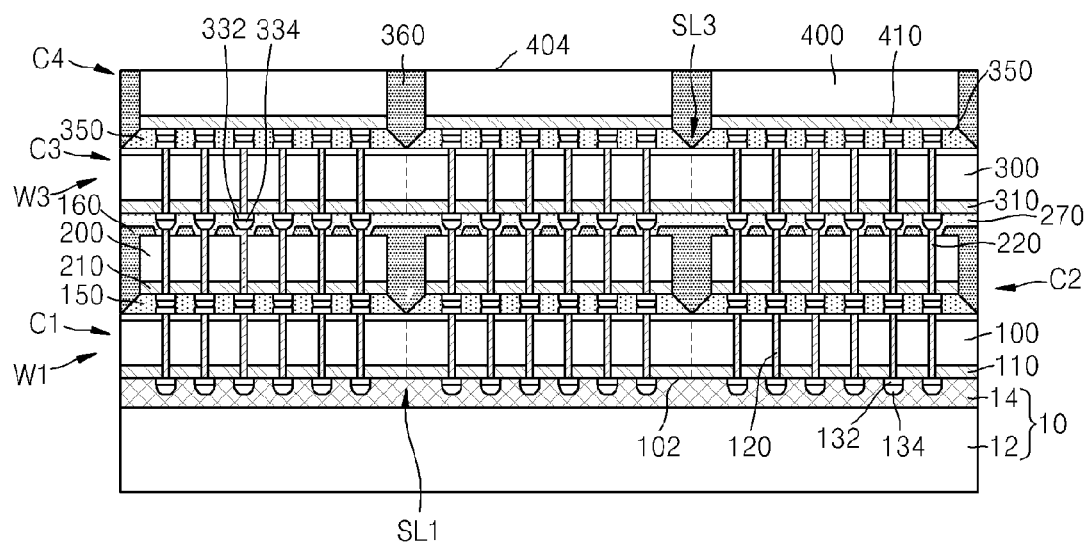
FIGS. 33 through 34 are cross-sectional views of a method of manufacturing a semiconductor package, according to another embodiment of the inventive concepts.
Figure 34:
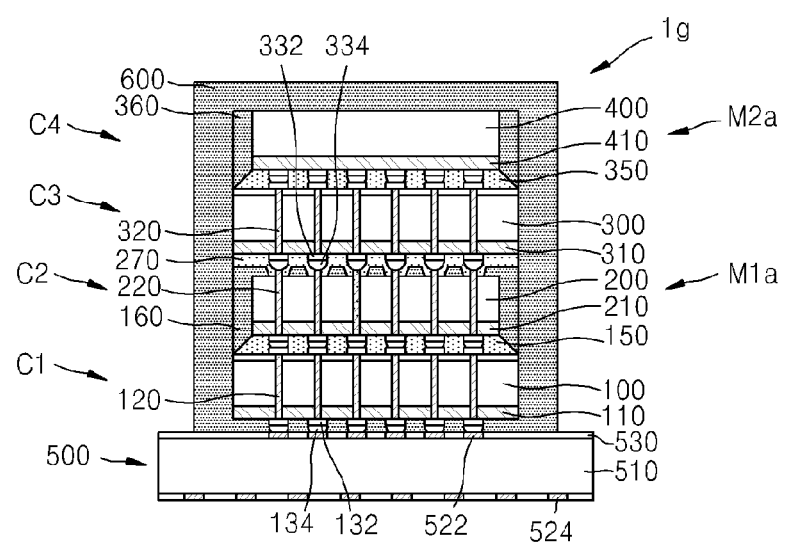

FIGS. 33 through 34 are cross-sectional views of a method of manufacturing a semiconductor package, according to another embodiment of the inventive concepts.

FIG. 33 is a cross-sectional view of an operation for stacking a second semiconductor wafer whereon the fourth semiconductor chips C4 are stacked, on the first semiconductor wafer W1 whereon the second semiconductor chips C2 are stacked, by using the third under-fill layer 270, according to another embodiment of the inventive concepts. FIG. 33 illustrates an operation performed subsequent to the operations shown in FIGS. 1 through 15 and 21.

Referring to FIG. 33, the fourth semiconductor chips C4 may be stacked on the first semiconductor wafer W1 whereon the second semiconductor chips C2 are stacked, and the third semiconductor wafer W3 whereon the third under-fill layer 270 is formed may be stacked on the first semiconductor wafer W1. When the fourth semiconductor chips C4 are stacked and the third semiconductor wafer W3 whereon the third under-fill layer 270 is formed is attached, a predetermined physical pressure may be applied such that the third connecting bumps 334 of the third wafer W3 may be connected to the second through-electrodes 220 of the second semiconductor chips of the second wafer, respectively. Due to the pressure, the third connecting bumps 334 and the second through-electrodes 220 may be connected to each other through the third under-fill layer 270. The third under-fill layer 270 may fill in a space between the second semiconductor chip C2 and the third semiconductor wafer W3.

FIG. 34 is a cross-sectional view of a semiconductor package 1g according to another embodiment of the inventive concepts.

Referring to FIGS. 33 and 34, the fourth semiconductor chip C4 may be stacked on the first semiconductor wafer W1 whereon the second semiconductor chip C2 is stacked, and then the first semiconductor wafer W1 and the third semiconductor wafer W3 may be cut along the first scribe lanes SL1 and the third scribe lanes SL3 into the first through fourth semiconductor chips C1, C2, C3, and C4 which correspond to each other. Thus, the second stack structure M2a including the third semiconductor chip C3 and the fourth semiconductor chip C4 which correspond to each other may be stacked on the first stack structure M1a including the first semiconductor chip C1 and the second semiconductor chip C2 which correspond to each other.

Then, the semiconductor package if is formed by mounting the first stack structure M1a whereon the second stack structure M2a is stacked, on the printed circuit board 500, and then forming the substrate mold layer 600 on the printed circuit board 500 to cover the first and second stack structures M1a and M2a. The third under-fill layer 270 may fill in a space between the first stack structure M1a and the second stack structure M2a.

Since the third under-fill layer 270 is cut together with the first and third semiconductor wafers W1 and W3, in this embodiment, a lateral surface of the third under-fill layer 270 will not protrude with respect to a lateral surface of the second stack structure M2, that is, a lateral surface of the third semiconductor chip C3.

FIGS. 35 through 40 are cross-sectional views of a method of manufacturing a semiconductor package, according to another embodiment of the inventive concepts.

Figure 35:
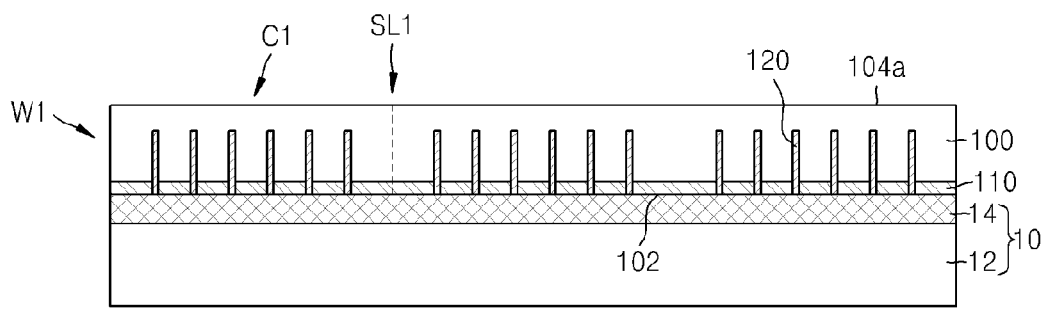
FIGS. 35 through 40 are cross-sectional views of a method of manufacturing a semiconductor package, according to another embodiment of the inventive concepts.

FIG. 35 is a cross-sectional view of an operation for attaching the first semiconductor wafer W1 to the first carrier substrate 10, according to another embodiment of the inventive concepts.

Referring to FIG. 35, the first semiconductor wafer W1 through which the first through-electrodes 120 are formed may be attached to the first carrier substrate 10. The first carrier substrate 10 may include the first support substrate 12 and the first adhesive material layer 14. The first semiconductor wafer W1 may be attached to the first carrier substrate 10 such that the first upper surface 102 may face the first carrier substrate 10. The first upper surface 102 may be adhered to the first adhesive material layer 14.

Unlike in the first semiconductor wafer W1 shown in FIG. 3, the first connecting pads 132 and/or the first connecting bumps 134 are not formed in the first semiconductor wafer W1 shown in FIG. 35.

Figure 36:
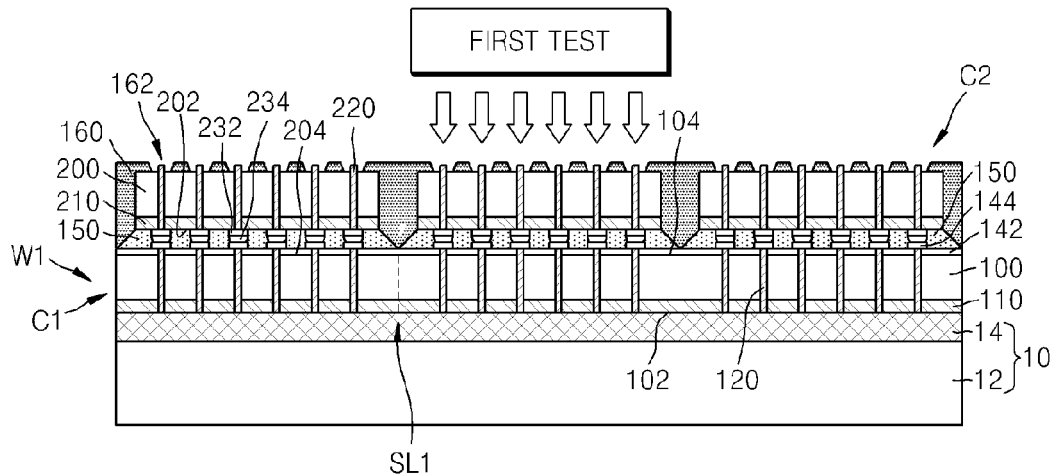

FIG. 36 is a cross-sectional view of an operation for performing a first test, according to another embodiment of the inventive concepts. In detail, FIG. 36 illustrates an operation performed subsequent to the operation shown in FIG. 35 and similar operations to the operations shown in FIGS. 4 through 11.

Referring to FIG. 36, the second semiconductor chips C2 are stacked on the first semiconductor wafer W1 including the first semiconductor chips C1 so as to respectively correspond to the first semiconductor chips C1. Then, the first test for determining whether failure of the first semiconductor chips C1 and the second semiconductor chips C2 occurs may be performed by using the second through-electrodes 220 that are exposed through the first holes 162 of the first mold layer 160.

Figure 37:
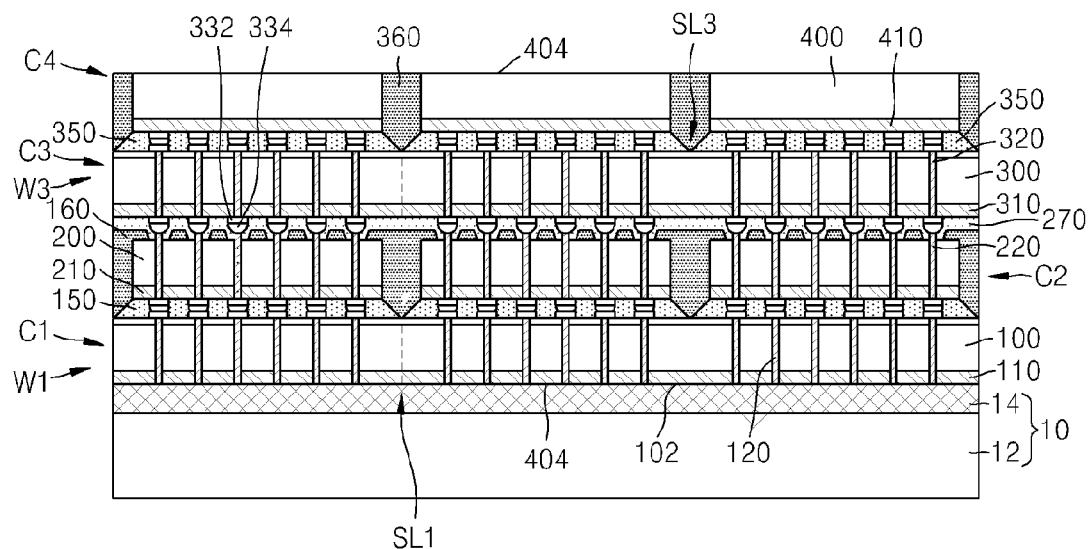

FIG. 37 is a cross-sectional view of an operation for stacking a second semiconductor wafer whereon the fourth semiconductor chip C4 is stacked, on the first semiconductor wafer W1 whereon the second semiconductor chips C2 are stacked, according to another embodiment of the inventive concepts.

Referring to FIG. 37, the fourth semiconductor chips C4 shown in FIG. 21 may be stacked on the first semiconductor wafer W1 whereon the second semiconductor chips C2 are stacked, and then the third semiconductor wafer W3 whereon the third under-fill layer 270 is formed may be stacked on the first semiconductor wafer W1. When the fourth semiconductor chips C4 are stacked and the third semiconductor wafer W3 whereon the third under-fill layer 270 is formed is attached, a predetermined physical pressure may be applied such that the third connecting bumps 334 may be connected to the second through-electrodes 220 of the second semiconductor chip C2. Due to the pressure, the third connecting bumps 334 and the second through-electrodes 220 may be connected to each other through the third under-fill layer 270. The third under-fill layer 270 may fill in spaces between the second semiconductor chips C2 and the third semiconductor wafer W3.

Figure 38:
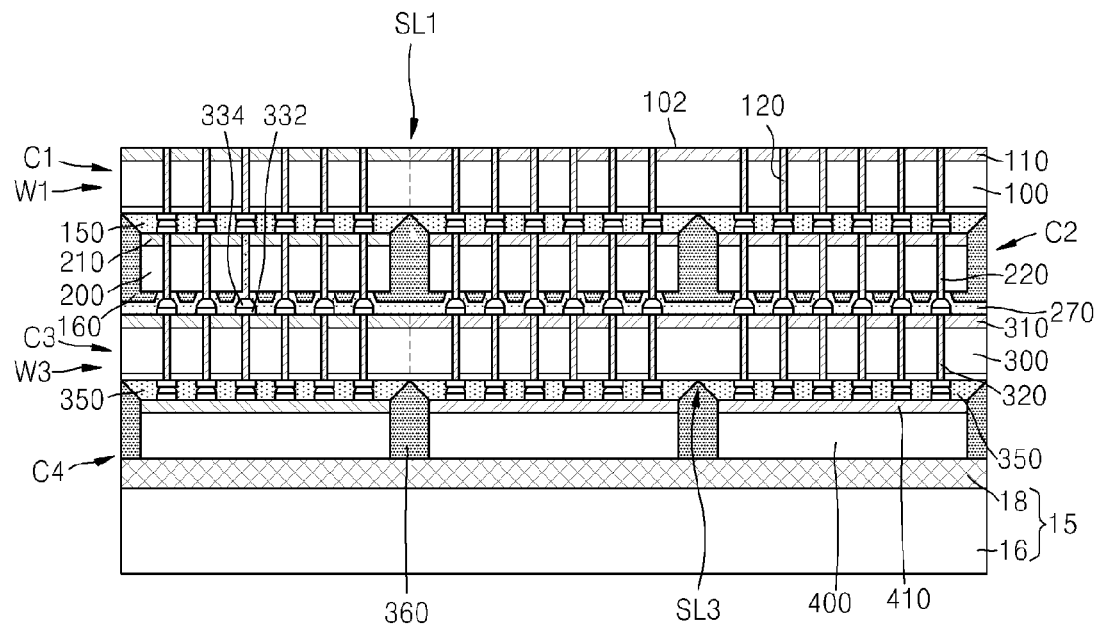

FIG. 38 is a cross-sectional view of an operation for attaching the resulting structure of FIG. 37 to a preliminary carrier substrate 15, according to another embodiment of the inventive concepts.

Referring to FIGS. 37 and 38, a structure obtained by removing the first carrier substrate 10 from the resulting structure of FIG. 37 is attached to the preliminary carrier substrate 15. The first semiconductor wafer W1 whereon the second semiconductor chips C2 are stacked, on which the fourth semiconductor chips C4 are stacked and the third semiconductor wafer W3 including the third under-fill layer 270 is stacked, are attached to the preliminary carrier substrate 15 such that the fourth lower surface 404 of the fourth semiconductor chip C4 may face the preliminary carrier substrate 15. Thus, the first upper surface 102 of the first semiconductor wafer W1 may be exposed.

Figure 39:
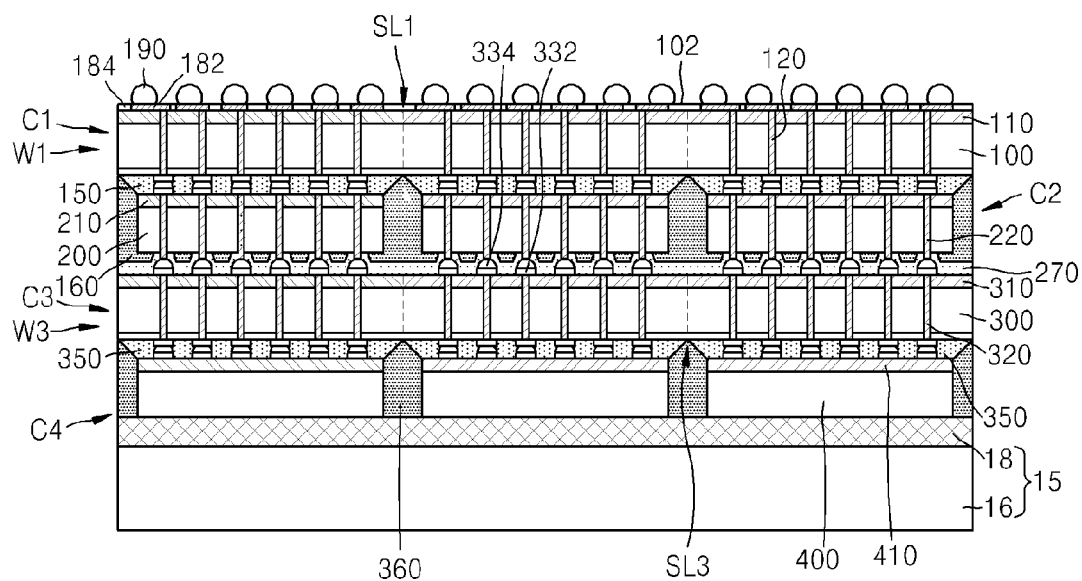

FIG. 39 is a cross-sectional view of an operation for forming external connecting bumps 190, according to another embodiment of the inventive concepts.

Referring to FIG. 39, a first upper protective layer 184 and a rewiring layer 182, which is exposed above the first upper protective layer 184 and is electrically connected to the first through-electrode 120, are formed on the first upper surface 102 of the first semiconductor wafer W1. Then, the external connecting bumps 190 for electrical connection to an external device are formed on the rewiring layer 182.

The first through-electrodes 120 may be formed in the first semiconductor chips C1, other than in regions where individual devices of the first semiconductor chips C1 are formed. Thus, the first through-electrodes 120 may be formed in a limited region of the first upper surface 102 of the first semiconductor chip C1. The rewiring layer 182 may electrically connect the first through-electrodes 120 and the external connecting bumps 190 to each other such that the external connecting bumps 190 may be attached to as wide as possible area of the first upper surface 102 of the first semiconductor chip C1.

Figure 40:
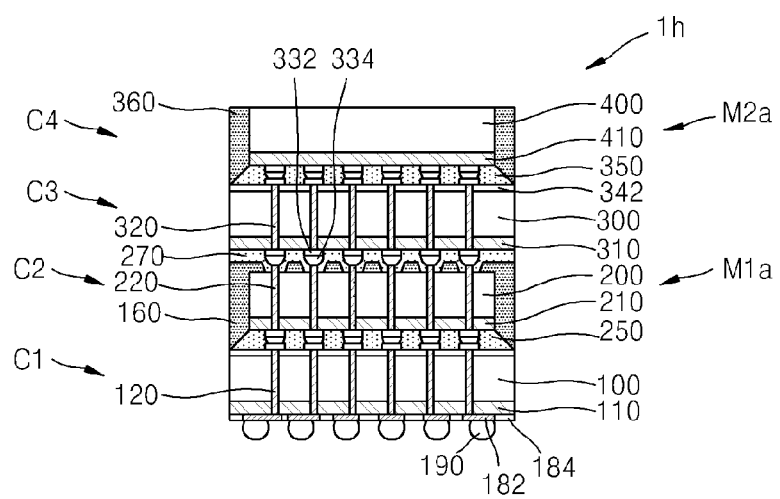

FIG. 40 is a cross-sectional view of a semiconductor package 1h according to another embodiment of the inventive concepts.

Referring to FIG. 40, the semiconductor package 1h is formed by attaching the external connecting bumps 190 and then cutting the first semiconductor wafer W1 and the third semiconductor wafer W3 along the first scribe lanes SL1 and the third scribe lanes SL3 into the first through fourth semiconductor chips C1, C2, C3, and C4 which correspond to each other.

The semiconductor package 1h may be a wafer-level package (WLP) in which the second stack structure M2a including the third semiconductor chip C3 and the fourth semiconductor chip C4 which correspond to each other is stacked on the first stack structure M1a including the first semiconductor chip C1 and the second semiconductor chip C2 which correspond to each other and further includes the external connecting bumps 190 that are electrically connected to the first through third through-electrodes 120, 220, and 320. Although not shown, an encapsulation layer may be further formed to surround a lateral surface of the semiconductor package 1h and lateral surfaces of the fourth semiconductor chips C4. The encapsulation layer may surround the lateral surface of the semiconductor package 1h, except for portions to which the external connecting bumps 190 are attached.

FIGS. 41 through 48 are cross-sectional views of a method of manufacturing a semiconductor package, according to another embodiment of the inventive concepts.

Figure 41:
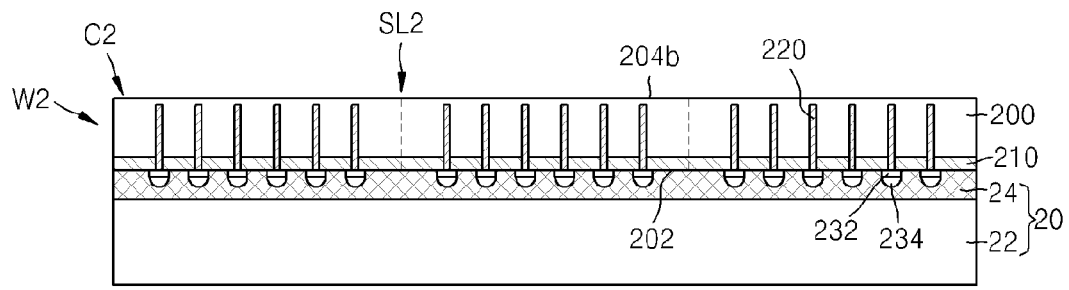
FIGS. 41 through 48 are cross-sectional views of a method of manufacturing a semiconductor package, according to another embodiment of the inventive concepts.

FIG. 41 is a cross-sectional view of an operation for attaching a second semiconductor wafer W2 to the second carrier substrate 20, according to another embodiment of the inventive concepts.

Referring to FIG. 41, the second semiconductor wafer W2 whereon the second connecting bumps 234 are formed may be attached to the second carrier substrate 20. The second semiconductor wafer W2 may be attached to the second carrier substrate 20 such that the second connecting bumps 234 may face the second carrier substrate 20. The second connecting bumps 234 may be surrounded by a second adhesive material layer 24.

The second semiconductor wafer W2 may include a plurality of second semiconductor chips C2 that are separated from each other by second scribe lanes SL2. A second semiconductor chip C2 includes the second semiconductor substrate 200, the second semiconductor device 210, and the second through-electrode 220. The second semiconductor substrate 200 may include the second upper surface 202 and a second lower surface 204b which are opposite each other. Like the first semiconductor wafer W1 shown in FIG. 3, the second semiconductor wafer W2 may include the second lower surface 204b above which the second through-electrodes 220 are not exposed and that is formed by preparing a relatively thick layer and then removing a portion of the second semiconductor substrate 200. However, the inventive concept is not limited to. That is, an operation of removing a portion of the second semiconductor substrate 200 may be omitted.

Figure 42:
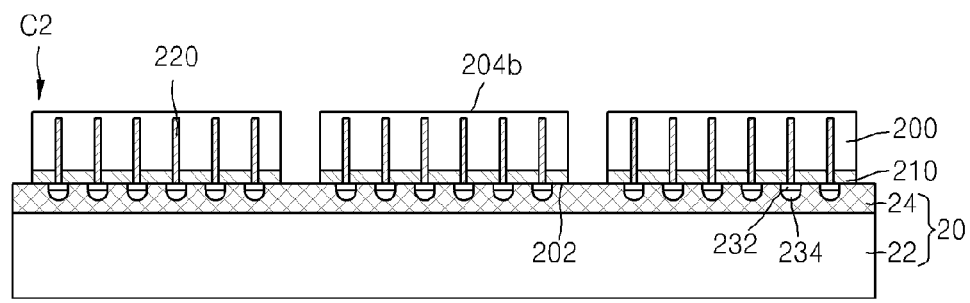

FIG. 42 is a cross-sectional view of an operation for preparing the second semiconductor chip C2, according to another embodiment of the inventive concepts.

Referring to FIGS. 41 and 42, the second semiconductor wafer W2 is cut along the second scribe lanes SL2 into a plurality of second semiconductor chips C2.

Figure 43:
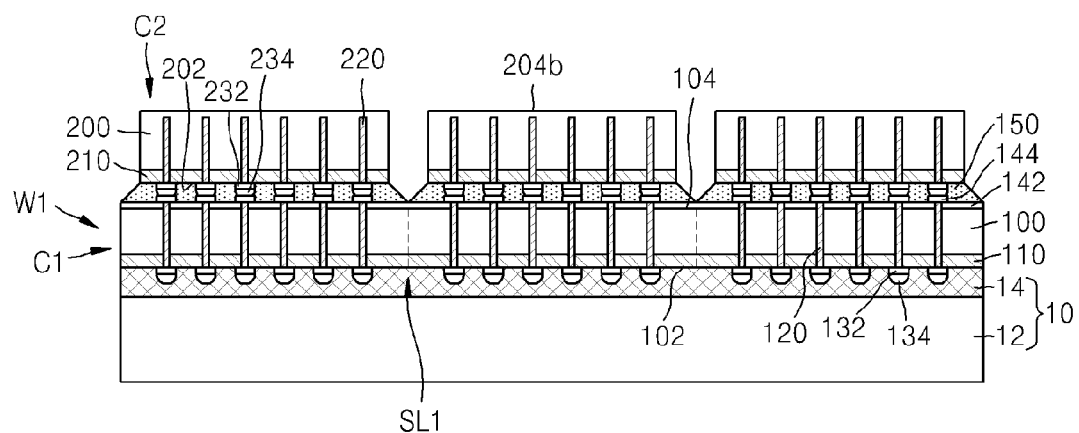

FIG. 43 is a cross-sectional view of an operation for stacking the second semiconductor chips C2 on the first semiconductor wafer W1, according to another embodiment of the inventive concepts.

Referring to FIG. 43, the second semiconductor chips C2 are separated from the second carrier substrate 20 shown in FIG. 42 and are stacked on the first semiconductor wafer W1 shown in FIG. 6. The plurality of second semiconductor chips C2 may be stacked on the first semiconductor wafer W1 so as to respectively correspond to the first semiconductor chips C1 included in the first semiconductor wafer W1. That is, the second semiconductor chips C2 may be stacked on the first semiconductor chips C1. Then, the first under-fill layer 150 may be formed between the first semiconductor chips C1 and the second semiconductor chips C2. The first under-fill layer 150 may be filed in an entire space between the first semiconductor chips C1 and the second semiconductor chips C2. The first under-fill layer 150 may be formed to entirely surround the second connecting bumps 234. The first under-fill layer 150 may be formed to cover portions of the second upper surface 202 of the second semiconductor chip C2, which are exposed by the second connecting bumps 234. The first under-fill layer 150 may have a horizontal cross-sectional width that increases from the second semiconductor chips C2 toward the first semiconductor chips C1. The first under-fill layer 150 may be formed using, for example, a capillary under-fill method.

Figure 44:
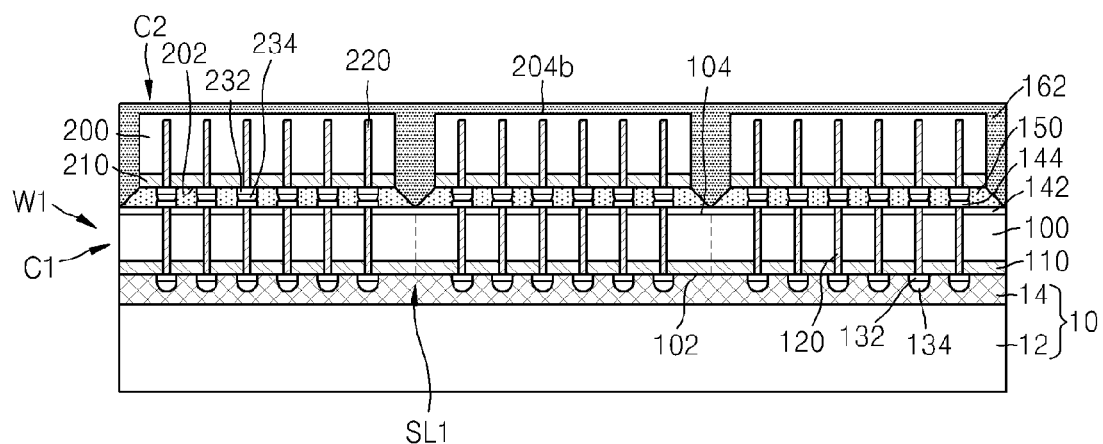

FIG. 44 is a cross-sectional view of an operation for forming a first mold layer 162, according to another embodiment of the inventive concepts.

Referring to FIG. 44, the first mold layer 162 is formed on the first semiconductor wafer W1 to cover the second semiconductor chips C2. The first mold layer 162 may be formed to cover the second lower surface 204b and lateral surfaces of the second semiconductor chip C2. The first mold layer 162 may be formed of, for example, epoxy mold compound (EMC).

Figure 45:
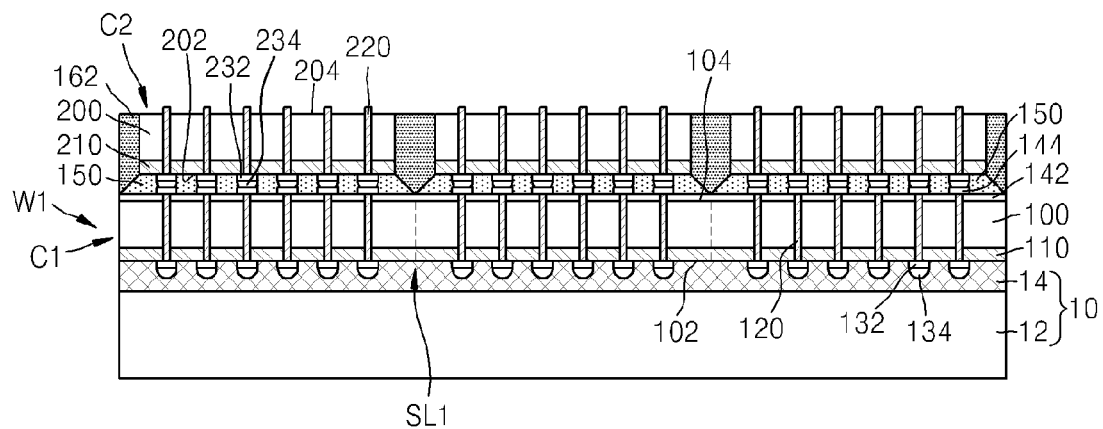

FIG. 45 is a cross-sectional view of an operation for exposing the second through-electrodes 220, according to another embodiment of the inventive concepts.

Referring to FIG. 45, the first mold layer 162 and the second semiconductor substrate 200 are partially removed to expose the second through-electrodes 220. The second through-electrodes 220 may be exposed above the second lower surface 204 of the second semiconductor substrate 200, which is partially removed. A portion of the second semiconductor substrate 200 and a portion of the first mold layer 162 may be removed such that the second through-electrode 220 may protrude with respect to the second lower surface 204. Since the second through-electrodes 220 are exposed above the second lower surface 204 of the second semiconductor substrate 200, the second through-electrodes 220 may be formed through the second semiconductor substrate 200.

In order to expose the second through-electrodes 220, a portion of the second semiconductor substrate 200 and a portion of the first mold layer 162 may be removed by using a chemical mechanical polishing (CMP) process, an etch-back process, a combination of these, or another suitable process.

The first mold layer 162 and the second semiconductor substrate 200 may be partially removed so as to expose the second through-electrodes 220, and thus, the first mold layer 162 may partially remain to fill in spaces between adjacent second semiconductor chips C2.

Figure 46:
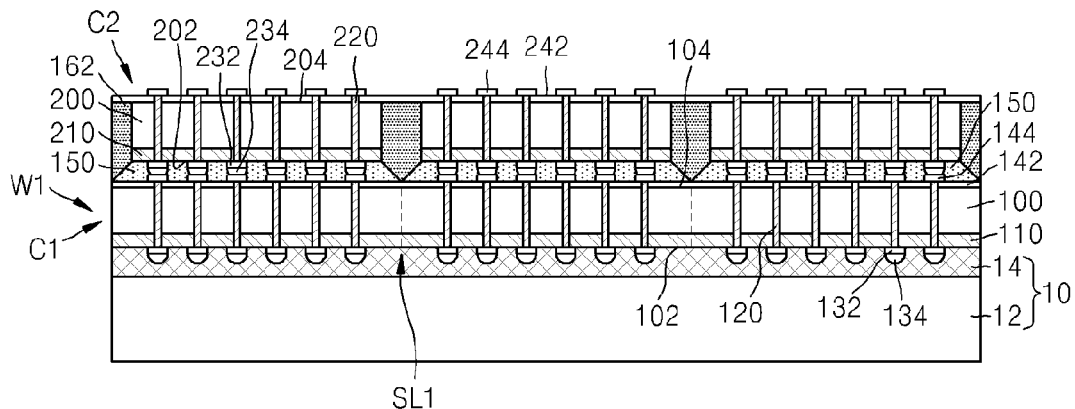

FIG. 46 is a cross-sectional view of an operation for forming second rear pads 244, according to another embodiment of the inventive concepts.

Referring to FIG. 46, a second rear protective layer 242 is formed to cover the second lower surface 204 that is an exposed surface of the second semiconductor chip C2 and to expose the second through-electrodes 220 therethrough. The second rear protective layer 242 may be formed by using, for example, a spin coating process or a spray process. The second rear protective layer 242 may be formed of, for example, an insulating polymer.

Then, the second rear pads 244 are formed to be electrically connected to the second through-electrodes 220 exposed above the second rear protective layer 242. The second rear pads 244 may be selectively omitted.

Then, the first test for determining whether failure of the first semiconductor chips C1 and the second semiconductor chips C2 shown in FIG. 15 occurs may be performed by using the second rear pads 244 or the second through-electrodes 220.

Figure 47:
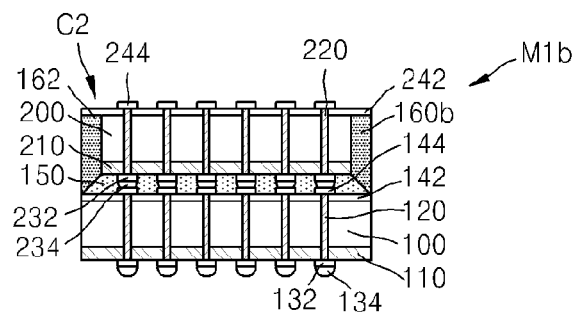

FIG. 47 is a cross-sectional view of an operation for forming a first stack structure M1b, according to another embodiment of the inventive concepts.

Referring to FIGS. 46 and 47, the first semiconductor wafer W1 is cut along the first scribe lanes SL1 into the first stack structures M1b including the first semiconductor chips C1 and the second semiconductor chips C2 which correspond to each other.

Figure 48:
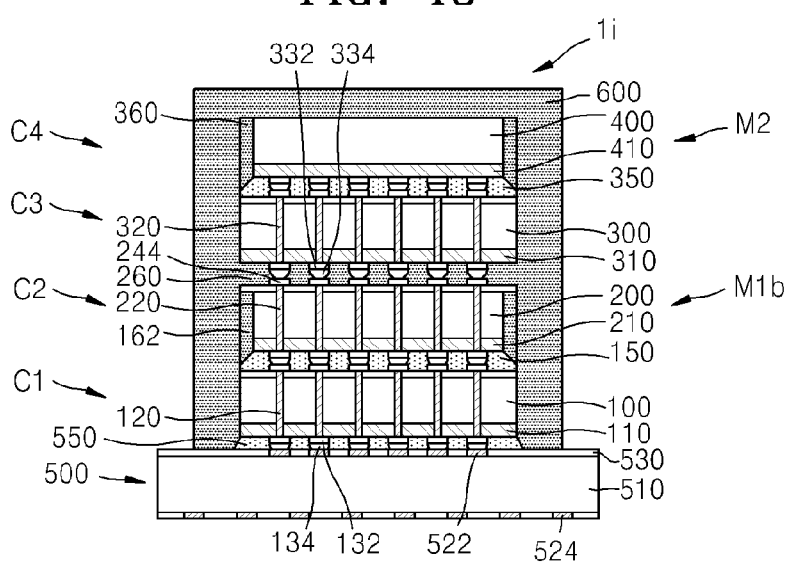

FIG. 48 is a cross-sectional view of a semiconductor package 1i according to another embodiment of the inventive concepts.

Referring to FIG. 48, the semiconductor package 1i is formed by using the first stack structure M1b shown in FIG. 47 and the second stack structure M2 shown in FIG. 17. In order to form the semiconductor package 1i, similar operations to the operations shown in FIGS. 18 through 20 may be performed.

That is, the first stack structure M1b is mounted on the printed circuit board 500 and then the second stack structure M2 is attached to the first stack structure M1b. Then, the semiconductor package 1i is formed by forming the substrate mold layer 600 on the printed circuit board 500 so as to cover the first stack structure M1b and the second stack structure M2.

A portion of the substrate mold layer 600 may operate as the third under-fill layer 260 that is filled between the first stack structure M1b and the second stack structure M2.

Figure 49:
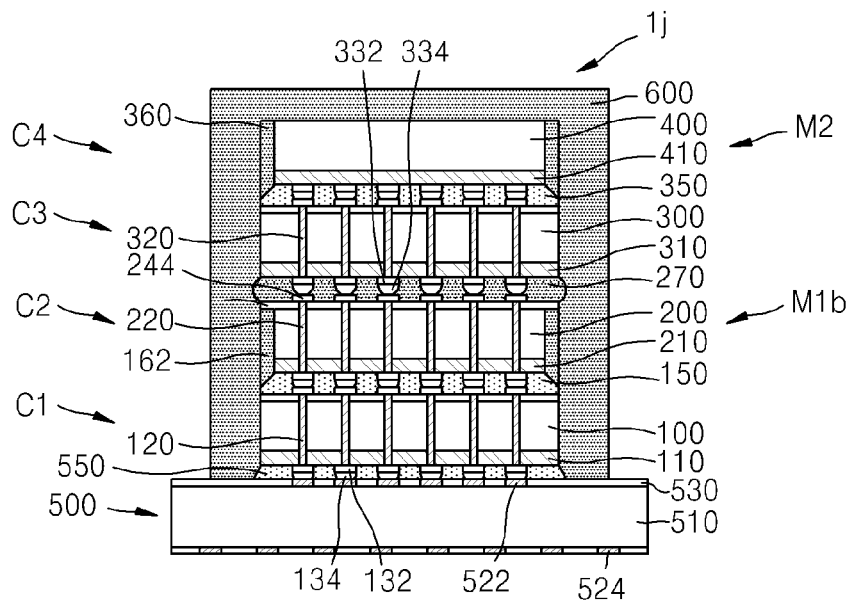
FIG. 49 is a cross-sectional view of a semiconductor package according to an embodiment of the inventive concepts.

FIG. 49 is a cross-sectional view of a semiconductor package 1j according to an embodiment of the inventive concepts.

Referring to FIG. 49, similarly to FIGS. 21 through 24, the semiconductor package 1j is formed by stacking the second stack structure M2 on the first stack structure M1b across the third under-fill layer 270 and forming the substrate mold layer 600.

A lateral surface of the third under-fill layer 270 may protrude with respect to a lateral surface of the second stack structure M2, that is, a lateral surface of the third semiconductor chip C3 due to the pressure applied during the attachment of the second stack structure M2.

Figure 50:
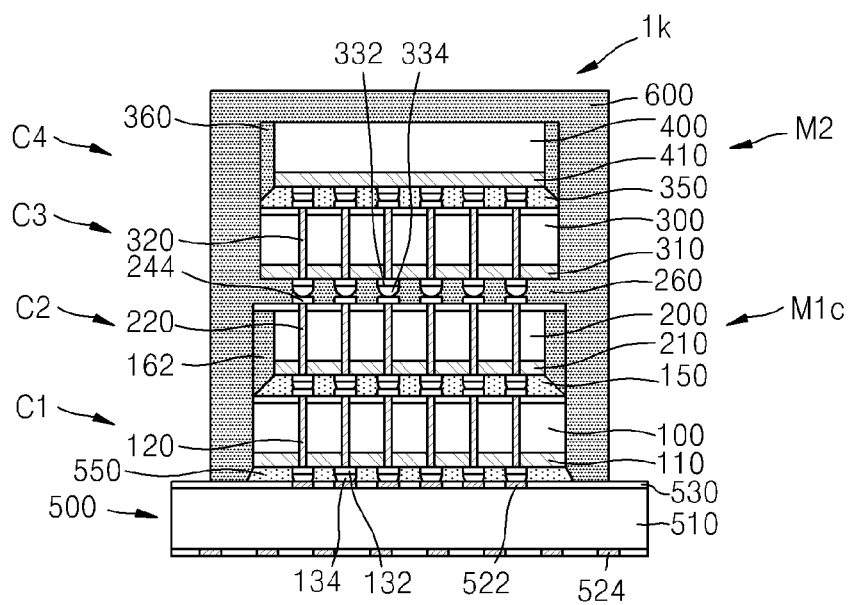
FIG. 50 is a cross-sectional view of a semiconductor package according to another embodiment of the inventive concepts.

FIG. 50 is a cross-sectional view of a semiconductor package 1k according to another embodiment of the inventive concepts.

Referring to FIG. 50, similarly to FIGS. 25 and 26, the second stack structure M2 may be stacked on the first semiconductor wafer W1 whereon the second semiconductor chip C2 shown in FIG. 46 is stacked, and then the first semiconductor wafer W1 is cut along the first scribe lanes SL1 into a first stack structure M1c and the second stack structure M2 which correspond to each other. Then, the semiconductor package 1k is formed by attaching the first stack structure M1c and the second stack structure M2 which correspond to each other to the printed circuit board 500 and forming the substrate mold layer 600.

Figure 51:
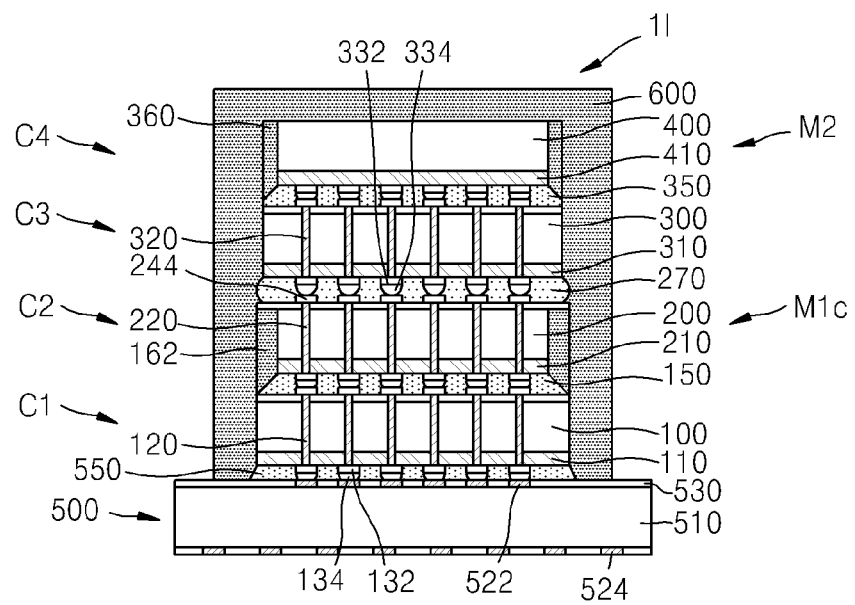
FIG. 51 is a cross-sectional view of a semiconductor package according to another embodiment of the inventive concepts.

FIG. 51 is a cross-sectional view of a semiconductor package 1l according to another embodiment of the inventive concepts.

Referring to FIG. 51, similarly to FIGS. 27 and 28, the second stack structure M2 whereon the third under-fill layer 270 is formed may be stacked on the first semiconductor wafer W1 whereon the second semiconductor chip C2 shown in FIG. 46 is stacked, and then the first semiconductor wafer W1 may be cut along the first scribe lanes SL1 into the first stack structures M1c and the second stack structures M2 which correspond to each other. Then, the semiconductor package 1l is formed by attaching the first stack structure M1c and the second stack structure M2 which correspond to each other to the printed circuit board 500 and forming the substrate mold layer 600.

The third under-fill layer 270 may fill in a space between the first stack structure M1c and the second stack structure M2. A lateral surface of the third under-fill layer 270 may protrude with respect to a lateral surface of the second stack structure M2, that is, a lateral surface of the third semiconductor chip C3 due to the pressure applied during the attachment of the second stack structure M2.

Figure 52:
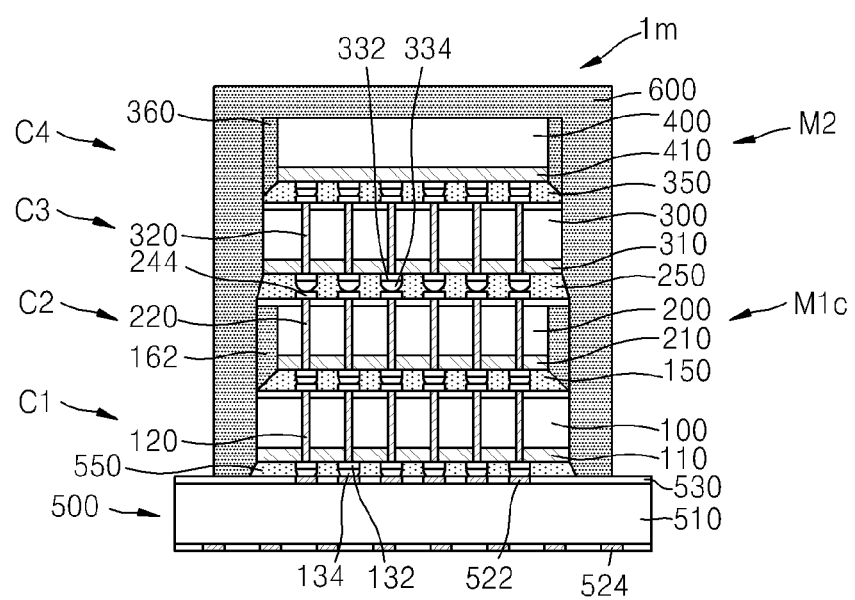
FIG. 52 is a cross-sectional view of a semiconductor package according to another embodiment of the inventive concepts.

FIG. 52 is a cross-sectional view of a semiconductor package 1m according to another embodiment of the inventive concepts.

Referring to FIG. 52, similarly to FIGS. 29 and 30, the second stack structure M2 may be stacked on the first semiconductor wafer W1 whereon the second semiconductor chip C2 shown in FIG. 46 is stacked, and then the third under-fill layer 250 may be formed to fill between the second semiconductor chip C2 and the second stack structure M2. Then, the semiconductor package 1m is formed by cutting the first semiconductor wafer W1 along the first scribe lanes SL1 into the first stack structures M1c and the second stack structures M2 which correspond to each other, attaching the first stack structures M1c and the second stack structures M2 to the printed circuit board 500, and forming the substrate mold layer 600.

Figure 53:
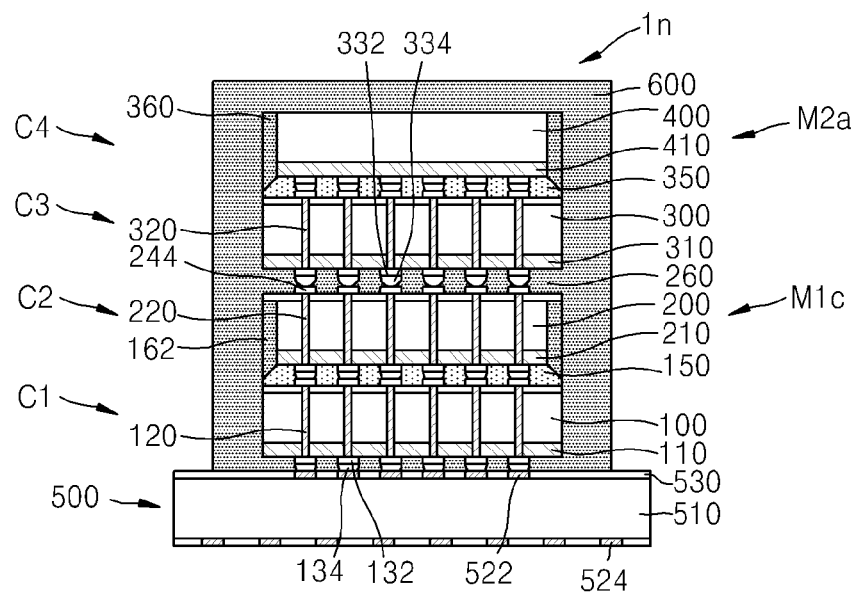
FIG. 53 is a cross-sectional view of a semiconductor package according to another embodiment of the inventive concepts.

FIG. 53 is a cross-sectional view of a semiconductor package In according to another embodiment of the inventive concepts.

Referring to FIG. 53, similarly to FIGS. 31 and 32, the third semiconductor wafer W3 whereon the fourth semiconductor chips C4 are stacked may be stacked on the first semiconductor wafer W1 whereon the second semiconductor chips C2 shown in FIG. 46 are stacked. Then, the semiconductor package 1n is formed by cutting the first and third semiconductor wafers W1 and W3 along the first and third scribe lanes SL1 and SL3 into the first stack structures M1c and the second stack structures M2a which correspond to each other, attaching the first stack structures M1c and the second stack structures M2a to the printed circuit board 500, and forming the substrate mold layer 600.

Figure 54:
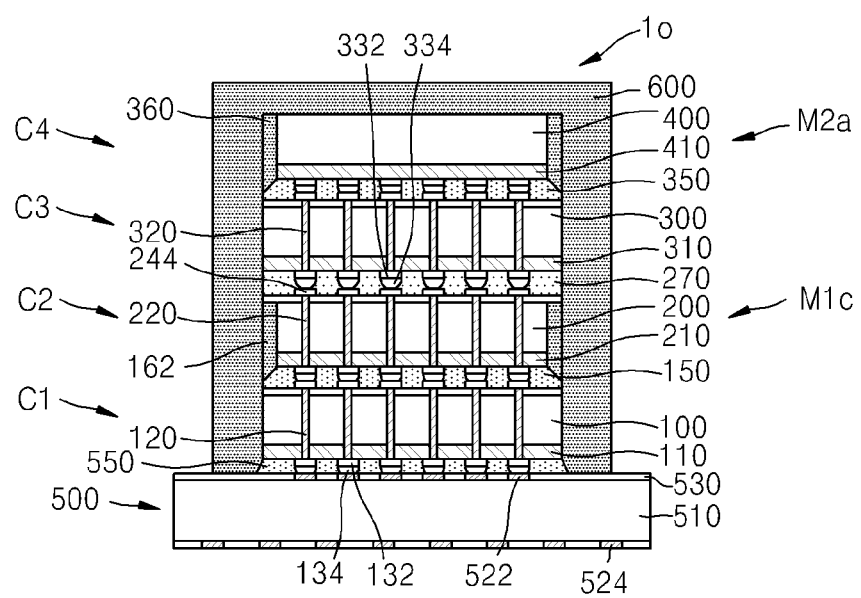
FIG. 54 is a cross-sectional view of a semiconductor package according to another embodiment of the inventive concepts.

FIG. 54 is a cross-sectional view of a semiconductor package 1o according to another embodiment of the inventive concepts.

Referring to FIG. 54, similarly to FIGS. 33 and 34, the third semiconductor wafer W3 whereon the fourth semiconductor chips C4 are stacked may be stacked on the first semiconductor wafer W1 whereon the second semiconductor chips C2 shown in FIG. 46 are stacked. Then, the semiconductor package 1o is formed by cutting the first and third semiconductor wafers W1 and W3 along the first and third scribe lanes SL1 and SL3 into the first stack structures M1c and the second stack structures M2a which correspond to each other, attaching the first stack structures M1c and the second stack structures M2a to the printed circuit board 500, and forming the substrate mold layer 600.

Since the third under-fill layer 270 is cut together with the first and third semiconductor wafers W1 and W3, a lateral surface of the third under-fill layer 270 does not protrude with respect to a lateral surface of the second stack structure M2, that is, a lateral surface of the third semiconductor chips C3.

Figure 55:
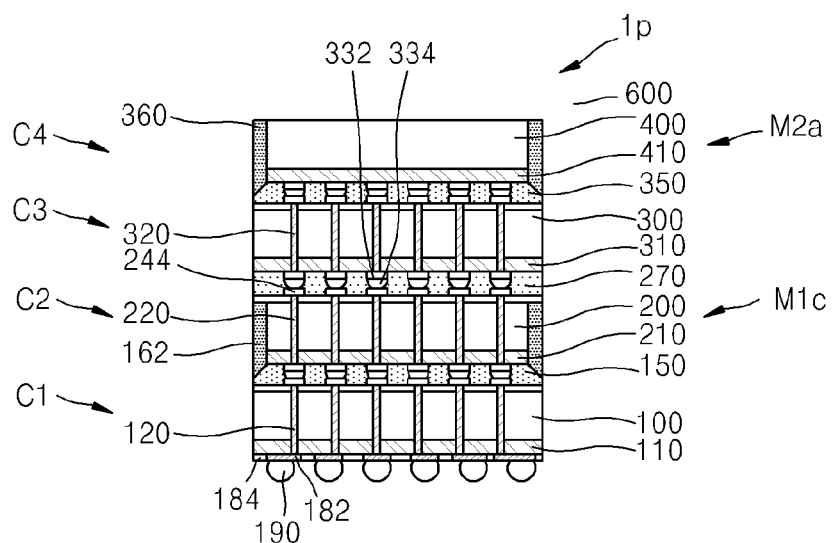
FIG. 55 is a cross-sectional view of a semiconductor package according to another embodiment of the inventive concepts.

FIG. 55 is a cross-sectional view of a semiconductor package 1p according to another embodiment of the inventive concepts.

Referring to FIG. 55, similarly to FIGS. 37 through 40, the third semiconductor wafer W3 whereon the fourth semiconductor chips C4 are stacked may be stacked on the first semiconductor wafer W1 whereon the second semiconductor chips C2 shown in FIG. 46 are stacked. Then, the semiconductor package ip is formed by forming the rewiring layer 182 and the external connecting bumps 190 and then cutting the first semiconductor wafer W1 and the third semiconductor wafer W3 along the first scribe lanes SL1 and the third scribe lanes SL2.

Since the third under-fill layer 270 is cut together with the first and third semiconductor wafers W1 and W3, a lateral surface of the third under-fill layer 270 does not protrude with respect to a lateral surface of the second stack structure M2, that is, a lateral surface of the third semiconductor chip C3.

The semiconductor packages 1i, 1j, 1k, 1l, 1m, 1n, 1o, and 1p shown in FIGS. 48 through 55 may be formed by using the same methods of manufacturing the semiconductor packages 1a, 1b, 1c, 1d, 1e, 1f, 1g, and 1h shown in FIGS. 20, 24, 26, 28, 30, 32, 34, and 40, except for a method of exposing the second through-electrodes 220 of the second semiconductor chip C2 (that is, the method shown in FIGS. 41 through 46 is used instead of the methods shown in FIGS. 7 through 12). Thus, a repeated explanation thereof will not be given.

FIGS. 56 through 61 are cross-sectional views of a method of manufacturing a semiconductor package, according to another embodiment of the inventive concepts.

Figure 56:
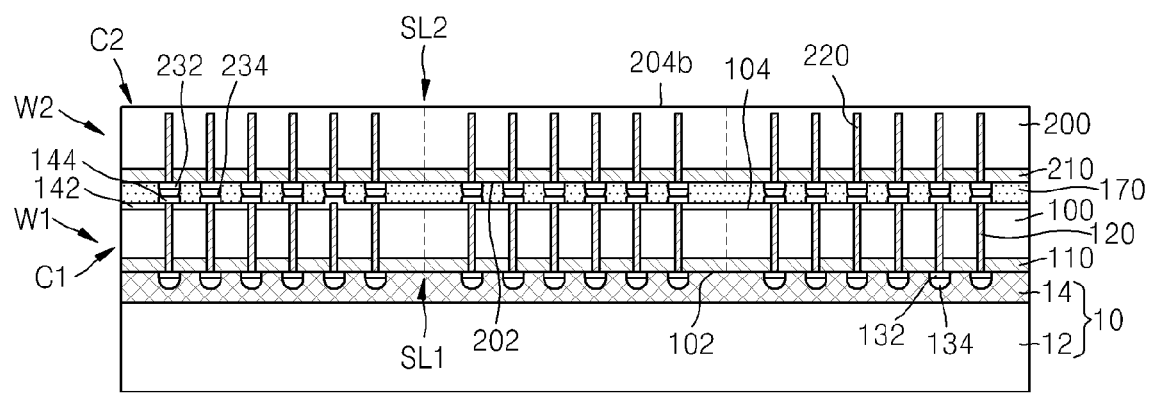
FIGS. 56 through 61 are cross-sectional views of a method of manufacturing a semiconductor package, according to another embodiment of the inventive concepts.

FIG. 56 is a cross-sectional view of an operation for stacking the second semiconductor wafer W2 on the first semiconductor wafer W1, according to another embodiment of the inventive concepts.

Referring to FIG. 56, the second semiconductor wafer W2 shown in FIG. 41 is stacked on the first semiconductor wafer W1 shown in FIG. 6 across a first under-fill layer 170. The second semiconductor wafer W2 is stacked on the first semiconductor wafer W1 across the first under-fill layer 170 such that the second connecting bumps 234 of the second semiconductor chip C2 included in the second semiconductor wafer W2 may contact the first lower pads 144 or the first through-electrodes 120 included in the first semiconductor wafer W1 to electrically connect the first through-electrodes 120 and the second through-electrodes 220 to each other.

In some embodiments, the first under-fill layer 170 may have the same or similar physical property as that of the third under-fill layer 270 shown in FIG. 21. In other embodiments, the first under-fill layer 170 may have a different physical property to that of the third under-fill layer 270 shown in FIG. 21.

The second semiconductor wafer W2 may be stacked on the first semiconductor wafer W1 such that the second scribe lanes SL2 may overlap the first scribe lanes SL1 of the first semiconductor wafer W1 in a perpendicular direction to the first carrier substrate 10.

Figure 57:
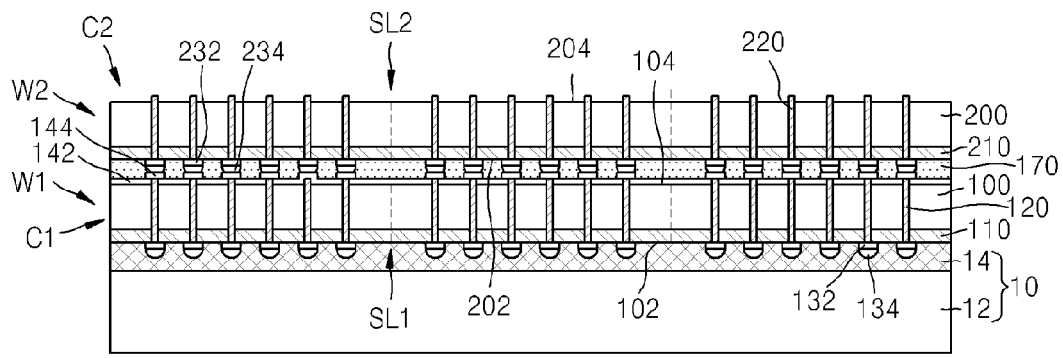

FIG. 57 is a cross-sectional view of an operation for exposing the second through-electrode 220, according to another embodiment of the inventive concepts.

Referring to FIG. 57, a portion of the second semiconductor substrate 200 is removed to expose the second through-electrodes 220. The second through-electrodes 220 may be exposed above the second lower surface 204 of the second semiconductor substrate 200 that is partially removed.

In order to expose the second through-electrode 220, a portion of the second semiconductor substrate 200 may be removed by using a chemical mechanical polishing (CMP) process, an etch-back process, or a combination these.

Figure 58:
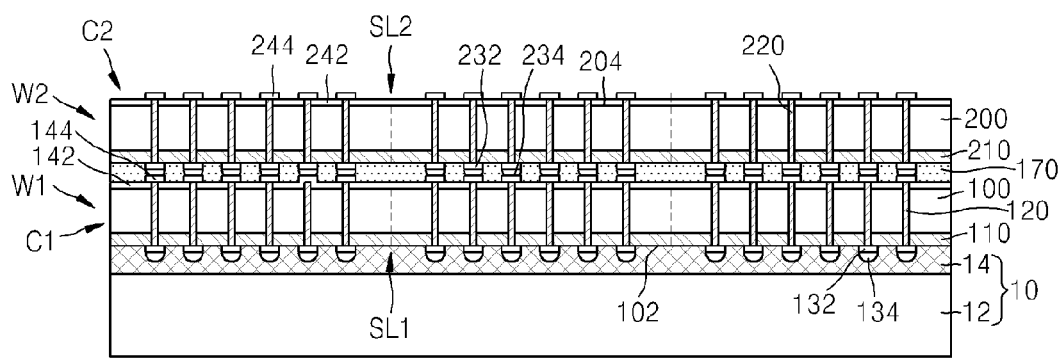

FIG. 58 is a cross-sectional view of an operation for forming the second rear pads 244, according to another embodiment of the inventive concepts.

Referring to FIG. 58, the second rear protective layer 242 is formed to cover the second lower surface 204 that is an exposed surface of the second semiconductor chip C2 and to expose the second through-electrodes 220. The second rear protective layer 242 may be formed by using, for example, a spin coating process or a spray process. The second rear protective layer 242 may be formed of, for example, an insulating polymer.

Then, the second rear pads 244 are formed to be electrically connected to the second through-electrode 220 exposed above the second rear protective layer 242. The second rear pads 244 may be selectively omitted.

Then, the first test for determining whether failure of the first semiconductor chip C1 and the second semiconductor chip C2 shown in FIG. 15 occurs may be performed by using the second rear pads 244 or the second through-electrode 220.

Figure 59:
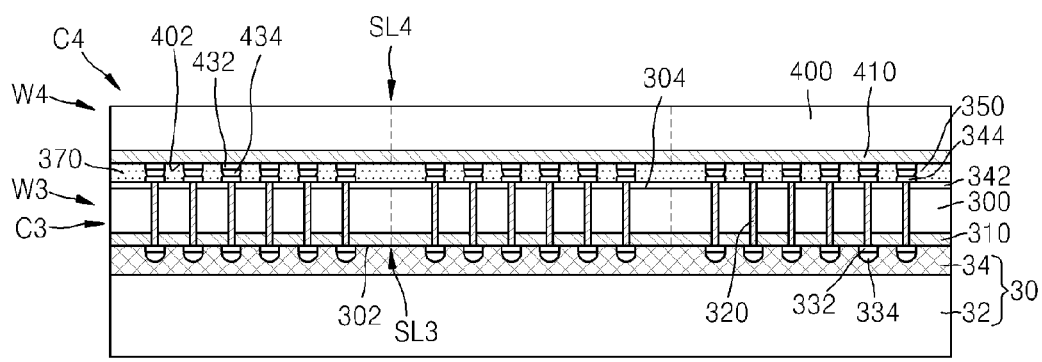

FIG. 59 is a cross-sectional view of an operation for stacking a fourth semiconductor wafer W4 on the third semiconductor wafer W3, according to another embodiment of the inventive concepts.

Referring to FIG. 59, the fourth semiconductor wafer W4 is stacked on the third semiconductor wafer W3 across a second under-fill layer 370. The fourth semiconductor wafer W4 is stacked on the third semiconductor wafer W3 across the second under-fill layer 370 such that the fourth connecting bumps 434 of the fourth semiconductor chips C4 included in the fourth semiconductor wafer W4 may contact third lower pads 344 or the third through-electrodes 320 included in the third semiconductor wafer W3 to electrically connect third through-electrodes 120 and the fourth semiconductor chips C4 to each other. The second under-fill layer 370 may have the same or similar physical property as that of the third under-fill layer 270 shown in FIG. 21.

The fourth semiconductor wafer W4 may be stacked on the third semiconductor wafer W3 such that fourth scribe lanes SL4 may overlap the third scribe lanes SL3 of the third semiconductor wafer W3 in a perpendicular direction to the third carrier substrate 30.

The fourth semiconductor wafer W4 may be a structure from which the fourth semiconductor chips C4 shown in FIG. 13 are not separated.

Figure 60:
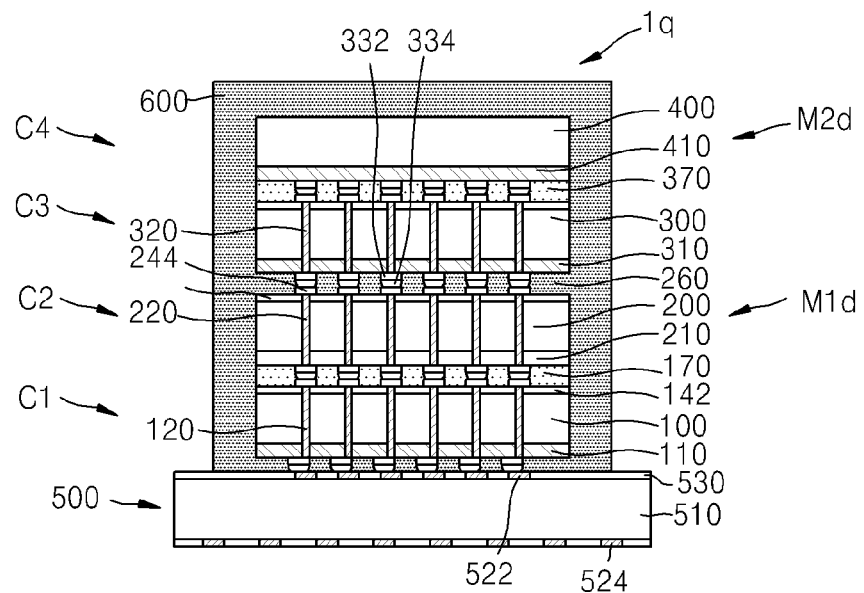

FIG. 60 is a cross-sectional view of a semiconductor package 1q according to another embodiment of the inventive concepts.

Referring to FIGS. 59 and 60, the third semiconductor wafer W3 whereon the fourth semiconductor wafer W4 is stacked may be stacked on the first semiconductor wafer W1 whereon the second semiconductor wafer W2 is stacked, and then the first through fourth semiconductor wafers W1, W2, W3, and W4 may be cut along the first through fourth scribe lanes SL1, SL2, SL3, and SL4 into first through fourth semiconductor chips C1, C2, C3, and C4 which correspond to each other. Thus, a second stack structure M2d including the third semiconductor chips C3 and the fourth semiconductor chips C4 which correspond to each other may be stacked on a first stack structure M1d including the first semiconductor chip C1 and the second semiconductor chip C2 which correspond to each other. Thus, the first through fourth semiconductor chips C1, C2, C3, and C4 may have the same horizontal cross-sectional width.

Then, the semiconductor package 1q is formed by mounting the first stack structure M1d whereon the second stack structure M2d is stacked and then forming the substrate mold layer 600 on the printed circuit board 500 to cover the first and second stack structures M1d and M2d. A portion of the substrate mold layer 600 may act as the third under-fill layer 260 filled between the first stack structure M1d and the second stack structure M2d.

Figure 61:
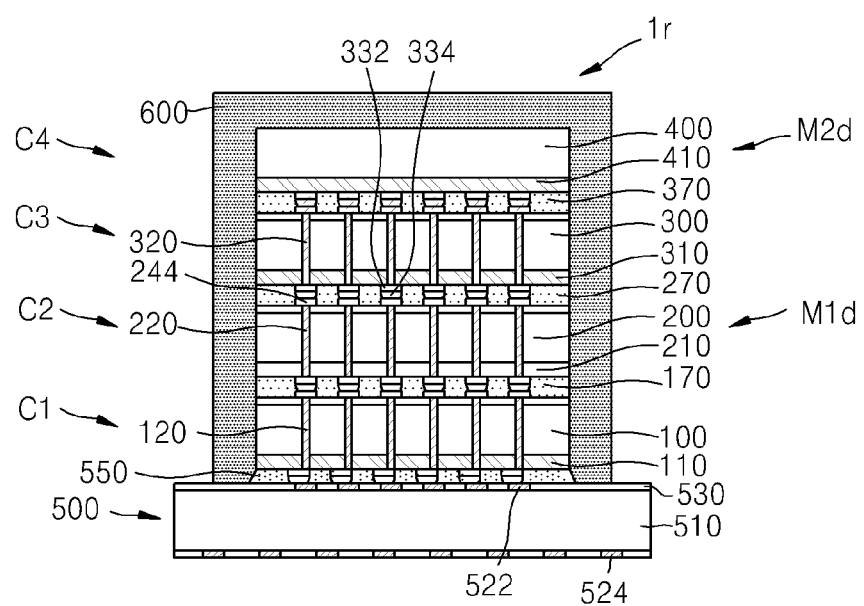

FIG. 61 is a cross-sectional view of a semiconductor package 1r according to another embodiment of the inventive concepts.

Referring to FIG. 61, the fourth semiconductor wafer W4 is stacked on the first semiconductor wafer W1 whereon the second semiconductor wafer W2 is stacked. Then, similarly to FIG. 33, the third semiconductor wafer W3 whereon the third under-fill layer 270 is formed may be stacked on the first semiconductor wafer W1. When the fourth semiconductor wafer W4 is stacked and the third semiconductor wafer W3 whereon the third under-fill layer 270 is formed is attached, a predetermined pressure may be applied such that the third connecting bumps 334 may be connected to the second through-electrodes 220 of the second semiconductor chip C2. Due to the pressure, the third connecting bumps 334 may be connected to the second through-electrodes 220 through the third under-fill layer 270. The third under-fill layer 270 may fill in a space between the second semiconductor wafer W2 and the third semiconductor wafer W3.

Then, the first through fourth semiconductor wafers W1, W2, W3, and W4 are cut along the first through fourth scribe lanes SL1, SL2, SL3, and SL4 into the first through fourth semiconductor chips C1, C2, C3, and C4 which correspond to each other. Thus, the second stack structure M2d including the third semiconductor chips C3 and the fourth semiconductor chips C4 which correspond to each other may be stacked on the first stack structure M1d including the first semiconductor chip C1 and the second semiconductor chip C2 which correspond to each other.

Since the third under-fill layer 270 is cut together with the first through fourth semiconductor wafers W1, W2, W3, and W4, a lateral surface of the third under-fill layer 270 does not protrude with respect to a lateral surface of the second stack structure M2, that is, a lateral surface of the third semiconductor chip C3.

Then, the semiconductor package 1r is formed by mounting the first stack structure M1d whereon the second stack structure M2d is stacked, on the printed circuit board 500, and then forming the substrate mold layer 600 on the printed circuit board 500 to cover the first and second stack structures M1d and M2d. The third under-fill layer 270 may fill in a space between the first stack structure M1d and the second stack structure M2d.

Figure 62:
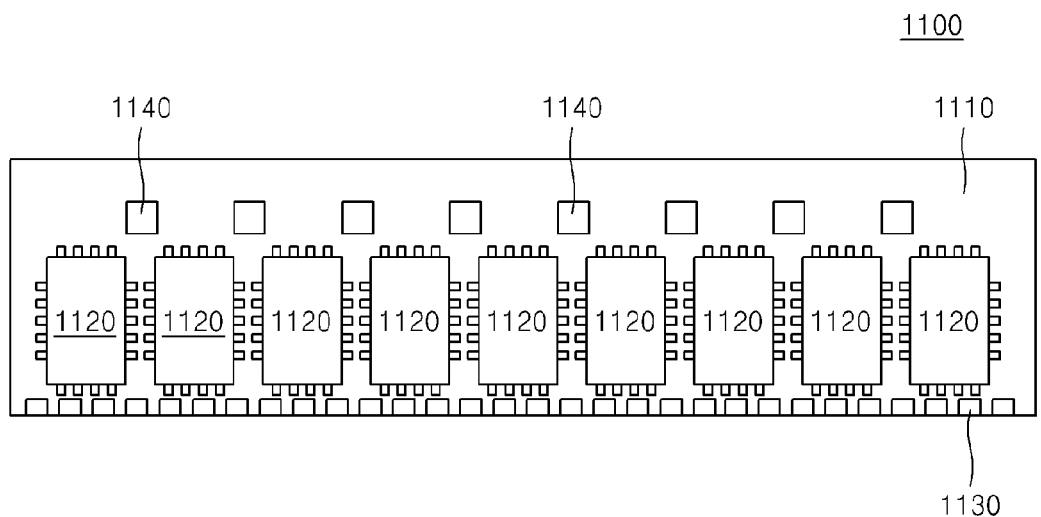
FIG. 62 is a plan view of a memory module according to an embodiment of the inventive concepts.

FIG. 62 is a plan view of a memory module 1100 according to an embodiment of the inventive concepts.

The memory module 1100 includes a module substrate 110 and a plurality of semiconductor chips 1120 attached to the module substrate 110.

The semiconductor chip 1120 may include a semiconductor package according to an embodiment of the inventive concepts. For example, the semiconductor chip 1120 may include the semiconductor packages 1a, 1b, 1c, 1d, 1e, 1f, 1g, 1h, 1i, 1j, 1k, 1l, 1m, 1n, 1o, 1p, 1q, and 1r shown in FIGS. 20, 24, 26, 28, 30, 32, 34, 40, 48 through 60.

Connecting portions 1130 that are to be inserted into sockets of a mother board may be formed at one side of the module substrate 110. Ceramic decoupling capacitors 1140 are disposed on the module substrate 110. The memory module 1100 according to the present embodiment may not be limited to the structure shown in FIG. 62 and may be changed in various ways.

Figure 63:
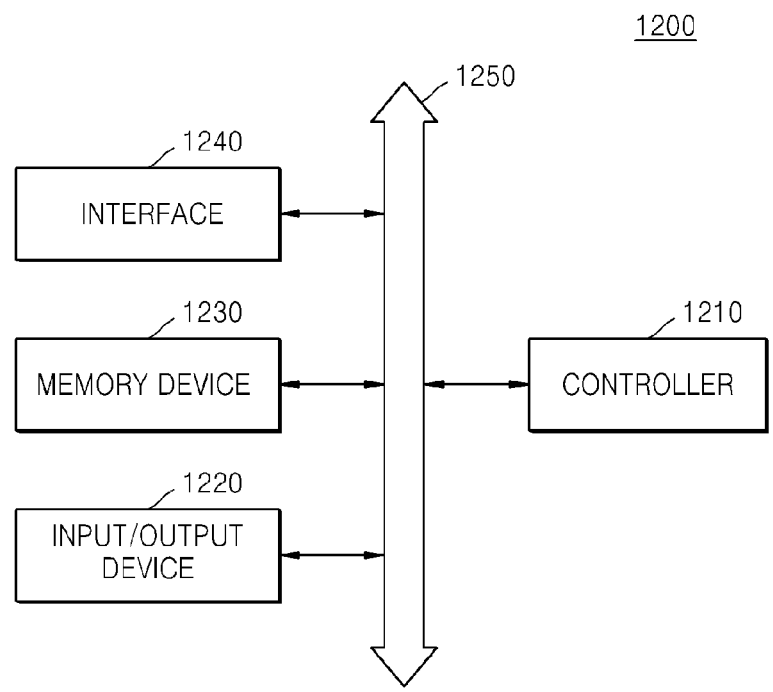
FIG. 63 is a structural diagram of a system including a semiconductor package according to an embodiment of the inventive concepts.

FIG. 63 is a structural diagram of a system 1200 including a semiconductor package according to an embodiment of the inventive concepts.

The system 1200 includes a controller 1210, an input/output device 1220, a memory device 1230, and an interface 1240. The system 1200 may be a mobile system or a system for transmitting or receiving information. In some embodiments of the inventive concept, the mobile system may be a portable digital assistant (PDA), a portable computer, a web tablet, a wireless phone, a mobile phone, a digital music player, or a memory card. The controller 1210 may control execution programs of the system 1200 and may include a microprocessor, a digital signal processor, a microcontroller, or a similar device to these. The input/output device 1220 may be used to input or output data of the system 1200. The system 1200 may be connected to an external device, for example, a personal computer or a network by using the input/output device 1220 and may exchange data with the external device. The input/output device 1220 may comprise, for example, a keypad, a keyboard, or a display.

The memory device 1230 may store codes and/or data for operations of the controller 1210 or may store data processed by the controller 1210. The memory device 1230 includes a semiconductor package according to an embodiment of the inventive concepts. For example, the memory device 1230 may include the semiconductor packages 1a, 1b, 1c, 1d, 1e, 1f, 1g, 1h, 1i, 1j, 1k, 1l, 1m, 1n, 1o, 1p, 1q, and 1r shown in FIGS. 20, 24, 26, 28, 30, 32, 34, 40, 48 through 55, 60, and 61, or any combination of the packages described herein.

The interface 1240 may be a data transmission path between the system 1200 and other external devices. The controller 1210, the input/output device 1220, the memory device 1230, and the interface 1240 may communicate with each other through a bus 1250. The system 1200 may be used in a mobile phone, a MP3 player, a navigation device, a portable multimedia player (PMP), a solid state disk (SSD), or household appliances.

Figure 64:
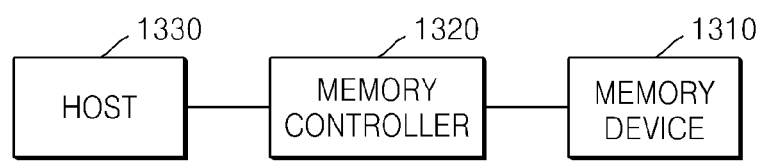
FIG. 64 is a structural diagram of a memory card including a semiconductor package according to an embodiment of the inventive concepts.

FIG. 64 is a structural diagram of a memory card 1300 including a semiconductor package according to an embodiment of the inventive concepts.

The memory card 1300 includes a memory device 1310 and a memory controller 1320.

The memory device 1310 may store data. In some embodiments of the inventive concept, the memory device 1310 has non-volatile characteristics whereby stored data is retained even if power is shut off. The memory device 1310 includes a semiconductor package according to an embodiment of the inventive concepts. For example, the memory device 1310 may include the semiconductor packages 1a, 1b, 1c, 1d, 1e, 1f, 1g, 1h, 1i, 1j, 1k, 1l, 1m, 1n, 1o, 1p, 1q, and 1r shown in FIGS. 20, 24, 26, 28, 30, 32, 34, 40, 48 through 55, 60, and 61, or any combination of the packages described herein.

The memory controller 1320 may read data stored in the memory device 1310 and may store data of the memory device 1310 in response to a read/write request of a host 1330.

In some embodiments, the first through fourth chips C1, C2, C3, C4, or portions of the chips, of a package may be said to have the same configuration. In this sense, the chips may include circuits that have the substantially the same functionality, such as memory cell blocks and associated control circuitry, memory blocks, processing circuitry, and the like. In some embodiments, those chips having the same configuration in this sense may have different cross-sectional widths w1, w2, w3, w4, even though they can be said to have the same configuration. In other example embodiments, one or more of the chips C1, C2, C3, C4 may have a different functionality. For example, one of the chips in the package may include control circuitry, while the other chips include primarily memory blocks. In other example, one of the chips in the package may comprise a memory master circuit, while one or more of the others comprise memory slave circuits. Any of these combinations, and other suitable combinations of circuit configurations among the chips in the package are well within the scope of the present inventive concepts.

While the inventive concepts have been particularly shown and described with reference to exemplary embodiments thereof, it will be understood that various changes in form and details may be made therein without departing from the spirit and scope of the following claims.

The invention claimed is:

1. A semiconductor package comprising:
    a first semiconductor chip, a second semiconductor chip on the first semiconductor chip, a third semiconductor chip on the second semiconductor chip and a fourth semiconductor chip on the third semiconductor chip,
    a first underfill layer between the second semiconductor chip and the first semiconductor chip;
    a second underfill layer between the third semiconductor chip and the second semiconductor chip, and a third underfill layer between the fourth semiconductor chip and the third semiconductor chip; and
    a mold layer at sidewalls of the first, second, third and fourth semiconductor chips and wherein the second underfill layer comprises the mold layer;
    wherein the second underfill layer comprises a material that is different than the first and third underfill layers.

2. The semiconductor package of claim 1 wherein the first and second semiconductor chips, the second and third semiconductor chips and the third and fourth semiconductor chips each have a plurality of corresponding conductive contacts that are in contact with each other, respectively.

3. The semiconductor package of claim 2 wherein the conductive contacts of one or more of the first, second, third and fourth semiconductor chips are connected to through-electrodes that pass from an upper surface of the chip to a lower surface of the chip.

4. The semiconductor package of claim 1
    wherein the first semiconductor chip has a first horizontal width that is greater than a second horizontal width of the second semiconductor chip, and
    wherein the third semiconductor chip has a third horizontal width that is greater than a fourth horizontal width of the fourth semiconductor chip.

5. The semiconductor package of claim 4 wherein the first horizontal width of the first semiconductor chip is substantially equal to the third horizontal width of the third semiconductor chip.

6. The semiconductor package of claim 4 wherein the first horizontal width of the first semiconductor chip is greater than the third horizontal width of the third semiconductor chip.

7. The semiconductor package of claim 1 wherein the second underfill layer protrudes beyond a sidewall of the second semiconductor chip.

8. The semiconductor package of claim 1 further comprising a mold layer at sidewalls of the second semiconductor chip and on a portion of a top surface of the second semiconductor chip, wherein the second underfill layer is positioned between the mold layer on the portion of the top surface of the second semiconductor chip and the third semiconductor chip.

9. The semiconductor package of claim 1 wherein the first, second, third and fourth underfill layers each comprise one or more of an adhesive material, an adhesive film, and a flowable liquid fill material.

10. The semiconductor package of claim 1 further comprising:
    a base to which the first semiconductor chip is mounted, the base and first semiconductor chip having a plurality of corresponding conductive contacts that are in contact with each other; and
    a base underfill layer between a lower surface of the first semiconductor chip and the base.

11. The semiconductor package of claim 10 wherein the base underfill layer comprises at least one of an adhesive film, an adhesive layer and a mold layer.

12. The semiconductor package of claim 1 wherein the first semiconductor chip includes a plurality of conductive contacts at a lower surface thereof, and further comprising chip stack connecting bumps connected to the plurality of conductive contacts.

13. The semiconductor package of claim 1 further comprising a mold layer at sidewalls of the first, second, third and fourth semiconductor chips and on a top surface of the fourth semiconductor chip.

14. A semiconductor package comprising:
    a first sub-stack comprising one of a first semiconductor chip and one of a second semiconductor chip, the second semiconductor chip positioned on the first semiconductor chip; a sub-stack underfill layer between the second semiconductor chip and the first semiconductor chip of the first sub-stack;
    a second sub-stack comprising another of the first semiconductor chip and another of the second semiconductor chip, the second semiconductor chip positioned on the first semiconductor chip; a sub-stack underfill layer between the second semiconductor chip and the first semiconductor chip of the second sub-stack;
    the second sub-stack positioned on the first sub-stack; a package underfill layer between the second sub-stack and the first sub-stack, wherein at least a portion of the first semiconductor chips of the first sub-stack and the second sub-stack have a same configuration and a wherein at least a portion of the second semiconductor chips of the first sub-stack and the second sub-stack have a same configuration; and
    a mold layer at sidewalls of the first and second semiconductor chips of the first and second sub-stacks and wherein the package underfill layer comprises the mold layer,
    wherein the package underfill layer comprises a material that is different than the sub-stack underfill layers.

15. The semiconductor package of claim 14 wherein the package underfill layer comprises a material that is a same material as the sub-stack underfill layers.

16. The semiconductor package of claim 14
    wherein the first and second semiconductor chips of each of the first and second sub-stacks each have a plurality of corresponding conductive contacts that are in contact with each other, and
    wherein the second semiconductor chip of the first sub-stack and the first semiconductor chip of the second sub-stacks each have a plurality of corresponding conductive contacts that are in contact with each other.

17. The semiconductor package of claim 16 wherein the conductive contacts of one or more of the first and second semiconductor chips of each of the first and second sub-stacks are connected to through-electrodes that pass from an upper surface of the chip to a lower surface of the chip.

18. The semiconductor package of claim 14 wherein the first semiconductor chip of the first sub-stack has a first horizontal width that is greater than a second horizontal width of the second semiconductor chip.

19. The semiconductor package of claim 14 wherein the first semiconductor chip of the second sub-stack has a first horizontal width that is greater than a second horizontal width of the second semiconductor chip.

20. The semiconductor package of claim 14 wherein a horizontal width of the first semiconductor chip of the first sub-stack is substantially equal to a horizontal width of the first semiconductor chip of the second sub-stack.

21. The semiconductor package of claim 14 wherein a horizontal width of the first semiconductor chip of the first sub-stack is greater than a horizontal width of the first semiconductor chip of the second sub-stack.

22. The semiconductor package of claim 14 wherein the package underfill layer protrudes beyond a sidewall of the second semiconductor chip of the first sub-stack.

23. The semiconductor package of claim 14 further comprising a mold layer at sidewalls of the second semiconductor chip of the first sub-stack and on a portion of a top surface of the second semiconductor chip of the first sub-stack, wherein the second underfill layer is positioned between the mold layer on the portion of the top surface of the second semiconductor chip of the first sub-stack and the first semiconductor chip of the second sub-stack.

24. The semiconductor package of claim 14 further comprising:
    a base to which the first semiconductor chip of the first sub-stack is mounted, the base and first semiconductor chip of the first sub-stack having a plurality of corresponding conductive contacts that are in contact with each other; and
    a base underfill layer between a lower surface of the first semiconductor chip of the first sub-stack and the base.

25. The semiconductor package of claim 24 wherein the base underfill layer comprises at least one of an adhesive film, an adhesive layer and a mold layer.

26. The semiconductor package of claim 14 wherein the first semiconductor chip of the first sub-stack includes a plurality of conductive contacts at a lower surface thereof, and further comprising chip stack connecting bumps connected to the plurality of conductive contacts.

27. The semiconductor package of claim 14 wherein at least a portion of the first and second semiconductor chips of the first sub-stack have the same configuration.

* * * * *